(12) United States Patent
Bulucea

(10) Patent No.: US 7,078,787 B1
(45) Date of Patent: Jul. 18, 2006

(54) DESIGN AND OPERATION OF GATE-ENHANCED JUNCTION VARACTOR WITH GRADUAL CAPACITANCE VARIATION

(75) Inventor: Constantin Bulucea, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 17 days.

(21) Appl. No.: 10/699,221

(22) Filed: Oct. 31, 2003

Related U.S. Application Data

(62) Division of application No. 10/054,653, filed on Jan. 18, 2002.

(51) Int. Cl.
   *H01L 29/93* (2006.01)
(52) U.S. Cl. ...................... 257/595; 361/277
(58) Field of Classification Search ................ 257/312, 257/595, 596, 597, 598, 599, 600, 601, 602; 438/379; 361/271, 277
   See application file for complete search history.

(56) References Cited

U.S. PATENT DOCUMENTS

| 4,003,009 A | 1/1977 | Watanabe .................... 334/15 |
| 4,529,994 A | 7/1985 | Sakai ........................... 357/14 |
| 5,399,893 A | 3/1995 | Weitzel et al. .............. 257/355 |
| 5,497,028 A | 3/1996 | Ikeda et al. ................. 257/531 |
| 5,504,376 A | 4/1996 | Sugahara et al. ............ 257/768 |
| 5,659,185 A | 8/1997 | Iwamuro ..................... 257/138 |
| 5,977,591 A | 11/1999 | Fratin et al. ................ 257/344 |
| 6,100,770 A | 8/2000 | Litwin et al. .......... 331/117 FE |
| 6,165,902 A | 12/2000 | Pramanick et al. ......... 438/653 |
| 6,166,404 A | 12/2000 | Imoto et al. ................ 257/279 |
| 2002/0036311 A1 | 3/2002 | Hattori ....................... 257/302 |
| 2002/0074589 A1 | 6/2002 | Benaissa et al. ............ 257/312 |
| 2003/0178689 A1 | 9/2003 | Maszara et al. ............ 257/407 |

FOREIGN PATENT DOCUMENTS

| JP | 4-199682 | 7/1992 | ................ 257/365 |
| JP | 6-61446 | 3/1994 | |
| JP | 7-226643 | 10/1995 | |

OTHER PUBLICATIONS

Takeuchi et al, "A New Multiple Transistor Design Methodology for High Speed Low Power SOCs:," *IEDM Technical Digest*, Dec. 2001, pp. 22.6.1-22.6.7.
U.S. Appl. No. 09/903,059, filed Jul. 10, 2001, Bulucea.
Andreani, et al., "A 1.8-GHZ CMOS VCI Tuned by an Accumulation-Mode MOS Varactor," IEEE Intl. Symposium on Circuits and Systems, May. 28-31, 2000, pp. I-315-I-318.

(Continued)

*Primary Examiner*—B. William Baumeister
*Assistant Examiner*—Dana Farahani
(74) *Attorney, Agent, or Firm*—Ronald J. Meetin

(57) ABSTRACT

A semiconductor junction varactor is designed with gate enhancement for enabling the varactor to achieve a high ratio of maximum capacitance to minimum capacitance. The varactor has a gate region (131 or 181) divided into multiple portions of differing zero-point threshold voltages for enabling the varactor capacitance to vary relatively gradually with a control voltage applied to the varactor.

68 Claims, 25 Drawing Sheets

OTHER PUBLICATIONS

Grove, *Physics and Technology of Semiconductor Devices* (John Wiley & Sons), 1967, pp. 263-305.

Grove, et al., "Effect of Surface Fields on the Breakdown Voltage of Planar Silicon p-n Junction," *IEEE Trans. Electron Devices*, vol. ED-14, 1967, pp. 157-162.

Grove, et al., "Surface Effects on p-n Junctions: Characteristics of Surface Space-Charge Regions Under Non-Equilibrium Conditions," *Solid-State Electronics*, vol. 9, 1966, pp. 783-806.

Kral, et al., "RF-CMOS Oscillators with Switched Tuning," *Procs. IEEE Custom Integrated Circuits Conference*, 1998, pp. 555-558.

Lee, *The Design of CMOS Radio-Frequency Integrated Circuits* (Cambridge Univ. Press), 1998, pp. 37-41 and 504-514.

McMahon, et al., "Voltage-Sensitive Semiconductor Capacitors," *1958 IRE Wescon Conf. Rec.*, Part 3, Aug. 19-22, 1958, pp. 72-82.

Moll, "Variabke Capacitance With Large Capacity Change," *IRE Wescon Conf. Rec.*, vol. 3, 1959, pp. 32-36.

Ng, *Complete Guide to Semiconductor Devices* (McGraw Hill), 1995, pp. 11-22.

Razavi, *Design of Analog CMOS Integrated Circuits* (McGraw Hill), 2001, pp. 495-525.

Rusu et al., "Deep-Depletion Breakdown Voltage of Silicon-Dioxide/Silicon MOS Capacitors," *IEEE Trans. Elec. Devs.*, Mar. 1979, pp. 201-205.

Rusu et al., "Reversible Breakdown Voltage Collapse in Silicon Gate-Controlled Diodes," *Solid-State Electronics*, vol. 23, 1980, pp. 473-480.

Sedra, et al., Microelectronic Circuits, (4th ed., Oxford Univ. Press), 1998, p. 382.

Svelto, et al., "A Three Terminal Varactor for RF IC's in Standard CMOS Technology," *IEEE Transactions on Electron Devices*, vol. 47, 2000, pp. 893-895.

Warner, Jr., et al., *Transistors—Fundamentals for the Integrated-Circuit Engineer* (John Wiley & Sons), 1983, pp. 320-321.

Wong et al., "A Wide Tuning Range Gated Varactor," *IEEE J. Solid State Circs*, May 2000, pp. 773-779.

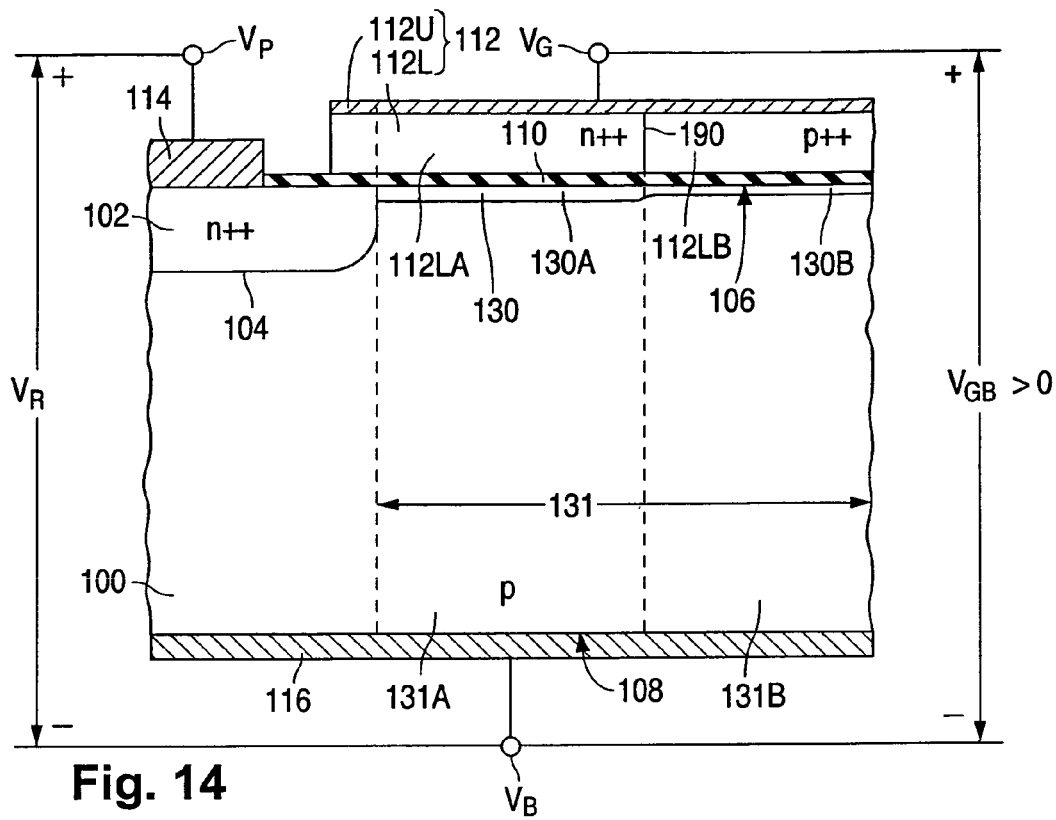
Fig. 14
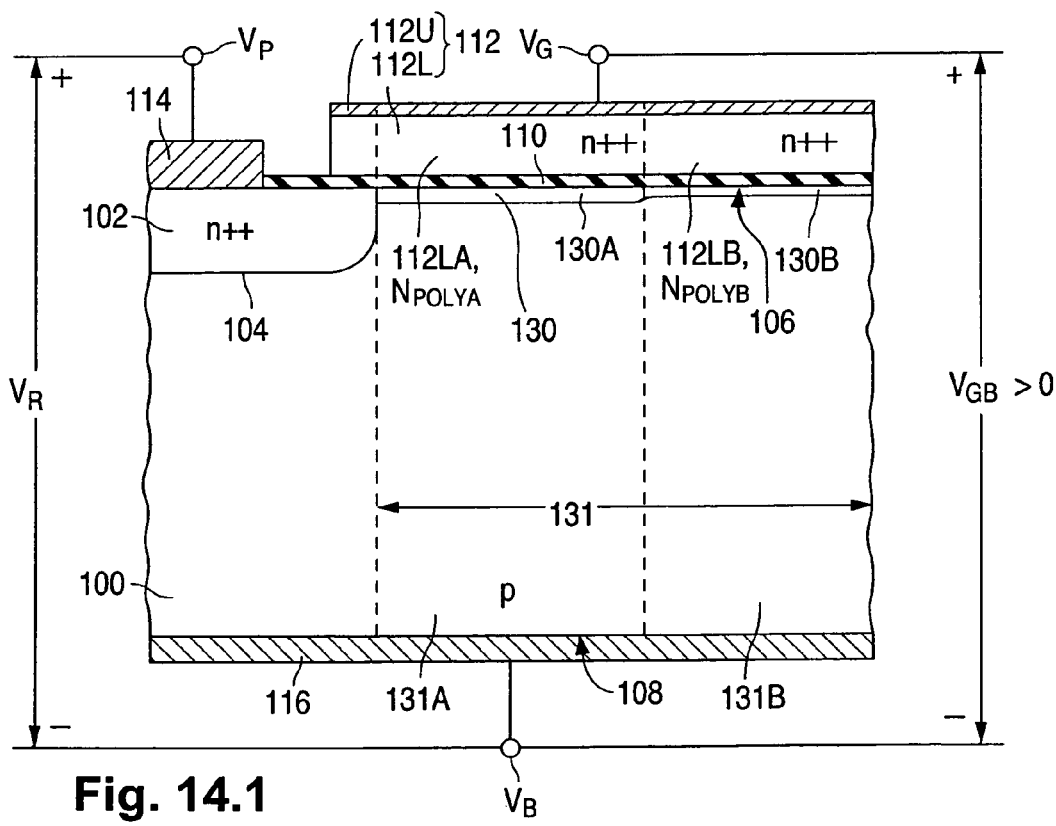
Fig. 14.1

Fig. 14.2

DESIGN AND OPERATION OF GATE-ENHANCED JUNCTION VARACTOR WITH GRADUAL CAPACITANCE VARIATION

CROSS REFERENCE TO RELATED APPLICATION

This is a division of U.S. patent application Ser. No. 10/054,653, filed 18 Jan. 2002, now allowed.

FIELD OF USE

This invention relates to varactors. More particularly, this invention relates to varactors provided in, and/or utilized with, semiconductor integrated circuits.

BACKGROUND ART

A varactor is a variable capacitor, i.e., a capacitor whose capacitance can be changed as a function of one or more control signals. The term "varactor" is derived from "variable" and "reactor", and means a device whose reactance can be varied in a controlled manner. The term "varicap", derived from "variable" and "capacitor", is also used to describe such a device.

Varactors are employed in various parts of electronic systems. For example, varactors are utilized in voltage-controlled oscillators ("VCOs") of wireless communications systems. A VCO generates a local oscillator signal for use in performing heterodyne frequency conversion in transceiver circuitry of a wireless communication system. The frequency of the oscillator signal changes as a function of a control voltage. In a VCO, one or more varactors provide the variable capacitance of an inductive-capacitive combination that establishes the frequency of the oscillator signal.

FIG. 1 illustrates a conventional differential cross-coupled VCO connected between ground and a source of positive supply voltage $V_{DD}$. The VCO in FIG. 1 consists of identical cross-coupled n-channel enhancement-mode insulated-gate field-effect transistors ("FETs") QA and QB, identical fixed-value inductors LA and LB, current source IA, and identical varactors CA and CB. The VCO's oscillator signal, taken from the drain of FET QA or QB, is provided at variable oscillator frequency $f_O$ given as:

$$f_O = \frac{1}{2\pi\sqrt{L_O C_O}} \quad (1)$$

where $L_O$ is the fixed inductance of each of inductors LA and LB, and $C_O$ is the variable alternating-current ("AC") capacitance of each of varactors CA and CB. A control voltage (not shown) is applied to varactors CA and CB to control the value of capacitance $C_O$ and thus oscillator frequency $f_O$.

FIG. 2a depicts a conventional single-ended Colpitts VCO formed with n-channel enhancement-mode insulated-gate FET QC, fixed-value inductor LC, current source IC, fixed-value capacitor CC, and varactor CE. A differential version of the single-ended VCO of FIG. 2a is depicted in FIG. 2b. The VCO in FIG. 2b consists of identical common-gate n-channel insulated-gate FETs QC and QD, identical fixed-value inductors LC and LD, identical fixed-value capacitors CC and CD, and varactor CF. Letting $L_O$ here represent the inductance of each of inductors LC and LD, the oscillator in each of FIGS. 2a and 2b provides an oscillator signal at variable frequency $f_O$ determined from Eq. 1 where capacitance $C_O$ is now the series combination of (a) the fixed capacitance of each of capacitors CC and CD and (b) either the variable capacitance of varactor CE or twice the variable capacitance of varactor CF. A control voltage (not shown) is applied to varactor CE or CF to control its AC capacitance and thus frequency $f_O$.

Varactors such as varactors CA, CB, CE, and CF can be implemented in various ways. A common varactor is a semiconductor junction varactor formed with a p-n diode having a reverse-biased p-n junction. A simplified example of a conventional junction varactor is shown in FIG. 3 where item 20 is a p-type body region of a semiconductor body. Moderately doped (p) material of body region 20 forms p-n junction 22 with heavily doped n-type region 24. Regions 20 and 24 respectively constitute the diode's anode and cathode.

Cathode electrode 26 contacts cathode region 24 along the upper semiconductor surface. Body electrode 28 contacts body region 20, typically through heavily doped p-type material (not separately indicated). Although body electrode 28 is illustrated as contacting body region 20 along the lower semiconductor surface in FIG. 3, electrode 28 can contact region 20 at other locations, e.g., along the upper semiconductor surface.

Reverse bias voltage $V_R$ is applied between electrodes 26 and 28 to reverse bias p-n junction 22. Since cathode region 24 is of n-type conductivity, cathode electrode 26 is at a higher voltage than body electrode 28. Junction depletion region 30 extends along p-n junction 22. Because cathode region 24 is heavily doped relative to body region 20, the thickness of body-side portion 32 of depletion region 30 is much greater, e.g., 100 times greater, than the thickness of cathode-side portion 34. As reverse voltage $V_R$ increases, the thickness of depletion region 30 increases. Only the thickness increase of body-side portion 32 is, for simplicity, indicated in FIG. 3.

Let $C_{VA}$ generally represent the AC areal capacitance, i.e., the AC capacitance per unit area, of a varactor. Junction depletion region 30, largely body-side portion 32, in the junction varactor of FIG. 3 functions as the dielectric for a capacitor in which the adjoining non-depleted p-type material of body region 20 serves as one of the capacitor's plates while the adjoining non-depleted n-type material of cathode region 24 serves as the capacitor's other plate. Areal capacitance $C_{VA}$ of the junction varactor is the AC areal junction depletion capacitance $C_{dJA}$ given as:

$$C_{VA} = C_{dJA} = \frac{K_{SC}\varepsilon_0}{t_{dJ}} \quad (2)$$

where $\varepsilon_0$ is the permittivity of free space, $K_{SC}$ is the permittivity constant of the semiconductor material (typically silicon), and $t_{dJ}$ is the average thickness of junction depletion region 30. Inasmuch as junction depletion thickness $t_{dJ}$ increases with increasing reverse voltage $V_R$, varactor capacitance $C_{VA}$ varies as a function of voltage $V_R$ in the varactor of FIG. 3.

It is typically desirable that the ratio of the maximum value $C_{VAmax}$ of varactor capacitance $C_{VA}$ to the minimum value $C_{VAmin}$ of capacitance $C_{VA}$ be high. In cases where the p-type body material along p-n junction 22 is uniformly doped at concentration $N_B$ to at least the maximum achievable thickness of body-side depletion portion 32, junction depletion thickness $t_{dJ}$ is given approximately as:

$$t_{dJ} = \sqrt{\frac{2K_{SC}\varepsilon_0(V_R + V_{BI})}{qN_B}} \quad (3)$$

where $V_{BI}$ is the built-in voltage of p-n junction 22, and q is the electronic charge. The maximum-to-minimum varactor capacitance ratio for uniform doping in depletion portion 32 of body region 20 is thereby limited approximately to:

$$\frac{C_{VA\max}}{C_{VA\min}} = \sqrt{\frac{V_{R\max} + V_{BI}}{V_{R\min} + V_{BI}}} \quad (4)$$

where $V_{R\max}$ and $V_{R\min}$ respectively are the maximum and minimum bias values of reverse voltage $V_R$.

The varactor capacitance ratio can be increased to approximately the following value by doping the body material along p-n junction 22 in a non-uniform hyperabrupt manner so that the body dopant concentration decreases from a maximum value $N_{B\max}$ along the bottom of depletion region 30 at its minimum thickness to a minimum value $N_{B\min}$ along the bottom of region 30 at its maximum thickness:

$$\frac{C_{VA\max}}{C_{VA\min}} = \sqrt{\left(\frac{N_{B\max}}{N_{B\min}}\right)\left(\frac{V_{R\max} + V_{BI}}{V_{R\min} + V_{BI}}\right)} \quad (5)$$

However, improving the capacitance ratio in this way necessitates an additional masked ion implantation into the varactor area and complicates the process for manufacturing an integrated circuit containing components other than the varactor.

Another type of semiconductor varactor is a depletion insulated-gate varactor often referred to as a depletion metal-oxide semiconductor ("MOS") varactor. FIG. 4 illustrates a simplified example of a conventional depletion insulated-gate varactor created from a semiconductor body having p-type body region 40. Gate dielectric layer 42 extending along the upper semiconductor surface separates gate electrode 44 from moderately doped (p) material of body region 40. Body electrode 46, analogous to body electrode 28 in FIG. 3, contacts body region 40. Gate-to-body bias voltage $V_{GB}$, which varies across a voltage range extending from some negative value to some positive value, is applied between electrodes 44 and 46.

With gate-to-body voltage $V_{GB}$ being positive so that gate electrode 44 is at a higher voltage than body electrode 46, surface depletion region 48 forms in body region 40 along the upper semiconductor surface below gate electrode 44. The structure then functions as a capacitor having two dielectrics situated in series between gate electrode 44 and the non-depleted p-type body material underlying surface depletion region 48. One of the dielectrics is gate dielectric layer 42 having AC areal capacitance $C_{GDA}$ given as:

$$C_{GDA} = \frac{K_{GD}\varepsilon_0}{t_{GD}} \quad (6)$$

where $K_{GD}$ is the permittivity constant of dielectric layer 42, and $t_{GD}$ is the average thickness of dielectric layer 42 along electrode 44. The other dielectric is surface depletion region 48 having AC areal capacitance $C_{dsA}$ given as:

$$C_{dsA} = \frac{K_{SC}\varepsilon_0}{t_{ds}} \quad (7)$$

where $t_{ds}$ is the average thickness of surface depletion region 48. Areal capacitance $C_{VA}$ of the depletion insulated-gate varactor is the series combination of areal capacitances $C_{GDA}$ and $C_{dsA}$. Accordingly, capacitance $C_{VA}$ is given as:

$$C_{VA} = \frac{C_{GDA}}{1 + \left(\frac{K_{GD}}{K_{SC}}\right)\left(\frac{t_{ds}}{t_{GD}}\right)} \quad (8)$$

where gate dielectric capacitance $C_{GDA}$ is determined from Eq. 6. Surface depletion thickness $t_{ds}$ increases with increasing gate-to-body voltage $V_{GB}$ up to the point at which voltage $V_{GB}$ reaches a threshold value $V_{T0}$. Capacitance $C_{VA}$ thus decreases with increasing gate-to-body voltage $V_{GB}$ over the $V_{GB}$ range from zero to threshold value $V_{T0}$.

Inversion layer 50 forms in body region 40 along the upper semiconductor surface below gate electrode 44 when gate-to-body voltage $V_{GB}$ reaches threshold value $V_{T0}$. Further increase in voltage $V_{GB}$ causes the charge density in inversion layer 50 to increase. However, surface depletion thickness $t_{ds}$ remains substantially fixed at maximum value $t_{dsmax}$ in high-frequency AC operation because inversion layer 50 provides the additional charge necessitated by the $V_{GB}$ increase. Hence, varactor capacitance $C_{VA}$ remains approximately constant as voltage $V_{GB}$ rises above $V_{T0}$ in high-frequency operation. For low-frequency AC operation, recombination/regeneration effects actually cause capacitance $C_{VA}$ to rise toward gate dielectric capacitance $C_{GDA}$ as voltage $V_{GB}$ is progressively raised above $V_{T0}$. In either case, capacitance $C_{VA}$ is at minimum value $C_{VA\min}$ when voltage $V_{GB}$ is approximately $V_{T0}$.

FIG. 5 illustrates an example of how the ratio of varactor capacitance $C_{VA}$ to gate dielectric capacitance $C_{GDA}$ varies with gate-to-body bias voltage $V_{GB}$ for the depletion insulated-gate varactor of FIG. 4. Curve portions A and B in FIG. 5 respectively depict the high-frequency and low-frequency capacitance characteristics for the depletion varactor. Curve portion C represents the high-frequency capacitance characteristics for the deep depletion insulated-gate varactor of FIG. 6 discussed below.

When gate-to-body voltage $V_{GB}$ is negative in the depletion insulated-gate varactor of FIG. 4, majority carriers (holes) accumulate along the upper semiconductor surface below gate electrode 48. The thickness of surface depletion region 48 progressively decreases as voltage $V_{GB}$ is made progressively more negative, i.e., of progressively greater negative value. Varactor capacitance $C_{VA}$ becomes gate dielectric capacitance $C_{GDA}$ which is maximum varactor capacitance value $C_{VAmax}$. The maximum-to-minimum varactor capacitance ratio for the depletion varactor is approximately:

$$\frac{C_{VAmax}}{C_{VAmin}} = 1 + \frac{t_{dsmax}}{t_{GD}} \qquad (9)$$

The maximum-to-minimum capacitance ratio given by Eq. 9 for the depletion varactor is considerably higher than that typically achievable with a junction varactor because maximum depletion thickness $t_{dsmax}$ which determines minimum capacitance value $C_{VAmin}$ is typically several times gate dielectric thickness $t_{GD}$ which determines maximum capacitance value $C_{VAmax}$. At state-of-the-art values for dielectric thickness $t_{GD}$, the maximum-to-minimum capacitance ratio for a depletion insulated-gate varactor can readily be 10.

A deep depletion insulated-gate varactor, often termed a deep depletion MOS varactor, is an extension of a depletion insulated-gate varactor to include a p-n junction which enables the maximum-to-minimum varactor capacitance ratio to be increased further. A simplified example of a deep depletion insulated-gate varactor is presented in FIG. 6. Except as indicated below, the deep depletion varactor in FIG. 6 contains components 40, 42, 44, and 46 arranged the same as in the depletion varactor of FIG. 4. With variable gate-to-body bias voltage $V_{GB}$ applied between electrodes 44 and 46, the capacitance of the deep depletion varactor is taken between electrodes 44 and 46 as in the depletion varactor.

In addition to components 40, 42, 44, and 46, the deep depletion insulated-gate varactor includes one or two heavily doped n-type junction regions 52. Each n+ junction region 52 forms a p-n junction 54 with body region 40 and is contacted by a junction electrode 56 along the upper semiconductor surface. Reverse bias voltage $V_R$, a fixed electrical potential here, is applied between body electrode 46 and each junction electrode 56 to reverse bias corresponding p-n junction 54. Since each junction region 52 is of n-type conductivity, each junction electrode 56 is at a higher voltage than body electrode 46. A junction depletion region 58, which normally meets surface depletion region 48, extends along each p-n junction 54.

FIG. 6 illustrates the situation in which two junction regions 52 are present in a deep depletion insulated-gate varactor. With the two regions 52 being laterally separated from each other, the structure is similar to an insulated-gate FET except that regions 52 are electrically tied together rather than serving as source and drain. When only one region 52 is present, the other region 52 is typically replaced with dielectric material that laterally electrically isolates islands of the semiconductor material along the upper semiconductor surface.

The deep depletion insulated-gate varactor of FIG. 6 operates in basically the same way as the depletion insulated-gate varactor of FIG. 4 except that the presence of junction region(s) 52 causes inversion layer 50 to occur at a greater positive value of gate-to-body voltage $V_{GB}$ than in an otherwise corresponding depletion varactor. Maximum surface depletion thickness $t_{dsmax}$ in the deep depletion varactor is thus greater than in the corresponding depletion varactor. Referring to curve C of FIG. 5, capacitance ratio $C_{VA}/C_{GDA}$ reaches a lower value with the deep depletion varactor than with the depletion varactor. Accordingly, minimum varactor capacitance value $C_{VAmin}$ reaches a lower value in the deep depletion varactor than in the depletion varactor. As a result, the deep depletion varactor achieves a higher maximum-to-minimum varactor capacitance ratio than the depletion varactor. In particular, the maximum-to-minimum capacitance ratio for a deep depletion varactor can readily be 15–20 at state-of-the-art values for gate dielectric thickness $t_{GD}$.

Wong et al ("Wong"), "A Wide Tuning Range Gated Varactor," *IEEE J. Solid-State Circs.*, May 2000, pages 773–779, describes another type of semiconductor varactor. As generally shown in FIG. 7, Wong's varactor is created from n+ body region 60 of a semiconductor body. Using somewhat unusual terminology, Wong's varactor includes heavily doped n-type "source" 62 and heavily doped p-type "drain" 64 laterally separated from each other along the upper semiconductor surface. Gate dielectric layer 66 separates gate electrode 68 from moderately doped n-type body material situated between source 62 and drain 64. Wong reports that the varactor capacitance is defined as the capacitance looking into the drain node.

Wong's varactor is operated in two modes with source voltage $V_S$ being ground reference (0 volt) in both modes. In one mode, drain voltage $V_D$ is also at ground while gate voltage $V_G$ is variable. Surface depletion region 70 extends along the upper semiconductor surface below gate electrode 68 and meets drain 64. Surface depletion region 70 merges into junction depletion region 72 extending along the p-n junction between body region 60 and source 62. Reducing gate voltage $V_G$ in this mode causes the thickness of composite depletion region 70/72 to increase so that the varactor capacitance decreases. In the second mode, gate voltage $V_G$ is at ground while drain voltage $V_D$ is variable. Increasing drain voltage $V_D$ causes the thickness of junction depletion region 72 to increase, thereby reducing the varactor capacitance. Inversion along the upper semiconductor surface below gate electrode 68 limits the maximum thickness of junction depletion region 72 and thus the minimum varactor capacitance in this mode.

Wong reports maximum and minimum capacitance values which appear to yield a maximum-to-minimum varactor capacitance ratio of 3–4. This varactor capacitance ratio is relatively low and, in fact, is lower than that typically achievable with either of the depletion insulated-gate varactors described above. As in the other varactors described above, the maximum-to-minimum capacitance ratio in Wong is determined primarily by the device metallurgical structure and is largely not independently controllable by the circuit designer.

Switched-capacitor varactors are employed in some applications. Although a high maximum-to-minimum varactor capacitance ratio can be achieved with a switched-capacitor varactor, it typically occupies a large semiconductor layout area. Switched-capacitor varactors require switching control and thus are also relatively complex.

It would be desirable to have a varactor which is of relatively simple design and which can readily achieve a high maximum-to-minimum varactor capacitance ratio. It would also be desirable to be able to change the maximum-to-minimum varactor capacitance ratio by appropriately adjusting certain lateral varactor layout dimensions.

GENERAL DISCLOSURE OF THE INVENTION

U.S. patent application Ser. No. 09/903,059 filed 10 Jul. 2001 on another of my inventions deals with a semiconductor junction varactor that employs gate enhancement for achieving a high ratio of maximum varactor capacitance to minimum varactor capacitance. A large, relatively abrupt change in the varactor capacitance typically occurs as a plate-to-body control voltage applied to the varactor of U.S. application Ser. No. 09/903,059 passes through a relatively short voltage range centering generally around a transition value of the plate-to-body voltage while a gate-to-body voltage applied to the varactor is fixed.

The present invention furnishes a variation, or extension, of the gate-enhanced junction varactor of U.S. application Ser. No. 09/903,059. The varactor capacitance in the present gate-enhanced semiconductor junction varactor normally changes in a relatively gradual manner, compared to that of U.S. application Ser. No. 09/903,059, as the plate-to-body voltage is varied across substantially its entire voltage range at a suitable fixed value of the gate-to-body voltage. This facilitates controlling the varactor capacitance in the present invention.

As with the varactor of U.S. application Ser. No. 09/903,059, the present varactor can achieve a high maximum-to-minimum varactor capacitance ratio, normally well in excess of 10 and readily in the vicinity of 20 or more. Importantly, the maximum-to-minimum capacitance ratio for the gate-enhanced junction varactor of the invention depends on the amount of gate enhancement, a feature determined by the varactor's lateral dimensions. Accordingly, the maximum-to-minimum capacitance ratio can be set to achieve a specific value by appropriately selecting the varactor's lateral dimensions. The present varactor can thereby be readily incorporated into a general methodology for laying out and fabricating integrated circuits. In addition, the lateral area occupied by the varactor of the invention is small compared to that occupied by an otherwise comparable switched-capacitor varactor.

More particularly, a varactor configured according to the invention contains a plate region and a body region of a semiconductor body. The plate and body regions are of opposite conductivity type and meet each other to form a p-n junction. A dielectric layer is situated over the semiconductor body and contacts the body region. A gate electrode is situated over the dielectric layer at least where the dielectric layer contacts material of the body region. Plate and body electrodes are respectively connected to the plate and body regions.

The capacitance of the present gate-enhanced junction varactor is taken between the plate and body electrodes. A suitable plate-to-body bias voltage of a variable magnitude is applied between the plate and body electrodes so that the p-n junction is not conductively forward biased. The p-n junction is normally reversed biased over the large majority of the range across which the plate-to-body voltage varies. A junction depletion region extends along the p-n junction. With a suitable gate-to-body bias voltage applied between the gate and body electrodes, a surface depletion region is formed in the body region below the gate electrode and merges with the junction depletion region.

The gate-to-body voltage is controlled in such a way that an inversion layer forms in the surface depletion region at a certain value of the plate-to-body voltage. The inversion layer meets the plate region. By adjusting the plate-to-body voltage in a specified (positive or negative) manner, the inversion layer disappears laterally in stages such that any inversion-layer material remaining after each disappearing stage meets the plate region. That is, the inversion layer shrinks laterally in stages toward the plate region. One portion of the inversion layer disappears followed by another portion until all of the inversion layer is gone. The net effect is that the inversion layer gradually disappears as the plate-to-body voltage is appropriately adjusted.

One capacitor plate of the present varactor consists essentially of the undepleted material of the body region. When the plate-to-body voltage is of such a value that the inversion layer is fully present, the inversion layer combines with the undepleted material of the plate region to form a second capacitor plate of relatively large area. The surface and junction depletion regions together form the capacitor dielectric. The varactor's capacitance is relatively large.

Upon adjusting the plate-to-body voltage so as to cause a portion of the inversion layer to disappear, the second capacitor plate shrinks laterally. The second capacitor plate is then formed by the remainder of the inversion layer and the undepleted material of the plate region since the remainder of the inversion layer meets the plate region. The lateral shrinkage of the second capacitor plate reduces its area, thereby reducing the varactor capacitance.

The lateral shrinkage of the second capacitor plate and the associated reduction in the varactor capacitance continue as the plate-to-body voltage is further adjusted until the plate-to-body voltage reaches a point at which the inversion layer is fully gone. The second capacitor plate then consists essentially of only the undepleted material of the plate region and is of relatively small area. Consequently, the varactor capacitance is relatively small.

Adjusting the plate-to-body voltage in the opposite manner starting from a point at which the inversion layer is absent enables the inversion layer to grow laterally in stages moving away from the plate region while continuing to meet the plate region. The varactor capacitance increases gradually from a relatively small value to a relatively large value. In short, the capacitance of the present varactor switches gradually between relatively large and relatively small values as the plate-to-body voltage is adjusted to cause the inversion layer to appear or disappear in stages.

The appearance/disappearance of the inversion layer in stages is achieved for the present varactor by laterally dividing its gate region, i.e., the gate electrode and the underlying dielectric/semiconductor material situated laterally to side of the plate region, into a group of gate portions having different respective gate-to-body threshold voltages at a given reference value of the plate-to-body voltage. Each gate portion adjoins the plate region or/and is connected to the plate region through one or more other gate portions having gate-to-body threshold voltages of lower magnitude than the gate-to-body threshold voltage of that gate portion. The reference value of plate-to-body voltage for defining the gate-to-body threshold voltages is typically zero.

By configuring the gate region in the preceding way, the inversion layer is formed with multiple variably appearing inversion portions respectively characterized by corresponding different zero-point threshold voltages of like sign. Each inversion portion largely appears/disappears when the gate-to-body voltage passes through the corresponding zero-point threshold voltage at zero plate-to-body voltage. Each inversion portion meets the plate region or/and is continuous with another inversion portion whose zero-point threshold voltage is of lesser magnitude than the zero-point threshold voltage of that inversion portion.

When the plate-to-body voltage is adjusted to control the appearance/disappearance of the inversion layer, the inversion portions progressively disappear starting with the inversion portion having the zero-point threshold voltage of greatest magnitude or progressively appear starting with the inversion portion having the zero-point threshold voltage of lowest magnitude. The variation of the varactor capacitance with the plate-to-body voltage generally becomes more gradual as the number of gate portions, and thus the number of inversion portions, increases.

Various techniques can be utilized to provide the gate portions of the present varactor with different gate-to-body threshold voltages. The gate dielectric layer can be divided into multiple portions of different thicknesses. Each gate portion overlies at least the location for a different corresponding one of the inversion portions. The thicknesses of the gate portions then progressively increase in the same order that the magnitudes of the zero-point threshold voltages of the corresponding inversion portions progressively increase.

The gate electrode can be formed with semiconductor material, typically non-monocrystalline semiconductor material such as polycrystalline semiconductor material, divided into multiple portions of different conductivity types or/and suitably different net dopant concentrations. Doping of the gate electrode in this way can be combined with dividing the gate dielectric layer into multiple portions of at least two different thicknesses. The surface depletion region below the gate electrode can be divided into multiple portions of suitably different net dopant concentrations.

The present varactor is normally part of a structure that includes electronic circuitry having a capacitance signal path for receiving the varactor to enable the circuitry to perform an electronic function dependent on the varactor. The plate and body electrodes are situated in the capacitance signal path. The capacitance signal path can be extended to be an inductance-capacitance signal path. In that case, the electronic circuitry includes an inductor situated in the inductance-capacitance signal path with the plate and body electrodes to form an oscillatory inductive-capacitive combination.

The development of an implementation of the present varactor to achieve a maximum-to-minimum varactor capacitance ratio of at least a specified value involves the following steps. The present varactor is selected with the understanding that the plate region occupies a lateral plate area, the varactor's minimum capacitance depends on the plate area, the inversion layer occupies a lateral inversion area that reaches a maximum value when the inversion layer is fully present, and the varactor's maximum capacitance depends on the maximum inversion area in combination with the plate area. The plate and maximum inversion areas are then adjusted to control the maximum and minimum varactor capacitances. By appropriately adjusting the ratio of the maximum inversion area to the plate region area, at least a specified value of the maximum-to-minimum capacitance ratio is attained.

In summary, the capacitance of the gate-enhanced junction varactor of the invention can be adjusted gradually as a function of the plate-to-body voltage so as to facilitate controlling the varactor capacitance. The present varactor achieves a high maximum-to-minimum varactor capacitance ratio. Accordingly, the invention provides a substantial advance over the prior art.

BRIEF DESCRIPTION OF THE DRAWINGS

FIGS. 12–17, including FIGS. 14.1-14.2, are cross-sectional side views of eight silicon-gate implementations of the n-channel varactor of FIGS. 8a–8d.

Like reference symbols are employed in the drawings and in the description of the preferred embodiments to represent the same, or very similar, item or items.

DESCRIPTION OF THE PREFERRED EMBODIMENTS

General Considerations

Figure 1:
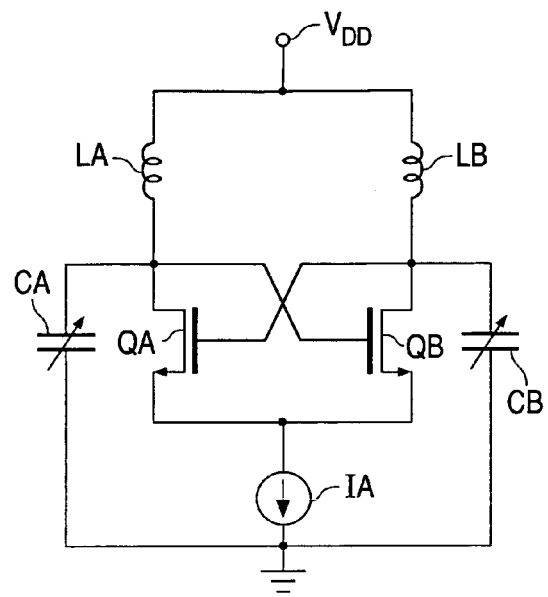
FIGS. 1, 2a, and 2b are circuit diagrams of conventional VCOs.
Figure 2A:
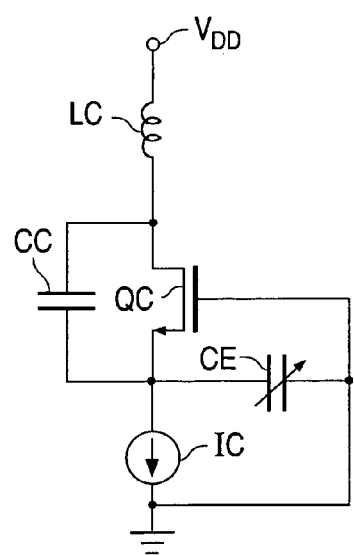
Figure 2B:
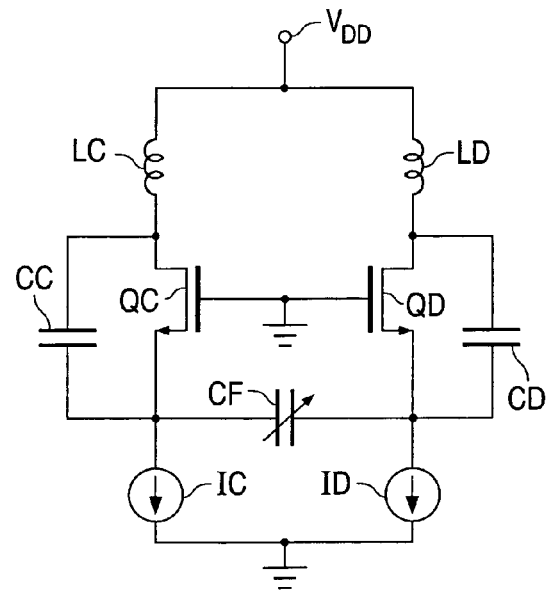

The term "n-channel" as used here in describing a gate-enhanced junction varactor means that the varactor has a surface charge-inversion layer (or channel) in which the charge carriers are electrons. The term "p-channel" as used here in describing a gate-enhanced junction varactor similarly means that the varactor has a surface charge-inversion layer (or channel) in which the charge carriers are holes.

An electrical signal, such as a voltage (or electrical potential), generally consists of a direct-current ("DC") signal and/or an AC signal which varies with time at a frequency that may itself vary with time. The DC signal may vary with time. Any time variation of the DC signal is either not at a significant identifiable frequency or is at a frequency much lower than that of the AC signal. A bias signal, such as a bias voltage, is a DC signal employed to place parts of an electronic circuit, including a single circuit element, in a specified bias (e.g., amplifying) relationship with respect to one other.

A DC signal is generally denoted here by a reference symbol formed with an upper-case letter followed by a subscript that begins with an upper-case letter. For instance, the upper-case letter "V" followed by a subscript beginning with an upper-case letter represents a DC voltage such as a bias voltage. An AC signal is generally denoted here by a reference symbol consisting of a lower-case letter and a subscript that begins with a lower-case letter. When an electrical signal consists of both a DC signal and an AC signal, the total signal is generally denoted here by a reference symbol formed with a lower-case letter followed by a reference symbol beginning with an upper-case letter where, aside from the upper-case/lower-case distinction, the reference symbols for the total signal, the DC signal, and the AC signal all begin with the same letter and where, again aside from the upper-case/lower-case distinction, the subscripts in the reference symbols for the total, DC, and AC signals all begin with the same letter.

Gate-Enhanced Junction Varactor Structure

FIGS. 8a–8d (collectively "FIG. 8") illustrate a general example of an n-channel gate-enhanced junction varactor configured in accordance with the invention at four stages of varactor operation. The starting point for the n-channel junction varactor of FIG. 8 is a monocrystalline semiconductor body having a p-type body region 100. The monocrystalline semiconductor material of body region 100 is typically monocrystalline silicon ("monosilicon"). An n-type plate region 102 of the semiconductor body meets moderately doped (p) material of body region 100 to form a p-n junction 104.

The semiconductor body has opposite first and second primary surfaces 106 and 108 referred to here respectively as the upper and lower semiconductor surfaces. Plate region 102 extends along upper semiconductor surface 106. Moderately doped material of body region 100 extends to upper surface 106 to the side of plate region 102. Accordingly, p-n junction 104 reaches upper surface 106. FIG. 8 depicts body region 100 as extending to lower semiconductor surface 108. However, the semiconductor body can be arranged so that n-type material fully underlies body region 100 and thus that region 100 does not extend to lower surface 108.

Plate region 102 is illustrated in FIG. 8 as being very heavily doped but can be differently constituted. For instance, plate region 102 may consist of a very heavily doped main portion and a more lightly doped lateral extension that extends to a side segment of p-n junction 104. In addition to, or in place of, such a more lightly doped lateral extension, region 102 may include a more lightly doped vertical extension that extends to a bottom segment of junction 104 to define a vertically graded junction. While the lateral or vertical extension is more lightly doped than the main plate portion, the lateral or vertical extension is normally more heavily doped than the adjoining material of body region 100.

A gate dielectric layer 110, typically consisting primarily of thermally grown silicon oxide, extends along upper semiconductor surface 106 above where body region 100 reaches upper surface 106 and also above part of plate region 102. Although FIG. 8 illustrates the thickness of gate dielectric layer 110 as being largely constant, the gate dielectric thickness varies (as discussed below) from one location to another in some implementations of the varactor of FIG. 8.

A gate electrode 112 is situated on gate dielectric layer 110 and is electrically insulated from the semiconductor body by layer 110. Gate electrode 112 is located above where body region 100 reaches upper semiconductor surface 106. Electrode 112 may consist of conductively doped semiconductor material and/or metal. Semiconductor material in electrode 112 is normally of the non-monocrystalline semiconductor type, typically polycrystalline semiconductor material such as polycrystalline silicon ("polysilicon"). Doped semiconductor material of electrode 112 is typically of the same conductivity type as plate region 102. In some implementations of the varactor of FIG. 8, electrode 112 includes (as discussed below) laterally adjoining semiconductor portions of opposite conductivity type. Semiconductor material of electrode 112 may also be substantially fully of opposite conductivity type to plate region 102.

A plate electrode 114 electrically contacts plate region 102 along upper semiconductor surface 106. A body electrode 116 electrically contacts body region 100. The contact between body electrode 116 and body region 100 is typically made through one or more heavily doped body contact portions (not separately shown here) of region 100. For simplicity, FIG. 8 illustrates body electrode 116 as contacting region 100 along lower semiconductor surface 108. As indicated below, body electrode 116 normally contacts region 100 along upper surface 106. Electrodes 114 and 116 normally consist of metal but may include metal silicide along the surface areas where they contact the semiconductor body.

Varactor plate-to-body bias control voltage $V_R$ is applied between plate electrode 114 and body electrode 116 by applying a DC plate voltage $V_P$ and a DC body voltage $V_B$ respectively to electrodes 114 and 116. Plate-to-body voltage $V_R$ is specifically defined as:

$$V_R = V_P - V_B \tag{10}$$

where plate voltage $V_P$ and body voltage $V_B$ are defined relative to an arbitrary reference point such as ground potential (again, 0 V).

The structure of FIG. 8 functions as a varactor in accordance with the invention when p-n junction 104 is not forward biased so as to conduct significantly. Accordingly, the magnitude and polarity of plate-to-body voltage $V_R$ are controlled such that junction 104 is either reversed biased or is forward biased but below the threshold point for significant conduction. When junction 104 is reverse biased, plate voltage $V_P$ is at a higher DC electrical potential than body voltage $V_B$ since plate region 102 is of n-type conductivity. Plate-to-body voltage $V_R$ is then positive.

When p-n junction 104 is forward biased below the threshold conductive point, plate-to-body voltage $V_R$ is negative but exceeds a negative junction threshold value $V_{R0}$ at which junction 104 first becomes significantly forwardly conductive. Negative junction threshold value $V_{R0}$ generally equals $-V_F$ where $V_F$ is the forward voltage drop of 0.6–0.7 V at which a p-n junction, i.e., junction 104 here, becomes significantly conductive in the forward direction. Hence, junction threshold value VRO is normally −0.6–0.7 V, typically −0.7 V. Overall, voltage $V_R$ is controlled so as to be greater than negative junction threshold value $V_{R0}$.

With body voltage $V_B$ applied to body electrode 116, gate-to-body bias voltage $V_{GB}$ is applied between gate electrode 112 and body electrode 116 by applying a DC gate voltage $V_G$ to gate electrode 112. Gate-to-body voltage $V_{GB}$ is specifically defined as:

$$V_{GB} = V_G - V_B \tag{11}$$

where gate voltage $V_G$ is defined relative to the same arbitrary reference point, e.g., ground, as plate voltage $V_P$ and body voltage $V_B$. Gate-to-body voltage $V_{GB}$ is generally at least zero and is normally positive. As discussed further below, voltage $V_{GB}$ is normally substantially constant or is controlled as a function of plate-to-body voltage $V_R$.

Under the preceding conditions for bias voltages $V_R$ and $V_{GB}$, a junction depletion region 118 extends along p-n junction 104. Junction depletion region 118 consists of a body-side portion 120 and a plate-side portion 122. Because plate region 102 is very heavily doped compared to the adjoining material of body region 100, body-side depletion portion 120 is of much greater average thickness, e.g., 100 times greater average thickness, than plate-side depletion portion 122. As discussed further below, the thicknesses of depletion portions 120 and 122 change during varactor operation. Only the thickness change in body-side depletion portion 120 is, for simplicity, illustrated in FIG. 8. Item 124 in FIG. 8 indicates the undepleted n-type material of plate region 102.

A surface depletion region 126 is formed in body region 100 along upper semiconductor surface 106 below gate electrode 112. Surface depletion region 126 merges with junction depletion region 118, i.e., with depletion portions 120 and 122, to form a composite depletion region 118/126. As described below, each of the one or more portions of body region 100 along which body electrode 116 contacts region 100 is more heavily doped than, and spaced apart from, composite depletion region 118/126. In particular, surface depletion region 126 is typically spaced apart from each body contact portion along upper semiconductor surface 106. Item 128 in FIG. 8 indicates the undepleted p-type material of body region 100.

The capacitance of the gate-enhanced junction varactor of FIG. 8 is taken between plate electrode 114 and body electrode 116. When the varactor is employed in electronic circuitry having a capacitance signal path for receiving the varactor, electrodes 114 and 116 therefore lie in the capacitance path. Accordingly, body region 100 and plate region 102 are in the capacitance signal path. Gate electrode 112 is outside the capacitance signal path. Junction depletion region 118 and part or all of surface depletion region 126 variously serve as capacitive dielectric for the varactor.

Figure 8A:
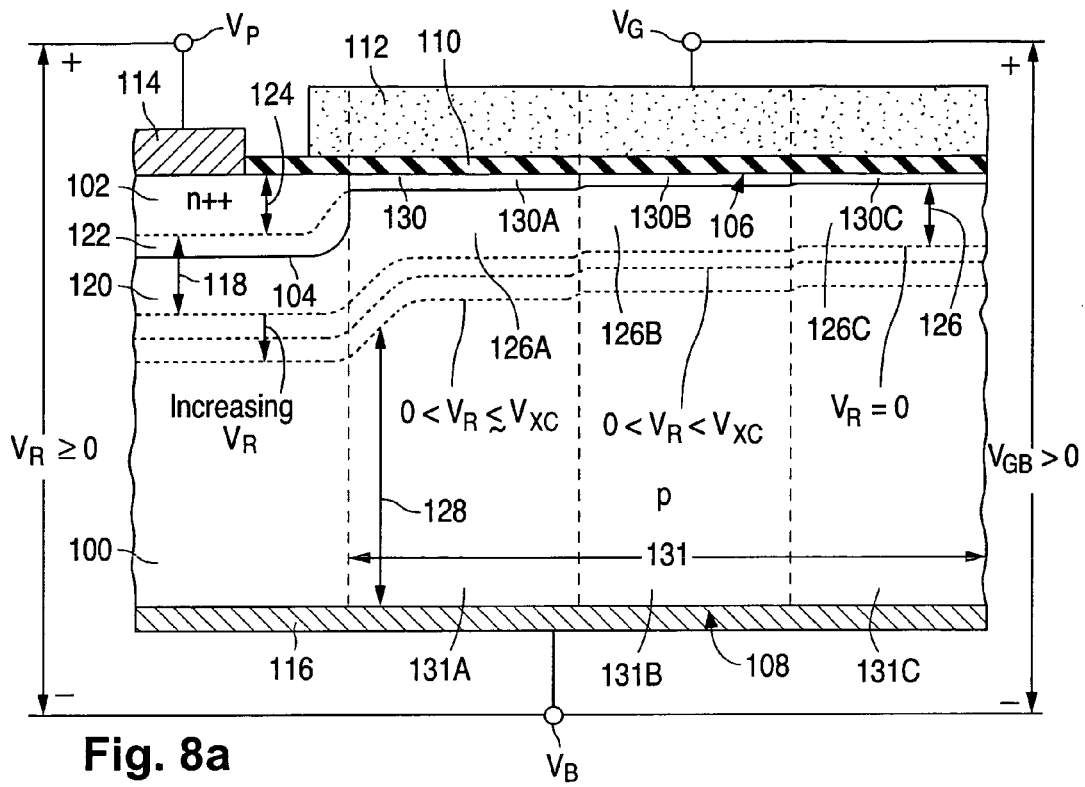
FIGS. 8a–8d are cross-sectional side views of a general n-channel gate-enhanced junction varactor configured according to the invention.
Figure 8B:
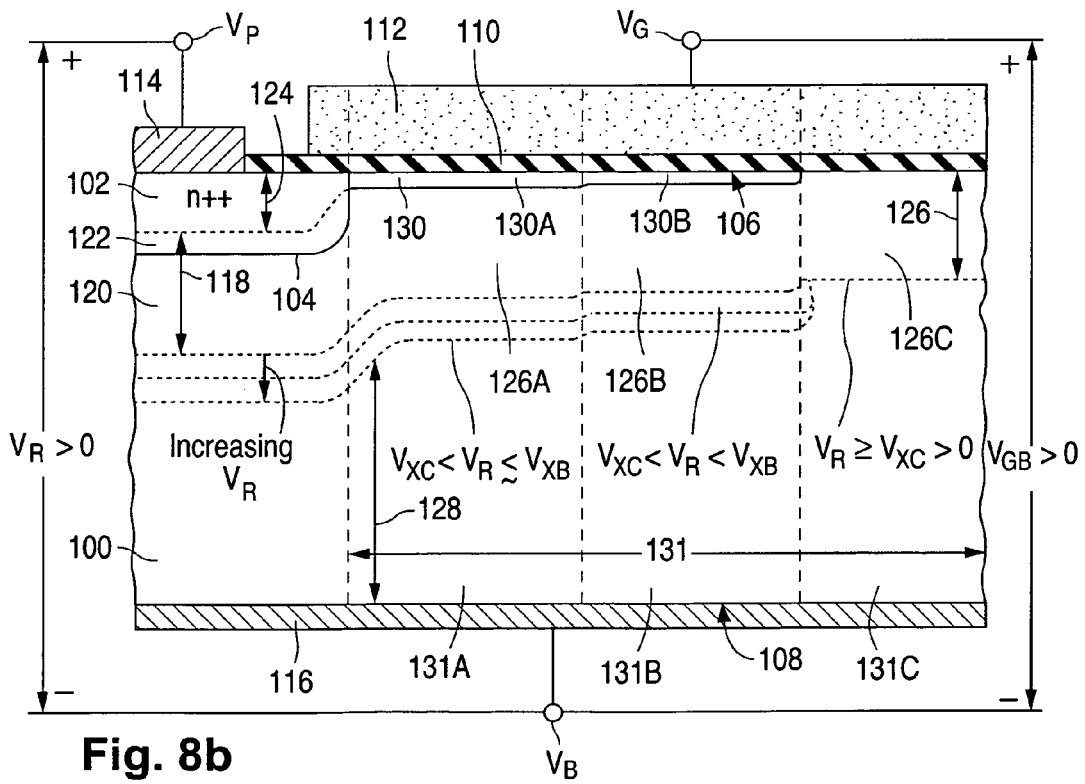
Figure 8C:
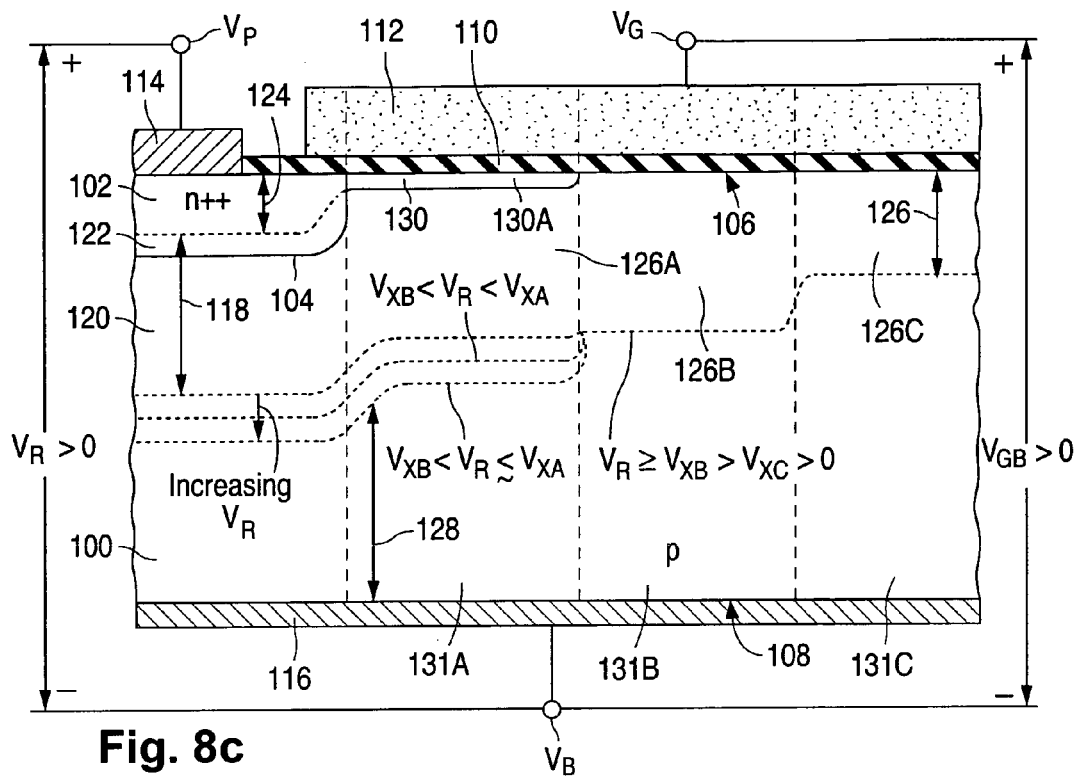

During varactor operation, gate-to-body voltage $V_{GB}$ is controlled so as to produce an inversion condition in the body material along upper semiconductor surface 106 below gate electrode 112 when plate-to-body voltage $V_R$ is close to, typically at, zero (volts). The inversion condition is represented in FIGS. 8a–8c by an inversion layer 130 that extends along upper surface 106 below gate dielectric layer 110 and gate electrode 112 to meet plate region 102. At the stage of FIG. 8a, inversion layer 130 is situated along the entire upper semiconductor surface portion that forms the upper surface of body region 100 below electrode 112. The varactor of FIG. 8 operates across a $V_R$ range in which plate-to-body voltage $V_R$ varies from a minimum value $V_{min}$ in the vicinity of zero to a suitable positive maximum value $V_{Rmax}$.

Inversion layer 130 is of the same conductivity type, n-type, as plate region 102. Hence, the charge carriers in inversion layer 130 are electrons, the majority charge carriers in region 102. Layer 130 normally has a thickness in the vicinity of 1–10 nm. When gate dielectric layer 110 is approximately 4 nm thick, inversion layer 130 reaches a maximum electron concentration approximately 1 nm below dielectric layer 110. The thickness of inversion layer 130 is then approximately 3 nm.

The varactor of FIG. 8 has a gate region 131 consisting of gate electrode 112 and the underlying dielectric/semiconductor material situated laterally to the side of plate region 102. Gate region 131 is laterally divided into a group of gate portions which, as referenced to a suitable given (constant) value of plate-to-body voltage $V_R$, have different respective gate-to-body threshold voltages $V_T$, all of which are positive. At the reference value of voltage $V_R$, threshold voltage $V_T$ of each gate portion is the value of gate-to-body voltage $V_{GB}$ at which inversion first occurs along the upper surface of that gate portion directly below gate dielectric layer 110. The boundaries between adjoining gate portions are indicated by vertical dashed lines in FIG. 8.

The gate portions are, in accordance with the invention, laterally arranged so that each gate portion meets plate region 102 or/and is continuous with at least one other gate portion whose gate-to-body threshold voltage $V_T$, at the reference value of plate-to-body voltage $V_R$, is lower than gate-to-body threshold voltage $V_T$ of that gate portion, again at the reference $V_R$ value. Consequently, each gate portion either meets plate region 102 or is coupled to region 102 through one or more other gate portions of lower gate-to-body threshold voltage $V_T$ than that gate portion at the reference $V_R$ value. The reference value of voltage $V_R$ for defining threshold voltages $V_T$ of the gate portions is typically zero. Each threshold voltage $V_T$ at zero voltage $V_R$ is referred to here as a "zero-point" gate-to-body threshold voltage $V_{T0}$. Hence, each gate portion either meets plate region 102 or is continuous with another gate portion of lower zero-point gate-to-body threshold voltage $V_{T0}$ so as to be physically coupled to region 102 through one or more other gate portions of lower zero-point gate-to-body threshold voltage $V_{T0}$.

FIG. 8 presents an example in which gate region 131 is divided into three gate portions 131A, 131B, and 131C. The situation in which region 131 consists of three portions 131A–131C is also presented in the implementations/variations of FIG. 15–17, 20, and 21 (discussed further below). Region 131 can have as little as two gate portions. FIGS. 12–14, 18, 19, 22, and 29 (also discussed further below) illustrate implementations/variations of the varactor of FIG. 8 in which region 131 is divided into two gate portions 131A and 131B.

Figure 26:
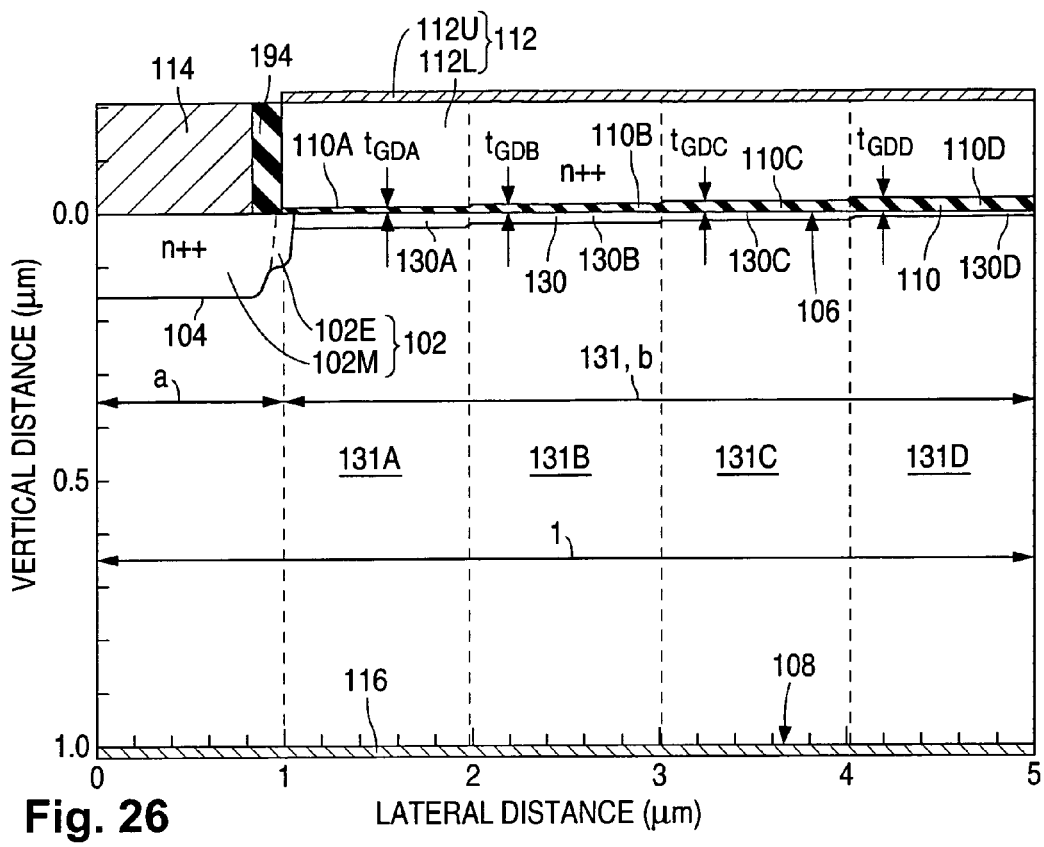
FIG. 26 is a cross-sectional side view of a computer-simulated n-channel silicon-gate gate-enhanced junction varactor configured according to the invention to have the gate dielectric layer divided into four portions of different thicknesses.

Gate region 131 can also be divided into more than three gate portions. FIG. 26 (likewise discussed further below) depicts an example in which region 131 has four gate portions 131A, 131B, 131C, and 131D. The maximum number of gate portions that can be accommodated in a varactor configured according to the invention is constrained substantially only by manufacturing limitations involved in fabricating the integrated circuit containing the varactor.

Gate portion 131A meets plate region 102 and has the lowest zero-point gate-to-body threshold voltage $V_{T0}$ of all the gate portions regardless of whether are two, three, or more than three gate portions. Gate portion 1311B is of higher threshold voltage $V_{T0}$ than portion 131A. When present, gate portion 131C is of higher threshold voltage $V_{T0}$ than portion 131B. When present, gate portion 131D is similarly of higher threshold voltage $V_{T0}$ than portion 131C. Threshold voltages $V_{T0}$ of the gate portions thus increase in going sequentially from portion 131A identified by a reference symbol having the lowest alphabetical suffix to a gate portion identified by a reference symbol having the highest alphabetical suffix. This characteristic applies to the varactor of FIG. 8 and also to all the later-described implementations and variations of the varactor of FIG. 8.

In the example of FIG. 8, gate portion 131A extends between gate portion 131B and plate region 102 such that portion 131B is spaced apart from region 102. That is, portion 131A separates portion 131B from region 102. Portion 131B similarly extends between gate portion 131C and portion 131A so as to separate portion 131C from portion 131A. Hence, portion 131C is spaced further apart from region 102 than is portion 131B. As a result of this configuration, zero-point gate-to-body threshold voltages $V_{T0}$ progressively increase in going from portion 131A which meets, and is thus closest to, region 102 to portion 131C which is furthest from region 102.

The n-channel varactor of FIG. 8 is an implementation of the general situation in which the gate portions are arranged to become progressively more distant from plate region 102 starting with the gate portion (131A) that meets region 102 and in which zero-point gate-to-body threshold voltages $V_{T0}$ of the gate portions progressively increase as the gate portions become progressively more distant from region 102. The gate portion which meets, and is thus closest to, region 102 has the lowest threshold voltage $V_{T0}$ in this general arrangement. The gate portion which is furthest from region 102 has the highest threshold voltage $V_{T0}$.

The gate portions of the present n-channel gate-enhanced junction varactor can be laterally configured in manners different from the sequential arrangement described in the preceding paragraph yet still satisfy the limitation that each gate portion either meet plate region 102 or be continuous with a gate portion of lower zero-point gate-to-body threshold voltage $V_{T0}$. For instance, two or more of the gate portions can meet region 102. FIGS. 18–21 present examples in which gate portions 131A and 131B both meet region 102.

Figure 20:
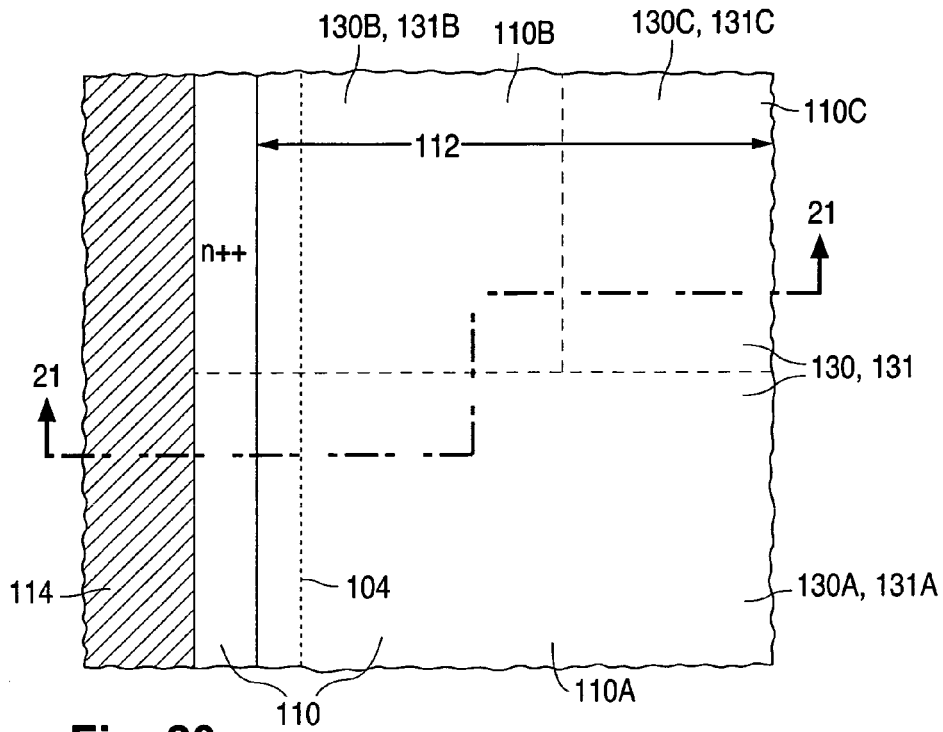
FIG. 20 is a cross-sectional plan view of another n-channel silicon-gate gate-enhanced junction varactor configured according to the invention.
Figure 21:
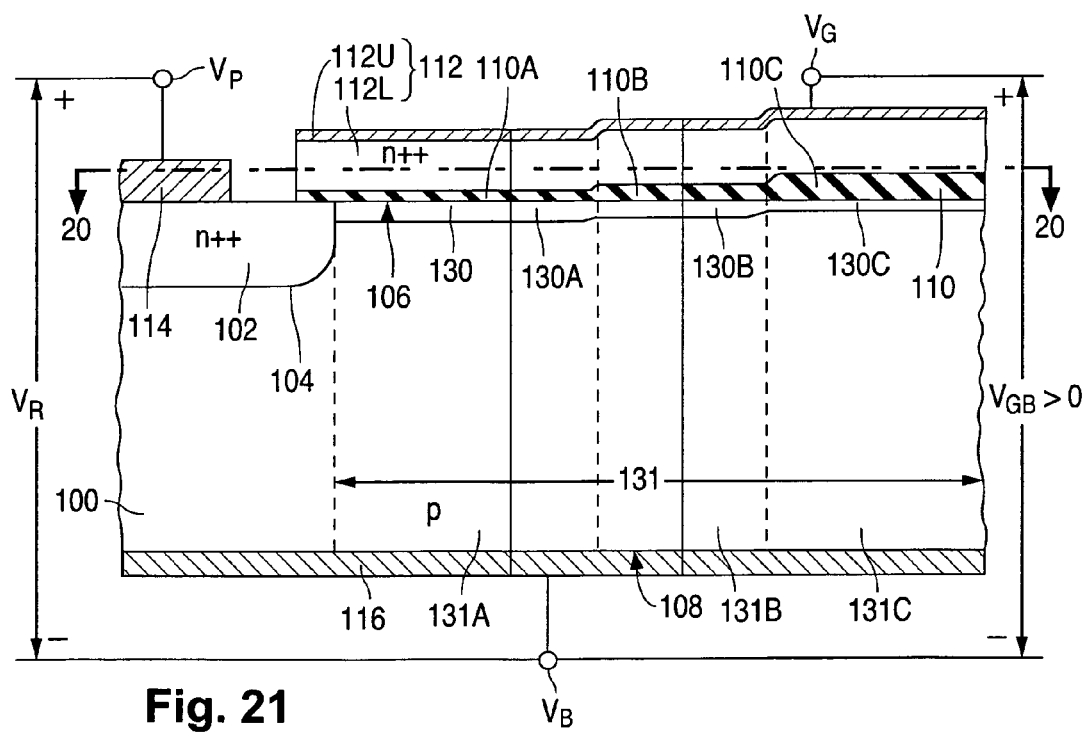
FIG. 21 is a cross-sectional side view of the gate-enhanced junction varactor of FIG. 20. The cross section of FIG. 20 is taken through plane 20—20 in FIG. 21. The cross section of FIG. 21 is taken through jagged "plane" 21—21 in FIG. 20.

Two or more gate portions can meet plate region 102 while one or more gate portions spaced apart from region 102 and having adequately high zero-point gate-to-body threshold voltages $V_{T0}$ can be continuous with one or more of the gate portions meeting region 102. FIGS. 20 and 21 present an example of this situation. Although gate portion 131C, which has the highest threshold voltage $V_{T0}$ in the example of FIGS. 20 and 21, is separated from region 102 by gate portions 131A and 131B, portion 131C can meet region 102 while portion 131B is separated from region 102 by portion 131A.

Two or more gate portions typically continuous with one another can be separated from plate region 102 by one gate portion that meets region 102. This configuration can be variously combined with the configuration described in the previous paragraph. Various permutations and combinations of these combinations can be employed with gate portions of progressively higher zero-point gate-to-body threshold voltages $V_{T0}$.

As the number of gate portions that meet plate region 102 increases, the average access resistance from region 102 to the gate portions generally decreases. This causes the quality factor to increase. Configurations in which all gate portions meet region 102 are thus quite advantageous.

By configuring gate region 131 so that each gate portion either meets plate region 102 or is continuous with a gate portion of lower zero-point gate-to-body threshold voltage $V_{T0}$, inversion layer 130 is similarly divided into multiple variably appearing inversion portions that respectively occur along the upper surfaces of the gate portions dependent on the values of plate-to-body voltage $V_R$ and gate-to-body voltage $V_{GB}$. Each inversion portion is characterized by threshold voltage $V_{T0}$ of the corresponding gate portion. Analogous to the gate portions, each inversion portion meets region 102 or/and is continuous with another inversion portion of lower threshold voltage $V_{T0}$ than that inversion portion. When any particular inversion portion is present, any other inversion portion having a lower threshold voltage $V_{T0}$ than that particular inversion portion is also present. Consequently, each inversion portion either meets region 102 or is electrically coupled to region 102 through one or more simultaneously appearing inversion portions of lower threshold voltage $V_{T0}$.

Consider the situation in which plate-to-body voltage $V_R$ is at zero. An inversion portion appears when gate-to-body voltage $V_{GB}$ is raised to a value equal to or greater than zero-point gate-to-body threshold voltage $V_{T0}$ of that inversion portion. An inversion portion disappears when gate-to-body voltage $V_{GB}$ is dropped to a value below that inversion portion's threshold voltage $V_{T0}$. In short, each inversion portion appears/disappears when $V_{GB}$ passes through that portion's threshold voltage $V_{T0}$.

With plate-to-body voltage $V_R$ still at zero, the following occurs when gate-to-body voltage $V_{GB}$ is raised to or above zero-point gate-to-body threshold voltage $V_{T0}$ of a particular inversion portion so that it appears. Any other inversion portion of lower threshold voltage $V_{T0}$ also appears. Since the first-mentioned inversion portion either meets plate region 102 or is electrically coupled to region 102 through one or more other simultaneously appearing inversion portions, the first-mentioned inversion portion is electrically coupled (directly or indirectly) to region 102 along with any other inversion portion of lower threshold voltage $V_{T0}$.

When gate-to-body voltage $V_{GB}$ equals or exceeds zero-point gate-to-body threshold voltage $V_{T0}$ of the inversion portion having the highest threshold voltage $V_{T0}$, all of the inversion portions are present and electrically coupled to plate region 102. That is, inversion layer 130 is fully present and electrically coupled to region 102. When voltage $V_{GB}$ equals or exceeds threshold voltage $V_{T0}$ of at least one, but not all, of the inversion portions, each inversion portion whose threshold voltage $V_{T0}$ is less than or equal to the then-existent value of $V_{GB}$ is present and electrically coupled to region 102. Inversion layer 130 is partially present with every present portion being electrically coupled to region 102. When voltage $V_{GB}$ is less than threshold voltage $V_{T0}$ of every inversion portion, layer 130 is fully absent.

Inasmuch as three gate portions 131A–13C are present in the example of FIG. 8, inversion layer 130 in FIG. 8 is divided into three variably appearing inversion portions 130A, 130B, and 130C that respectively appear/disappear along the upper surface of gate portions 131A–131C. This situation is also illustrated in FIGS. 15–17, 20, and 21. Since each inversion portion occurs along the upper surface of a corresponding different one of the gate portions, there can be as few as two variably appearing inversion portions as occurs in the implementations/variations of FIGS. 12–14, 18, 19, 22, and 29 where inversion portions 130A and 130B respectively appear/disappear along the upper surfaces of gate portions 131A and 131B. There can also be more than three inversion portions, e.g., four as arises in FIG. 26 where inversion layer 130 is divided into inversion portions 130A, 130B, 130C, and 130D that respectively appear/disappear along the upper surfaces of gate portions 131A–131D.

The comments presented above about the lateral arrangements of the gate portions apply, of course, to how the inversion portions are laterally arranged when all of them are present. In other words, the inversion portions can be arranged, as generally shown in FIG. 8, so as to become progressively more distant from plate region 102 starting with the inversion portion (130A) that meets region 102. The zero-point gate-to-body threshold voltages $V_{T0}$ that respectively characterize the inversion portions then progressively increase as the inversion portions become progressively more distant from region 102. When all the inversion portions are present, they can also be laterally arranged in all of the other permutations and combinations described above for the gate portions.

Each gate portion includes a corresponding portion of surface depletion region 126. Portions 131A–131C of gate region 131 in the varactor of FIG. 8 respectively have upper surface depletion portions 126A, 126B, and 126C which together form depletion region 126. In situations where gate region 131 is divided into two portions 131A and 131B, these two portions 131A and 131B respectively include upper surface depletion portions 126A and 126B. Depletion region 126 contains four surface depletion portions 126A, 126B, 126C, and 126D that respectively form parts of gate portions 131A–131D in situations where gate region 131 is divided into four portions 131A–131D.

With the foregoing in mind, the varactor of FIG. 8 operates in the following way. The relationship between plate-to-body $V_R$ and gate-to-body voltage $V_{GB}$ is typically controlled so that voltage $V_{GB}$ is at an initial bias value $V_{GBi}$ sufficient to cause inversion layer 130 to be fully present when voltage $V_R$ is zero. Let $V_{T0max}$ represent the zero-point gate-to-body threshold voltage $V_{T0}$ of the inversion portion, e.g., inversion portion 130C in the example of FIG. 8, having the highest threshold voltage $V_{T0}$. Gate-to-body bias value $V_{GBi}$ is then greater than or equal to $V_{T0max}$.

The relationship between voltages $V_R$ and $V_{GB}$ can be controlled so that gate-to-body voltage $V_{GB}$ is at initial value $V_{GBi}$ for causing inversion layer 130 to be fully present when plate-to-body voltage $V_R$ is at a value $V_{Ri}$ which is slightly positive or slightly negative, i.e., non-zero. In that case, initial gate-to-body value $V_{GBi}$ is greater than or equal to the general gate-to-body threshold voltage $V_{Tmax}$ of the inversion portion, once again portion 130C in the example of FIG. 8, having highest zero-point gate-to-body threshold voltage $V_{T0max}$. When non-zero gate-to-body value $V_{Ri}$ is negative, value $V_{Ri}$ is a safe amount, e.g., 0.1–0.2 V above negative junction threshold voltage $V_{R0}$, again –0.6–0.7 V at which p-n junction 104 becomes significantly forwardly conductive. For instance, value $V_{Ri}$ can readily be as low as –0.5 V. Minimum value $V_{Rmin}$ of the $V_{Rmin}$-to-$V_{Rmax}$ range across which voltage $V_R$ varies in the varactor of FIG. 8 is then normally close to value $V_{Ri}$.

When inversion layer 130 is partially or fully present, every inversion portion present is electrically connected to undepleted material 124 of plate region 102 as a result of configuring gate region 131 in the preceding manner. The varactor of FIG. 8 then has a two-part upper capacitor plate consisting of undepleted material 124 and inversion layer 130 to the extent that layer 130 is present. The lower capacitor plate is undepleted material 128 of body region 100. The capacitor dielectric consists of junction depletion region 118 and surface depletion region 126 to the extent that region 126 underlies layer 130 in its then-existent condition. In essence, inversion layer 130 enhances the lateral size of the present junction varactor so that it achieves a larger maximum capacitive area than an otherwise equivalent junction varactor lacking the gate enhancement of the invention.

FIGS. 8a–8c illustrate stages in which inversion layer 130 is partially or fully present. Layer 130 is fully present at the stage of FIG. 8a. That is, inversion portions 130A–130C are all present in FIG. 8a. The upper capacitor plate at the stage of FIG. 8a thereby consists of undepleted plate material 124 and inversion portions 130A–130C since all of them are electrically connected to undepleted plate material 124. The capacitor dielectric in FIG. 8a is formed with junction depletion region 118 and all three portions 126A–126C of surface depletion region 126.

Inversion layer 130 is partially present at the stages of FIGS. 8b and 8c. In FIG. 8b, inversion portions 130A and 130B are present. Since both of inversion portions 130A and 130B are connected to undepleted plate material 124, the upper capacitor plate is formed with undepleted plate material 124 and inversion portions 130A and 130B in FIG. 8b. The capacitor dielectric consists of junction depletion region 118 and surface depletion portions 126A and 126B in FIG. 8b. Only inversion portion 130A is present in FIG. 8c. In FIG. 8c, the upper capacitor plate consists of undepleted plate material 124 and inversion portion 130A while the capacitor dielectric is formed with junction depletion region 118 and surface depletion portion 126A.

Let $C_V$ represent the present varactor's AC capacitance taken between plate electrode 114 and body electrode 116. Varactor capacitance $C_V$ depends on an accumulative combination of (a) the lateral area occupied by undepleted material 124 of plate region 102 and (b) the lateral area occupied by inversion layer 130 to the extent that it is present. As indicated in FIGS. 8a–8c, undepleted plate material 124 extends fully across plate region 102 when layer 130 is fully or partially present. In this condition, capacitance $C_V$ is given approximately as:

$$C_V = K_{SC}\varepsilon_0 \left( \frac{A_P}{t_{dJ}} + \frac{A_I}{t_{ds}} \right) \quad (12)$$

where $A_P$ is the lateral area occupied by plate region 102, $t_{dJ}$ is the average thickness of junction depletion region 118, $A_I$ is the lateral area occupied by inversion layer 130 when it is at least partially present, and $t_{ds}$ is the average thickness of surface depletion region 126 to the extent that it underlies inversion layer 130. Lateral inversion area $A_I$ has a maximum lateral value $A_{Imax}$ that arises when layer 130 is fully present as occurs at the stage of FIG. 8a.

AC areal capacitance $C_{VA}$ of the varactor of FIG. 8 is averaged over the varactor's entire lateral capacitive area $A_P + A_{Imax}$. When inversion layer 130 is fully or partially present, capacitance $C_{VA}$ is thus given as:

$$C_{VA} = \frac{C_V}{A_P + A_{Imax}} = \frac{K_{SC}\varepsilon_0}{(A_P + A_{Imax})} \left( \frac{A_P}{t_{dJ}} + \frac{A_I}{t_{ds}} \right) \quad (13)$$

Gate-to-body voltage $V_{GB}$ is maintained approximately constant at initial value $V_{GBi}$ in one preferred implementation of the gate-enhanced varactor of FIG. 8. As plate-to-body voltage $V_R$ is raised above minimum value $V_{Rmin}$ starting from the stage of FIG. 8a in which inversion layer 130 is fully present, the increase in voltage $V_R$ causes the electrical potential of undepleted material 124 of plate region 102 to increase by a corresponding amount relative to body voltage $V_B$. Accordingly, thickness $t_{dJ}$ of junction depletion region 118 increases.

The increase in plate-to-body voltage $V_R$ is applied (with slight resistive diminishment) to inversion layer 130 by way of undepleted material 124 of plate region 102. With gate-to-body voltage $V_{GB}$ being constant, thickness $t_{ds}$ of surface depletion region 126 may initially remain approximately constant as voltage $V_R$ is raised above $V_{Rmin}$ should minimum value $V_{Rmin}$ be less than zero. If the potential that voltage $V_R$ produces in layer 130 does not exceed the potential that voltage $V_{GB}$ produces in layer 130 when voltage $V_R$ is at $V_{Rmin}$, raising voltage $V_R$ above $V_{Rmin}$ causes a point to be is reached at which the electrical potential that voltage $V_R$ produces in layer 130 exceeds the electrical potential that voltage $V_{GB}$ produces in layer 130. This situation is present whenever voltage $V_R$ is greater than zero. Plate-to-body voltage $V_R$ then controls the electrical potential of layer 130 and, consequently, thickness $t_{ds}$ of depletion region 126. Further increase in voltage $V_R$ causes thickness $t_{ds}$ to increase.

With thickness $t_{dJ}$ of junction depletion region 118 increasing with increasing plate-to-body voltage $V_R$ and with thickness $t_{ds}$ of surface depletion region 126 being largely constant or increasing as voltage $V_R$ increases starting from minimum value $V_{Rmin}$, varactor capacitance $C_{VA}$ is at maximum value $C_{VAmax}$ in the varactor of FIG. 8 when inversion layer 130 is fully present with voltage $V_R$ at $V_{Rmin}$. Using Eq. 13 for the condition in which inversion area $A_I$ is at maximum value $A_{Imax}$, maximum capacitance $C_{VAmax}$ is given approximately as:

$$C_{VAmax} = \frac{K_{SC}\varepsilon_0}{(A_P + A_{Imax})} \left( \frac{A_P}{t_{dJmin}} + \frac{A_{Imax}}{t_{dsmin}} \right) \quad (14)$$

where $t_{dJmin}$ and $t_{dsmin}$ respectively are the minimum values of thicknesses $t_{dJ}$ and $t_{ds}$ of junction depletion region 118 and surface depletion region 126 at voltage $V_R$ equal to $V_{Rmin}$.

As plate-to-body voltage $V_R$ increases beyond the point at which the potential produced by voltage $V_R$ in surface depletion region 126 first exceeds the potential produced by gate-to-body voltage $V_{GB}$ in region 126, the electrons in inversion layer 130 are gradually drained to plate region 102. The vertical electric field produced by voltage $V_{GB}$ creates additional negative depletion charge in region 126 to make up for the negative charge lost to plate region 102. However, nothing of a significant qualitative nature occurs as long as electrons are still present along the top of body region 100 below gate electrode 112 in all of portions 131A–131C of gate region 131. Consequently, increasing voltage $V_R$ causes varactor capacitance $C_{VA}$ to decrease monotonically in the varactor of FIG. 8.

With plate-to-body voltage $V_R$ controlling the potential in inversion layer 130 and with gate-to-body voltage $V_{GB}$ being maintained constant, raising voltage $V_R$ causes the potential difference between gate electrode 112 and layer 130 to decrease. Under these circumstances, voltage $V_R$ is raised to a transition value $V_{XC}$ at which the potential difference between gate electrode 112 and portion 130C of layer 130 drops below the value needed to maintain inversion in gate portion 131C along upper semiconductor surface 106 while, because portions 130A and 130B of layer 130 are of lower zero-point gate-to-body threshold voltage $V_{T0}$ than portion 130A, the potential differences (a) between electrode 112 and inversion portion 130A and (b) between electrode 112 and inversion portion 130B are both respectively above the values needed to maintain inversion in gate portions 131A and 131B along upper surface 106. As a result, all the electrons in inversion portion 130C are drained to plate region 102 while electrons continue to be present in inversion portions 130A and 130B. Inversion portion 130C thereby disappears.

FIGS. 8a and 8b illustrate how the capacitive structure evolves as plate-to-body voltage $V_R$ is raised from minimum value $V_{Rmin}$, here depicted as zero, to positive values somewhat greater than transition value $V_{XC}$ at constant gate-to-body voltage $V_{GB}$. The dotted lines in FIG. 8a indicate how the thicknesses of depletion regions 118 and 126 increase as voltage $V_R$ is increased from zero to a value just below transition value $V_{XC}$. The thicknesses of portions 126A–126C of surface depletion region 126 all increase by approximately equal amounts when voltage $V_R$ is raised from zero to a value just below $V_{XC}$.

The dotted lines in FIG. 8b indicate what happens to the thicknesses of regions 118 and 126 as plate-to-body voltage $V_R$ goes from transition value $V_{XC}$ to even higher values. When voltage $V_R$ is raised above $V_{XC}$, the thickness of surface depletion portion 126C remains largely constant, while the thicknesses of surface depletion portions 126A and 126B continue to increase by approximately equal amounts across the $V_R$ range covered by FIG. 8b. The thickness of junction depletion region 118 progressively increases as voltage $V_R$ is raised from zero to values above $V_{XC}$.

The disappearance of inversion portion 130C causes the upper capacitor plate of the varactor in FIG. 8 to shrink laterally so as to consist of inversion portions 130A and 130B and undepleted material of 124 of plate region 102. Part of inversion layer 130 is, in effect, electrically disconnected from undepleted plate material 124. In the absence of inversion portion 130C, the capacitor dielectric is formed with junction depletion region 118 and surface depletion portions 126A and 126B.

The disappearance of portions of inversion layer 130 continues as plate-to-body voltage $V_R$ is raised above transition value $V_{XC}$ with gate-to-body voltage $V_{GB}$ being held constant. Upon raising voltage $V_R$ above $V_{XC}$ to another transition value $V_{XB}$, the potential difference between gate electrode 112 and inversion portion 130B is less than the value needed to maintain inversion in gate portion 130B along upper semiconductor surface 106 while, because inversion portion 130A is of lower zero-point gate-to-body threshold voltage $V_{T0}$ than portion 1301B, the potential difference between gate electrode 112 and inversion portion is above the value needed to maintain inversion in gate portion 131A along surface 106. All the electrons in inversion portion 130B are drained to plate region 102 while electrons continue to be present in inversion portion 130A. Referring to FIG. 8c, inversion portion 130B disappears.

Plate-to-body voltage $V_R$ is then raised above transition value $V_{XB}$ to a further transition value $V_{XA}$ at which the potential difference between gate electrode 112 and inversion portion 130A drops below the value needed to maintain inversion in gate portion 131A along upper semiconductor surface 106. All the electrons in inversion portion 130A are drained to plate region 102, causing portion 130A to disappear. See FIG. 8d. With inversion portions 130B and 130C already gone, all of inversion layer 130 is now gone. Transition values $V_{XA}$ and $V_{XB}$ along with transition value $V_{xc}$ are, as discussed below, functions of gate-to-body voltage $V_{GB}$.

Figure 8D:
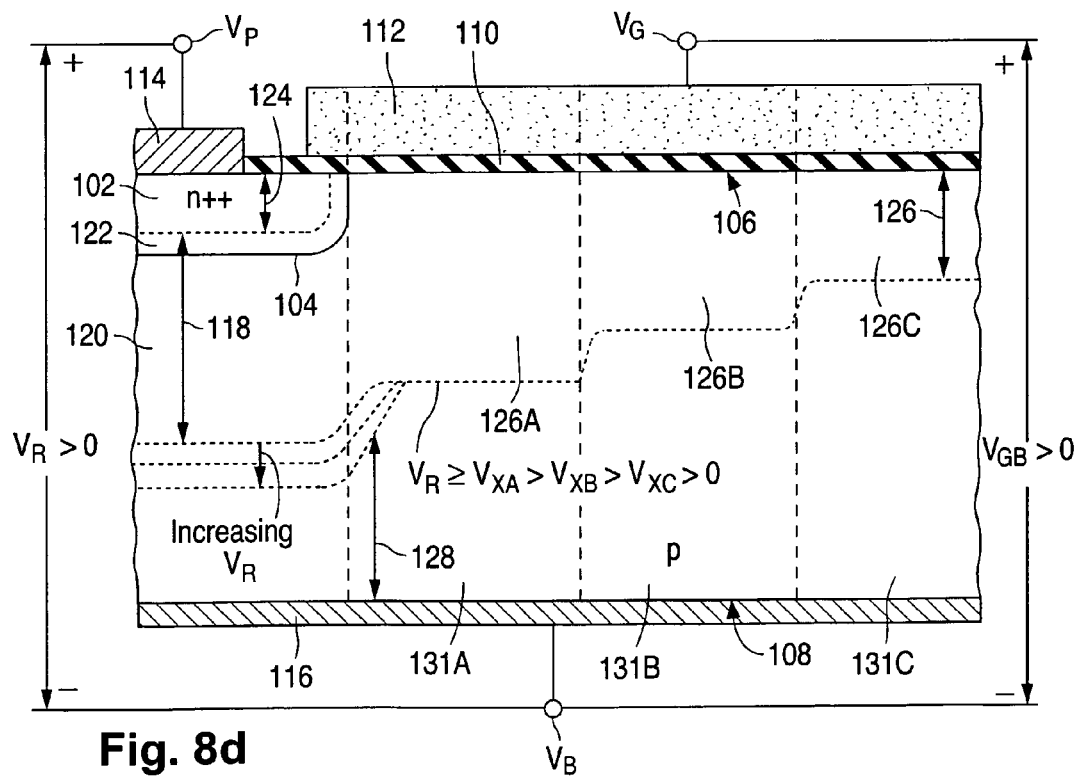

FIGS. 8b–8d depict the evolution of the capacitive structure as plate-to-body voltage $V_R$ is raised from transition value $V_{XC}$ through transition $V_{XB}$ to a value greater than transition $V_{XA}$ at constant gate-to-body voltage $V_{GB}$. FIG. 8b covers the $V_R$ range from $V_{XC}$ to a value just below $V_{XB}$. The dotted lines in FIG. 8c indicate what happens to the thicknesses of junction depletion region 118 and surface depletion region 126 as voltage $V_R$ is raised from $V_{XB}$ to a value just below $V_{XA}$. When voltage $V_R$ is raised above $V_{XB}$, the thicknesses of surface depletion portions 126B and 126C remain largely constant while the thickness of surface depletion portion 126A continues to increase. The dotted lines in FIG. 8d illustrate what happens to the thicknesses of depletion regions 118 and 126 as voltage $V_R$ is raised from $V_{XA}$ to higher values. Although the thickness of junction depletion region 118 continues to increase, the thicknesses of all three portions 126A–126C of surface depletion region 126 remain largely constant.

As inversion portions 130C, 130B, and 130A sequentially disappear with increasing plate-to-body voltage $V_R$, inversion layer 130 progressively disappears. When layer 130 is fully gone, the upper plate of the capacitor in FIG. 8 has shrunk laterally to consist solely of undepleted plate material 124. In effect, layer 130 is fully electrically disconnected from undepleted plate material 124. The capacitor dielectric consists solely of junction depletion region 118 in the absence of layer 130.

When inversion layer 130 is absent, capacitance $C_V$ for the varactor of FIG. 8 depends on area $A_P$ of plate region 102 but not on area $A_I$ of absent layer 130. In the absence of layer 130, capacitance $C_V$ is given as:

$$C_v = \frac{K_{SC}\varepsilon_0 A_P}{t_{dJ}} \qquad (15)$$

Although capacitance $C_V$ does not depend on maximum inversion area $A_{Imax}$, when layer 130 is fully absent, areal capacitance $C_{VA}$ does depend on total capacitive area $A_P + A_{Imax}$ of the varactor. Areal capacitance $C_{VA}$ is therefore given approximately as:

$$C_{VA} = \frac{K_{SC}\varepsilon_0 A_P}{(A_P + A_{Imax})t_{dJ}} \qquad (16)$$

when layer 130 is fully absent.

As plate-to-body voltage $V_R$ passes progressively through transition values $V_{XC}$, $V_{XB}$, and $V_{XA}$ in moving upward, areal capacitance $C_{VA}$ drops gradually from a high value $C_{VAH}$ to a low value $C_{VAL}$. Using Eqs. 13 and 16, high capacitance value $C_{VAH}$ and low capacitance value $C_{VAL}$ are respectively given as:

$$C_{VAH} = \frac{K_{SC}\varepsilon_0}{(A_P + A_{Imax})}\left(\frac{A_P}{t_{dJXL}} + \frac{A_{Imax}}{t_{dsXL}}\right) \qquad (17)$$

$$C_{VAL} = \frac{K_{SC}\varepsilon_0 A_P}{(A_P + A_{Imax})t_{dJXH}} \qquad (18)$$

where $t_{dJXL}$ is the value of thickness $t_{dJ}$ of junction depletion region 118 when voltage $V_R$ equals lowest transition value $V_{XC}$, $t_{dsXL}$ is the value of thickness $t_{ds}$ of surface depletion region 126 when voltage $V_R$ equals $V_{XC}$, and $t_{dJXH}$ is the value of thickness $t_{dJ}$ when voltage $V_R$ equals highest transition value $V_{XA}$. The ratio $C_{VAH}/C_{VAL}$ of the AC capacitance change that occurs when voltage $V_R$ passes through all (three here) of the transition values is thus approximately:

$$\frac{C_{VAH}}{C_{VAL}} = \left(\frac{t_{dJXH}}{t_{dJXL}}\right) + \left(\frac{A_{Imax}}{A_P}\right)\left(\frac{t_{dJXH}}{t_{dsXL}}\right) \qquad (19)$$

The $C_{VAH}/C_{VAL}$ transition capacitance ratio of Eq. 19 depends on the ratio of area $A_{Imax}$ of full inversion layer 130 to the area $A_P$ of plate region 102 and can be made high by simply making the $A_{Imax}/A_P$ area ratio high.

The derivation of Eqs. 12–19 was performed in connection with the example of FIG. 8 where plate-to-body voltage $V_R$ has three transition values $V_{XA}$–$V_{XC}$ (collectively, "transition values $V_X$" or "transition voltages $V_X$") respectively corresponding to the three variably appearing inversion portions 130A–130C that form inversion layer 130 in the illustrated varactor. Nonetheless, Eqs. 12–19 apply to the situation in which voltage $V_R$ has another plural number, i.e., two or more than three, of transition values $V_X$ respectively corresponding to the same plural number of variably appearing portions of layer 130. In general, thicknesses $t_{dJXL}$ and $t_{dsXL}$ are the respective values of junction depletion thickness $t_{dJ}$ and surface depletion thickness $t_{ds}$ at the lowest transition value $V_X$ of voltage $V_R$ while thickness $t_{dJXH}$ is the value of junction depletion thickness $t_{dJ}$ at the highest transition value $V_X$ of voltage $V_R$.

When plate-to-body voltage $V_R$ is closely approaching highest transition value $V_{XA}$ from below in the varactor of FIG. 8 so that portion 130A of inversion layer 130 is still present, voltage $V_R$ controls both the electrical potential in plate region 102 and the electrical potential in inversion portion 130A. The amount by which the electrical potential of inversion portion 130A exceeds body voltage $V_B$ is approximately the same as the amount by which the electrical potential of region 102 exceeds voltage $V_B$. For a typical implementation in which acceptor body dopant concentration NB is largely uniform in surface depletion region 126 and body-side portion 120 of junction depletion region 118, transition thicknesses $t_{dsXL}$ and $t_{dJXL}$ of depletion regions 118 and 126 are approximately equal. Eq. 19 reduces simply to:

$$\frac{C_{VAH}}{C_{VAL}} = \left(\frac{t_{dJXH}}{t_{dJXL}}\right)\left(1 + \frac{A_{Imax}}{A_P}\right) \tag{20}$$

for uniform acceptor dopant concentration $N_B$ in body-side depletion portion 120 and surface depletion region 126.

Raising plate-to-body voltage $V_R$ beyond the highest transition value ($V_{XA}$) toward maximum value $V_{Rmax}$ causes thickness $t_{dJ}$ of junction depletion region 118 to increase further. In light of Eq. 16, capacitance $C_{VA}$ decreases further for the varactor of FIG. 8. Capacitance $C_{VA}$ reaches minimum capacitance value $C_{VAmin}$ when voltage $V_R$ reaches $V_{Rmax}$. Using Eq. 16, minimum capacitance $C_{VAmin}$ for the varactor of FIG. 8 is given approximately as:

$$C_{VAmin} = \frac{K_{SC}\varepsilon_0 A_P}{(A_P + A_{Imax})t_{dJmax}} \tag{21}$$

where $t_{dJmax}$ is the maximum value of thickness $t_{dJ}$ of junction depletion region 118 when voltage $V_R$ equals $V_{Rmax}$.

By combining Eqs. 14 and 21, the ratio of maximum varactor areal capacitance $C_{VAmax}$ to minimum varactor areal capacitance $C_{VAmin}$ for the varactor of FIG. 8 is approximately:

$$\frac{C_{VAmax}}{C_{VAmin}} = \left(\frac{t_{dJmax}}{t_{dJmin}}\right) + \left(\frac{A_{Imax}}{A_P}\right)\left(\frac{t_{dJmax}}{t_{dsmin}}\right) \tag{22}$$

Per the approximation of Eq. 22, the maximum-to-minimum varactor capacitance ratio for the present gate-enhanced junction varactor is a function of (a) the maximum-to-minimum thickness ratio $t_{dJmax}/t_{dJmin}$ for junction depletion region 118, (b) the gate-enhancement area ratio $A_{Imax}/A_P$ of full inversion area $A_{Imax}$ to plate area $A_P$, and (c) the mixed gate-enhancement thickness ratio $t_{dJmax}/t_{dsmin}$ of maximum junction depletion thickness $t_{dJmax}$ to minimum surface depletion thickness $t_{dsmin}$.

The reverse of the preceding acts occurs when plate-to-body voltage $V_R$ is decreased from maximum value $V_{Rmax}$ down to minimum value $V_{Rmin}$ with gate-to-body voltage $V_{GB}$ at substantially a fixed value. Starting with inversion layer 130 absent at voltage $V_R$ equal to $V_{Rmax}$, inversion portions 130A–130C sequentially appear as voltage $V_R$ passes through transition values $V_{XA}$–$V_{XC}$ on the way to $V_{Rmin}$. Layer 130 thus gradually appears as voltage $V_R$ drops from highest transition value $V_{XA}$ down to a value just below lowest transition value $V_{XC}$.

Figure 3:
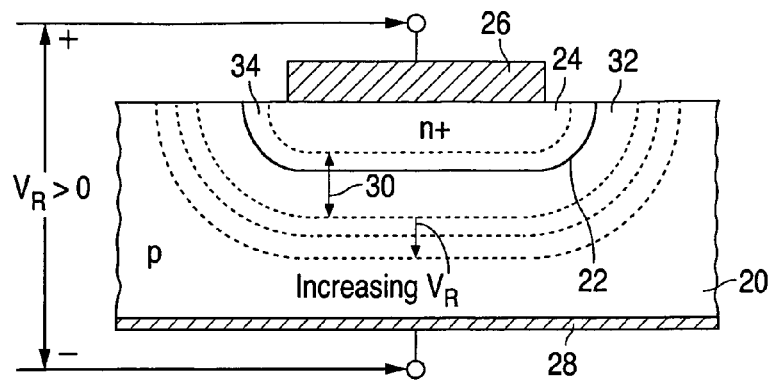
FIGS. 3, 4, 6, and 7 are cross-sectional side views of conventional varactors.
Figure 4:
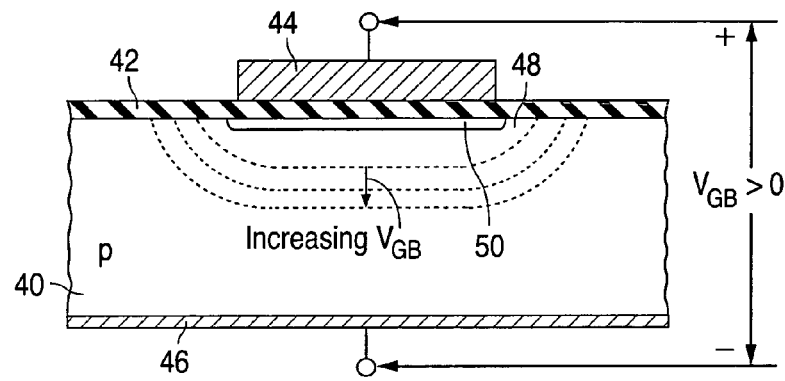

Thickness values $t_{dJmax}$ and $t_{dsmin}$ for junction depletion region 118 can be determined approximately from Eq. 3 presented above for the conventional junction varactor of FIG. 3. For uniform acceptor body dopant concentration $N_B$ in region 118, the maximum-to-minimum thickness ratio for region 118 is approximately:

$$\frac{t_{dJmax}}{t_{dJmin}} = \sqrt{\frac{V_{Rmax} + V_{BI}}{V_{Rmin} + V_{BI}}} \tag{23}$$

where $V_{BI}$ is the built-in voltage of p-n junction 104. The right-hand side of Eq. 23 is the maximum-to-minimum varactor capacitance ratio given by Eq. 4 for the conventional junction varactor of FIG. 3 at uniform body dopant concentration in body-side portion 32 of junction depletion region 30. If gate electrode 110 were absent so that inversion area $A_{Imax}$ is zero in the varactor of FIG. 8, the capacitance ratio given by Eq. 22 for the present gate-enhanced junction varactor would (as expected) devolve to that given by Eq. 4 for the conventional junction varactor.

In addition to the $t_{dJmax}/t_{dJmin}$ junction depletion thickness ratio, the maximum-to-minimum varactor capacitance ratio for the varactor of FIG. 8 contains, as indicated by Eq. 22, a factor $(A_{Imax}/A_P)(t_{dJmax}/t_{dJmin})$ that arises from the gate enhancement. The $t_{dJmax}/t_{dsmin}$ mixed gate-enhancement thickness ratio is greater than 1. Accordingly, the maximum-to-minimum varactor capacitance ratio for the varactor of FIG. 8 can be made quite high by choosing the $A_{Imax}/A_P$ gate-enhancement area ratio to be high.

For example, minimum surface depletion thickness $t_{dsmin}$ typically approximately equals minimum junction depletion thickness $t_{dJmin}$. Typical values for end-point voltages $V_{Rmax}$ and $V_{Rmin}$ are 2 and −0.5 V. With built-in voltage $V_{BI}$ being approximately 0.9 V, application of Eq. 23 yields a value of 2.5–3 for each of thickness ratios $t_{dJmax}/t_{dJmin}$ and $t_{dJmax}/t_{dsmin}$. At a moderate $A_{Imax}/A_P$ area ratio of 4, the $C_{VAmax}/C_{VAmin}$ capacitance ratio is 10–15 for the varactor of FIG. 8. For a higher $A_{Imax}/A_P$ area ratio of 8–10, the $C_{VAmax}/C_{VAmin}$ ratio is 20–30. The varactor of FIG. 8 can achieve yet higher values of the maximum-to-minimum capacitance ratio by utilizing values of the $A_{Imax}/A_P$ area ratio in excess of 10.

Figure 9A:
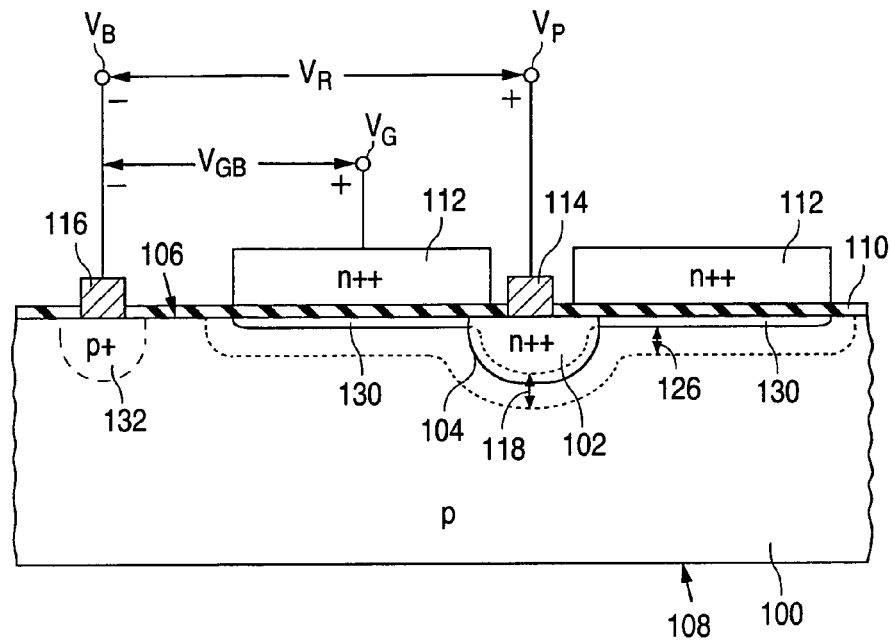
FIGS. 9a and 9b are cross-sectional side views of two silicon-gate implementations of the gate-enhanced junction varactor of FIGS. 8a–8d.

FIG. 9a illustrates one example of a silicon-gate implementation of the n-channel gate-enhanced junction varactor of FIG. 8 in accordance with the invention. Gate portions 131A–131C and the features that cause portions 131A–131C to have different zero-point gate-to-body threshold voltages $V_{T0}$ are, for simplicity, not indicated in FIG. 9a. In the example of FIG. 9a, body electrode 116 contacts body region 100 along upper semiconductor surface 106 through a heavily doped p-type body contact portion 132 of region 100. Body contact portion 132 is spaced laterally apart from surface depletion region 126 and also from junction depletion region 118.

Gate electrode 112 in the example of FIG. 9a consists of very heavily doped n-type polysilicon. Hence, gate electrode 112 is of the same conductivity type (n-type) as plate region 102. Two laterally separated portions of electrode 112 are depicted in FIG. 9a. These two portions can be two laterally separated gate electrodes 112 with gate voltage $V_G$ being applied to each electrode 112. The two portions can also be connected together outside the plane of FIG. 9a to form a single, normally annular, electrode 112.

Figure 9B:
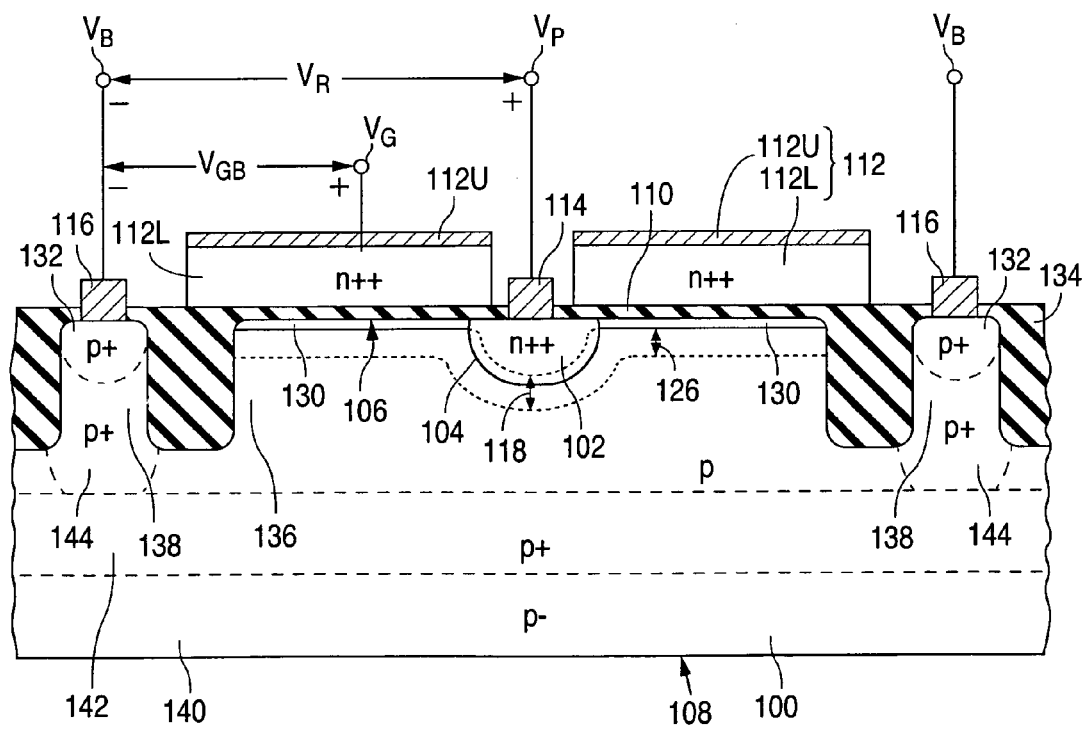
Figure 10A:
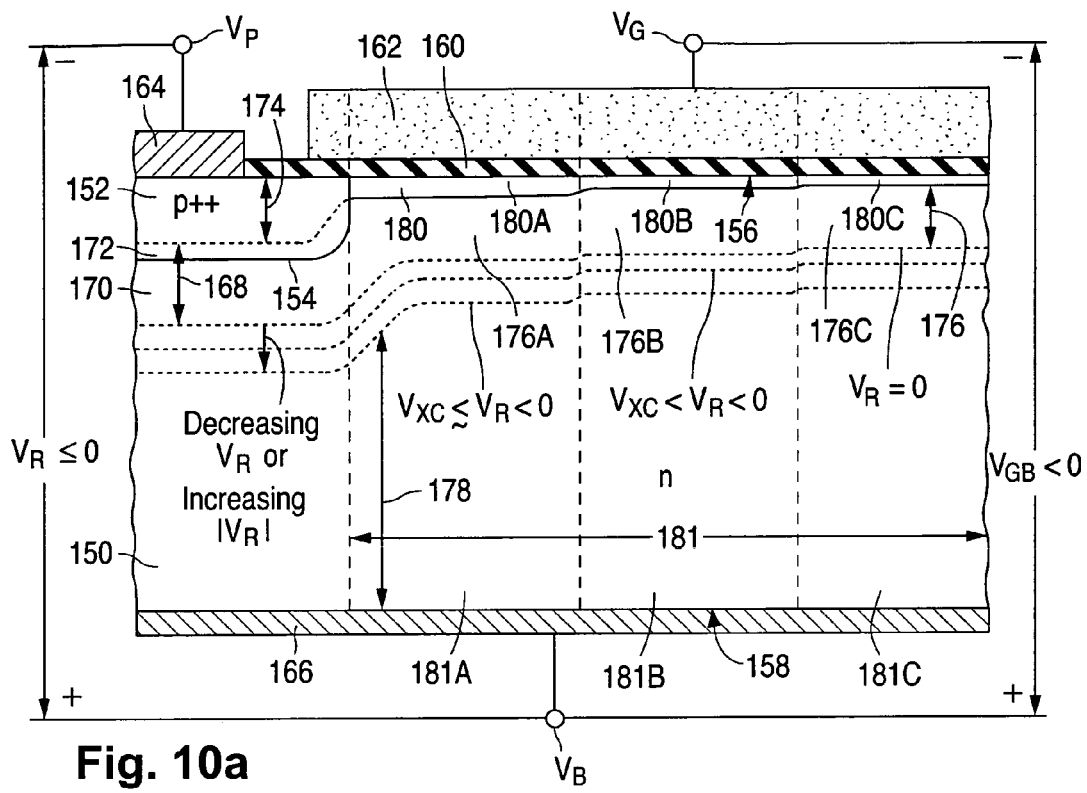
FIGS. 10a–10d are cross-sectional side views of a general p-channel gate-enhanced junction varactor configured according to the invention.
Figure 10B:
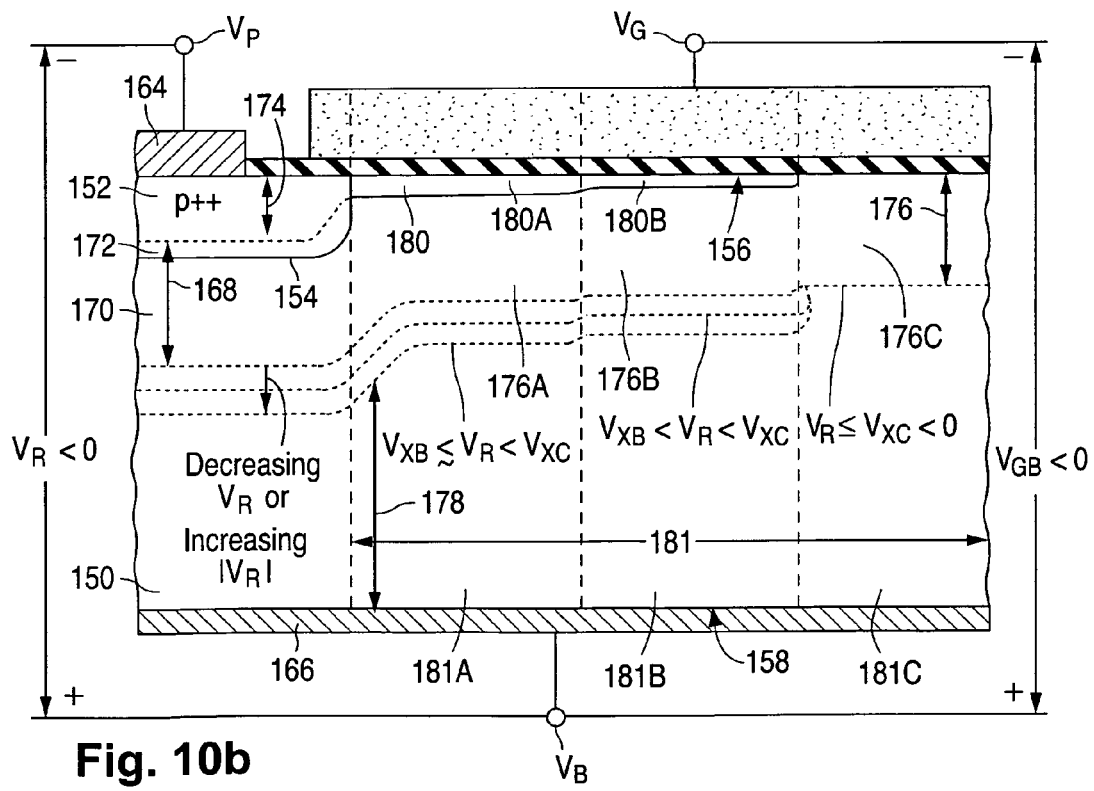
Figure 10C:
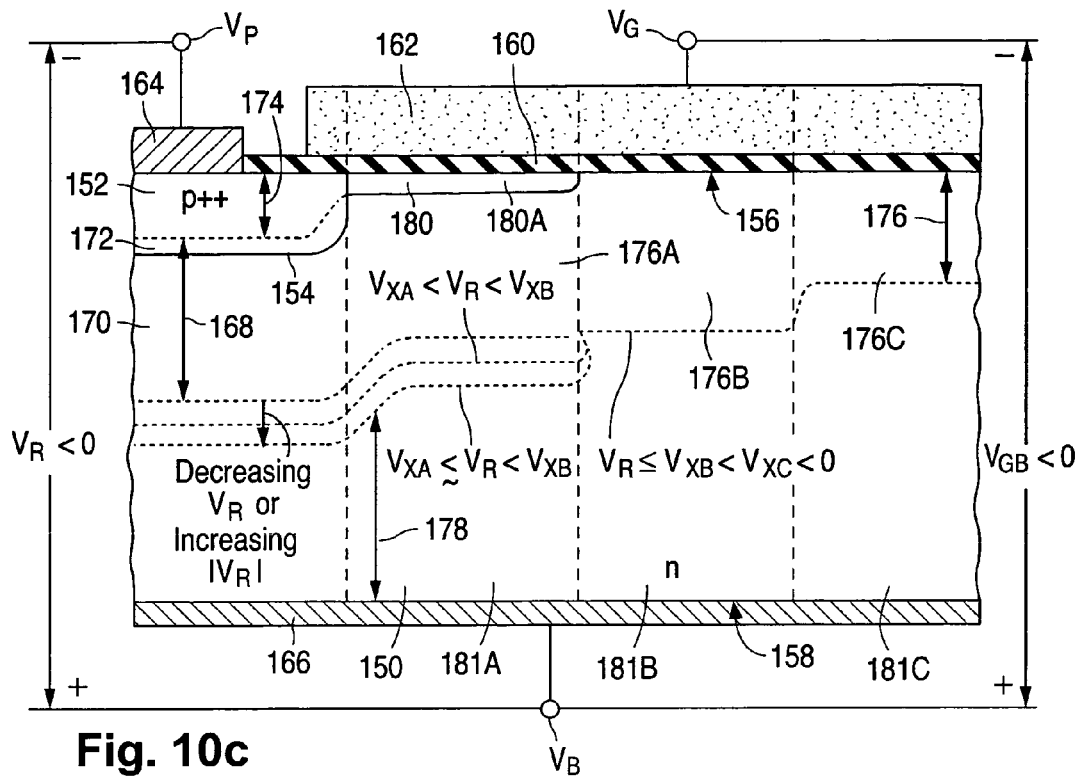
Figure 10D:
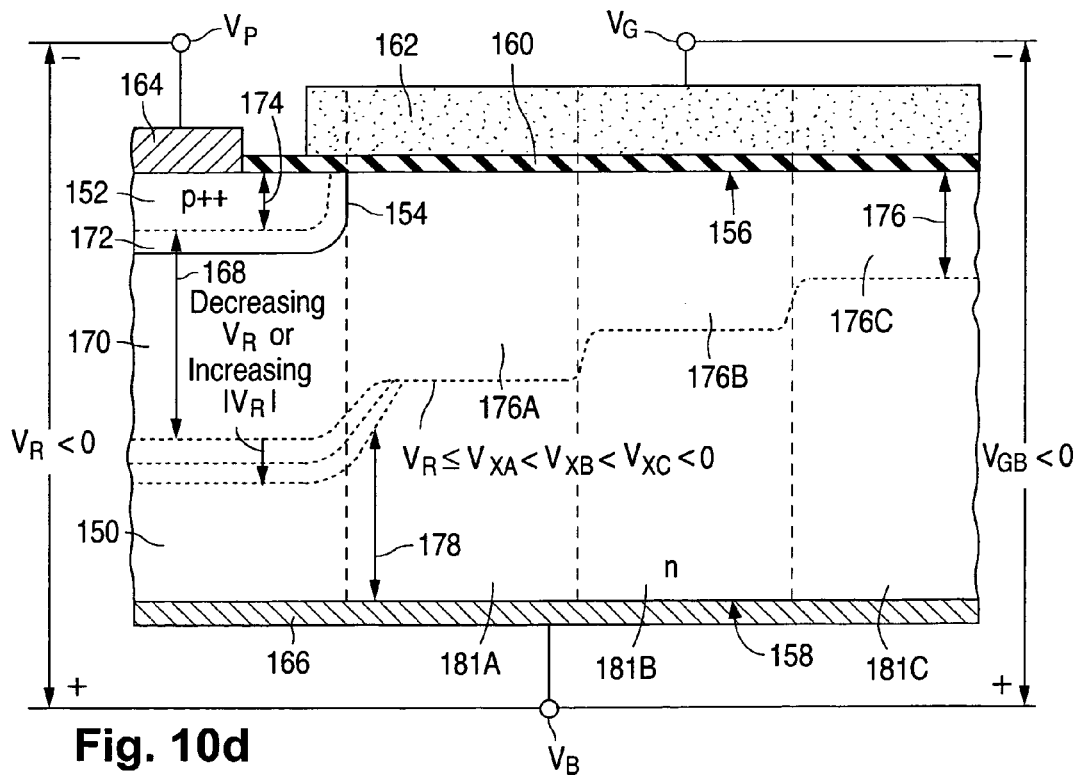

FIG. 9b illustrates another silicon-gate implementation of the n-channel gate-enhanced junction varactor of FIG. 8 in accordance with the invention. As in FIG. 9a, gate portions 131A–131C and the features which provide portions 131A–131C with different zero-point threshold voltages $V_{T0}$ are not indicated in FIG. 9b. In the implementation of FIG. 9b, a field region 134 of electrically insulating material extends into the semiconductor body along upper semiconductor surface 106 to divide an upper section of the semiconductor body into a group of laterally separated islands of semiconductor material. Field insulating region 134 typically consists largely of silicon oxide but can include, or consist largely of, other electrically insulating material. Items 136 and 138 in FIG. 9b indicate two of the semiconductor islands. Plate region 102 is located in semiconductor island 136. Gate electrode 112 overlies part of island 136.

The implementation of FIG. 9b contains p+ body contact portion 132 located in semiconductor island 138. Body electrode 116 may contact body contact portion 132 at one location, or at multiple locations, along upper semiconductor surface 106. Body contact portion 132 may be implemented as a single body contact segment or as multiple laterally separated body contact segments. In either case, field insulating region 134 laterally separates the one or more segments of body contact portion 132 from depletion regions 118 and 126. Although two portions of island 138 are shown in FIG. 9b, the two island portions are usually connected together outside the plane of FIG. 9b to form a single, normally annular, island 138.

In the implementation of FIG. 9b, body region 100 includes a lightly doped p-type substrate section 140 and an optional heavily doped p-type buried layer 142. Substrate section 140 extends downward to lower semiconductor surface 108. Buried layer 142 is situated between substrate section 140 and overlying moderately doped (p) material of body region 100. Buried layer 142 is illustrated as lying below field insulating region 134 but may contact region 134. Body region 100 also includes an optional heavily doped p-type plug region 144 that extends from buried layer 142 to body contact portion 132. When p+ buried layer 142 and p+ plug portion 144 are present in the structure, they reduce the access resistance to the lower capacitor plate portion consisting of the p-type material in semiconductor island 136. This improves the varactor's quality factor.

Gate electrode 112 in the implementation of FIG. 9b consists of a lower layer 112L and an upper layer 112U. Lower gate electrode layer 112L is formed with very heavily doped n-type polysilicon in the example of FIG. 9b. Similar to what occurs in the implementation of FIG. 9a, lower electrode layer 112L is thus of the same conductivity as plate region 102. Upper gate electrode layer 112U consists of metal or/and metal silicide. Similar to what was said above about gate electrode 112 in FIG. 9a, the two laterally separated portions of electrode 112 shown in FIG. 9b can be connected together outside the plane of FIG. 9b to form a single, normally annular, electrode 112. The two illustrated electrode portions can also be two laterally separated gate electrodes 112.

The gate-enhanced junction varactor of the present invention can be implemented in p-channel versions as well as n-channel versions. Analogous to FIG. 8, FIGS. 10a–10d (collectively "FIG. 10") illustrate a general p-channel gate-enhanced junction varactor in accordance with the invention at four stages of varactor operation. The p-channel junction varactor of FIG. 10 is formed from a semiconductor body containing an n-type body region 150 and a very heavily doped p-type plate region 152 that meets body region 150 to form a p-n junction 154. Items 156 and 158 in FIG. 10 indicate the upper and lower surfaces of the semiconductor body.

In addition, the p-channel junction varactor of FIG. 10 contains a gate dielectric layer 160, a gate electrode 162, a plate electrode 164, a body electrode 166, a junction depletion region 168 consisting of a body-side portion 170 and a plate-side portion 172, undepleted p-type material 174 of plate region 152, a surface depletion region 176, and undepleted n-type material 178 of body region 150. An inversion layer 180, here consisting of holes, is formed along upper semiconductor surface 156 below gate dielectric layer 160 and gate electrode 162 to meet p-n junction 152. Voltages $V_G$, $V_P$, and $V_B$ are respectively applied to electrodes 162, 164, and 166 in the p-channel varactor of FIG. 10 to establish gate-to-body voltage $V_{GB}$ and plate-to-body voltage $V_R$ according to Eqs. 10 and 11 just as voltages $V_G$, $V_P$, and $V_B$ are applied to electrodes 142, 144, and 146 in the n-channel varactor of FIG. 8.

Components 150, 152, 154, 160, 162, 164, 166, 168, 170, 172, 174, 176, and 178 in the p-channel varactor of FIG. 10 are respectively configured the same as components 100, 102, 104, 110, 112, 114, 116, 118, 120, 122, 124, 126, and 128 in the n-channel varactor of FIG. 8. Likewise, inversion layer 180 forms at the same relative location in the varactor of FIG. 10 as does inversion layer 130 in the varactor of FIG. 8.

The varactor of FIG. 10 has a gate region 181 consisting of gate electrode 162 and the underlying dielectric/semiconductor material situated laterally to the side of plate region 152. Gate region 181 is laterally divided into a group of gate portions which, as referenced to a suitable given (constant) value of plate-to-body voltage $V_R$, have different respective gate-to-body threshold voltages $V_T$, all of which are negative. As in FIG. 8, the boundaries between adjoining gate portions in the varactor of FIG. 10 are indicated by vertical dashed lines in FIG. 10.

The gate portions in the varactor of FIG. 10 are, in accordance with the invention, laterally arranged so that each gate portion meets plate region 152 or/and is continuous with another gate portion whose gate to body threshold voltage $V_T$, at the $V_R$ reference value, is greater than, but of lesser magnitude than, gate-to-body threshold voltage $V_T$ of that gate portion, again at the $V_R$ reference value. Each gate portion thus either meets plate region 152 or is physically coupled to region 152 through one or more other gate portions whose gate-to-body threshold voltages $V_T$ are of lower magnitude than gate-to-body threshold voltage $V_T$ of that gate portion at the reference $V_R$ value. The reference value of voltage $V_R$ is again typically zero. Accordingly, each gate portion either meets plate region 152 or is continuous with another gate portion whose zero-point gate-to-body threshold voltage $V_{T0}$ is of lesser magnitude than zero-point threshold voltage $V_{T0}$ of that gate portion.

FIG. 10 presents an example in which gate region 181 is divided into three gate portions 181A, 181B, and 181C. As with the varactor of FIG. 8, gate region 181 can consist of as little as two gate portions or more than three gate portions. The gate portions of region 181 in the present p-channel varactor can be variously arranged in the same manner as described above for gate region 131 in the n-channel varactor of the invention. In all of the situations involving the present p-channel varactor, gate portion 181A meets plate region 152 and has a zero-point gate-to-body threshold voltage $V_{T0}$ whose magnitude is lowest of all the gate portions.

Inversion layer 180 in the varactor of FIG. 10 is similarly divided into multiple variably appearing inversion portions that respectively occur along the upper surfaces of the gate portions dependent on the values of voltages $V_R$ and $V_{GB}$. Each inversion portion is characterized by the zero-point gate-to-body threshold voltage $V_{T0}$ of the corresponding gate portion. Accordingly, each inversion portion meets plate region 152 or/and is continuous with another inversion portion whose threshold voltage $V_{T0}$ is of lower magnitude than threshold voltage $V_{T0}$ of that inversion portion. Each inversion portion thereby either meets plate region 152 or is electrically coupled to region 152 through one or more other simultaneously appearing inversion portions of lower-magnitude threshold voltage $V_{T0}$ than that inversion portion.

With three gate portions 181A–181C being present in the example of FIG. 10, inversion layer 180 in the varactor of FIG. 10 consists specifically of three variably appearing inversion portions 180A, 180, and 180C that respectively appear/disappear along the upper surfaces of gate portions 181A–181C. Each gate portion includes a corresponding portion of surface depletion region 176 in the varactor of FIG. 10. Hence, gate portions 181A–181C respectively have upper surface depletion portions 176A, 176B, and 176C which together form surface depletion region 176.

The operational stages of FIGS. 10a–10d respectively correspond to the operational stages of FIGS. 8a–8d. Subject to the voltage polarities being respectively reversed in the varactor of FIG. 10 compared to the varactor of FIG. 8 and subject to the voltage changes occurring respectively in the opposite directions in the varactor of FIG. 10 than in the varactor of FIG. 8, the p-channel varactor of FIG. 10 functions in the same way, benefits from gate enhancement in the same way, and is employed in the same way as the n-channel varactor of FIG. 8. Eqs. 12–23 thus apply directly to the p-channel varactor of FIG. 10.

Figure 11A:
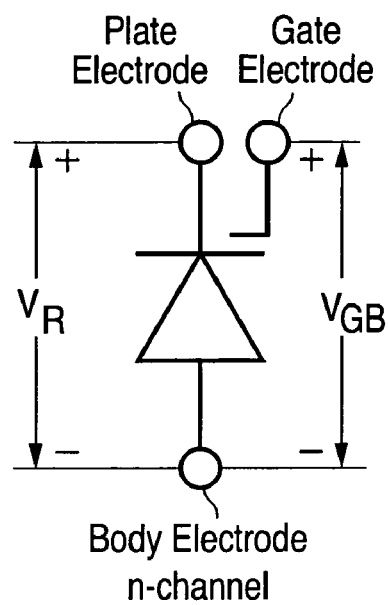
FIGS. 11a and 11b are diagrams of graphical symbols representing the n-channel and p-channel gate-enhanced junction varactors of the invention.
Figure 11B:
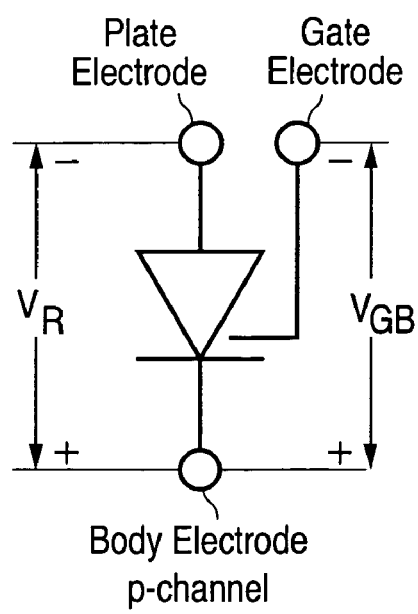

FIGS. 11a and 11b illustrate electronic symbols suitable for respectively representing the n-channel and p-channel gate-enhanced junction varactors of the invention. The plus and minus signs in FIGS. 11a and 11b indicate the voltage polarities utilized during all, or nearly all, of the operation of the present n-channel and p-channel junction varactors.

Transition and Threshold Voltages

The inversion layer in the gate-enhanced junction varactor of my prior U.S. patent application Ser. No. 09/903,059, cited above, disappears at largely a single value $V_X$ of plate-to-body voltage $V_R$ for a suitable given value of gate-to-body voltage $V_{GB}$. A relationship for transition voltage $V_X$ of the n-channel gate-enhanced junction varactor in U.S. application Ser. No. 09/903,059, the contents of which are incorporated by reference herein, is derived there as a function of gate-to-body voltage $V_{GB}$.

The relationship derived in U.S. application Ser. No. 09/903,059 for transition voltage $V_X$ provides good approximations to the values $V_X$ of plate-to-body voltage $V_R$ at which each of variably appearing portions of inversion layer 130 disappears here subject to the assumption that net dopant concentration $N_B$ of the body material that forms surface depletion region 126 and body-side portion 120 of junction depletion region 118 is uniform (constant). This relationship is repeated below:

$$V_X = V_{GB} - V_{FB} + \frac{K_{SC}\varepsilon_0 q N_B}{C_{GDA}^2} - \qquad (24)$$

$$2\Phi_{Fp} - \sqrt{\frac{2K_{SC}\varepsilon_0(V_{GB} - V_{FB})}{C_{GDA}^2} + \left(\frac{K_{SC}\varepsilon_0 q N_B}{C_{GDA}^2}\right)^2}$$

where $V_{FB}$ is the flat-band voltage, $K_{SC}$ is the permittivity constant of the semiconductor material (typically silicon), $\varepsilon_0$ (again) is the permittivity of free space, q (again) is the electronic charge, $C_{GDA}$ is the areal capacitance of gate dielectric layer 110, and $\Phi_{Fp}$ is the Fermi potential of the pertinent semiconductor material that forms surface depletion region 126.

The derivation of Eq. 24 was performed under the general simplifying assumptions employed in Grove, Physics and Technology of Semiconductor Devices (John Wiley & Sons), 1967, and did not include quantum-mechanical threshold-voltage corrections typically associated with values of gate dielectric thickness $t_{GD}$ less than 10 nm. The derivation of Eq. 24 was done for a stripe-type (rectangular) geometry rather than an annular or other three-dimensional geometry. That is, device characteristics were assumed to vary in two directions (or dimensions), namely, the vertical direction and one of the remaining two orthogonal directions, but not in the other of the remaining two orthogonal directions. The results of the derivation are qualitatively applicable to an annular geometry and are quantitatively applicable to an annular geometry for situations in which the radii of curvature in the annular geometry are much greater than the gate-dielectric and depletion-region thicknesses involved in the electric-field determinations.

Fermi potential $\Phi_{Fp}$ of the p-type semiconductor material that forms surface depletion region 126 is determined from:

$$\Phi_{Fp} = \left(\frac{kT}{q}\right)\ln\left(\frac{N_B}{n_i}\right) \qquad (25)$$

where k is Boltzmann's constant, T is the temperature, and $n_i$ is the intrinsic carrier concentration. With appropriate reversals in voltage polarities, Eqs. 24 and 25 apply to the p-channel gate-enhanced junction varactor of the present invention. In applying Eqs. 24 and 25 to the present n-channel and p-channel varactors, parameters $V_{FB}$, $C_{GDA}$, and $\Phi_{Fp}$ apply to each gate portion rather than the entire gate region.

Inasmuch as Eqs. 24 and 25 were derived under the assumption that dopant concentration $N_B$ of surface depletion region 126 and body-side portion 120 of junction depletion region 118 is uniform, Eqs. 24 and 25 do not specifically apply to the situation in which concentration $N_B$ varies from one portion of surface depletion region 126 or 176 to another portion. Nonetheless, Eqs. 24 and 25 can be employed to provide useful approximations for transition voltages $V_X$ in such situations subject to the simplifying assumption that the resistance of the inverted semiconductor material, if any, between plate region 102 or 152 and each portion of inversion layer 130 or 180 is zero.

Zero-point threshold voltage $V_{T0}$, the value of gate-to-body voltage $V_{GB}$ at which each portion of inversion layer 130 or 180 appears/disappears in each gate portion at zero plate-to-body voltage $V_R$, is given generally as follows:

$$V_{T0} = V_{FB} + \Phi_{s,inv} \pm \frac{qN_B t_{dsmax}}{C_{GDA}} \quad (26)$$

where $\Phi_{s,inv}$ is the electrical potential along upper semiconductor surface 106 or 156 in that gate portion, and $t_{dsmax}$ is the maximum value of thickness $t_{ds}$ of the portion of surface depletion region 126 or 176 in that gate portion. Just as parameters $\Phi_{s,inv}$ and $t_{dsmax}$ apply to the gate portion containing the inversion portion characterized by threshold voltage $V_{T0}$ determined from Eq. 26, parameters $V_{FB}$, $N_B$, and $C_{GDA}$ apply to that gate portion.

Flat-band voltage $V_{FB}$ for a gate portion is determined from:

$$V_{FB} = \Phi_M - \Phi_{SC} \quad (27)$$

where $\Phi_M$ is the work function of the portion of gate electrode 112 or 162 in that gate portion, and $\Phi_{SC}$ is the work function of the monocrystalline semiconductor material in the portion of surface depletion region 126 or 176 in that gate portion. Monocrystalline semiconductor work function $\Phi_{SC}$ for the gate portion is given as:

$$\Phi_{SC} = \pm \left(\frac{kT}{q}\right)\ln\left(\frac{N_B}{n_i}\right) \quad (28)$$

where the upper (plus) sign applies when the semiconductor material of the surface depletion portion is of p-type conductivity and the lower (minus) sign applies when the semiconductor material of the surface depletion portion is of n-type conductivity.

With respect to gate electrode work function $\Phi_M$, gate electrode 112 or 162 can consist solely of metal but typically includes doped semiconductor material, normally non-monocrystalline semiconductor material such as polycrystalline semiconductor material, situated directly on gate dielectric layer 110 or 160. For instance, see FIGS. 9a and 9b. The semiconductor material of gate electrode 112 or 162 is often of opposite conductivity type to body region 100 or 150 but can be of the same conductivity type as region 100 or 150. As discussed below, gate electrode 112 or 162 contains semiconductor material of both conductivity types (n-type and p-type) in some embodiments of the present varactor. For cases in which electrode 112 or 162 contains doped polycrystalline semiconductor material, typically polysilicon, situated on dielectric layer 110 or 160, gate electrode work function $\Phi_M$ for a gate portion is given generally as:

$$\Phi_M = \pm \left(\frac{kT}{q}\right)\ln\left(\frac{N_{POLY}}{n_i}\right) \quad (29)$$

where $N_{POLY}$ is the net dopant concentration of the polycrystalline semiconductor material in the portion of electrode 112 or 162 in that gate portion. In Eq. 29, the upper sign (again plus) applies when the polycrystalline semiconductor material is of p-type conductivity while the lower sign (again minus) applies when the polycrystalline semiconductor material is of n-type conductivity.

Eq. 29 also applies to embodiments of the present varactor in which gate electrode 112 or 162 contains doped semiconductor material other than polycrystalline semiconductor material situated on gate dielectric layer 110 or 160. In that case, $N_{POLY}$ means the net dopant concentration of that semiconductor material. Should gate electrode 112 or 162 consist of metal situated on dielectric layer 110 or 160, gate electrode work function $\Phi_M$ is simply the work function of that metal.

Surface inversion potential $\Phi_{s,inv}$ for a gate portion is determined from:

$$\Phi_{s,inv} = \pm 2\Phi_{Fp} = \pm 2\left(\frac{kT}{q}\right)\ln\left(\frac{N_B}{n_i}\right) \quad (30)$$

using Eq. 25 to provide Fermi potential $\Phi_{Fp}$ for p-type semiconductor material. In Eq. 30, the upper sign (once again plus) applies when the semiconductor material in the surface depletion portion of that gate portion is of p-type conductivity while the lower sign (once again minus) applies when the semiconductor material in that gate portion's surface depletion portion is of n-type conductivity.

Maximum surface depletion thickness $t_{dsmax}$ for a gate portion and gate dielectric areal capacitance $C_{GDA}$ for a gate portion are respectively given as:

$$t_{dsmax} = \sqrt{\frac{2K_{SC}\varepsilon_0 |\Phi_{s,inv}|}{qN_B}} \quad (31)$$

$$C_{GDA} = \frac{K_{GD}\varepsilon_0 |\Phi_{s,inv}|}{t_{GD}} \quad (32)$$

where $K_{GD}$ is the permittivity constant of the portion of gate dielectric layer 110 or 160 in that gate portion, and $t_{GD}$ is the average thickness of that gate dielectric portion.

Combining Eqs. 26–32 yields the following relationship for zero-point gate-to-body threshold voltage $V_{T0}$ for a gate portion and thus for its portion of inversion layer 130 or 180:

$$V_{T0} = \pm\left(\frac{kT}{q}\right)\ln\left(\frac{N_{POLY}}{n_i}\right) \pm \left(\frac{kT}{q}\right)\ln\left(\frac{N_B}{n_i}\right) \pm \frac{2t_{GD}}{K_{GD}}\sqrt{\frac{K_{SC}N_B kT}{\varepsilon_0}\ln\left(\frac{N_B}{n_i}\right)} \quad (33)$$

where the upper signs (all pluses) apply when the pertinent semiconductor in the gate portion is of p-type conductivity, and the lower signs (all minuses) apply when the pertinent semiconductor material in the gate portion is of n-type conductivity. The pertinent semiconductor material for the first ($N_{POLY}$) term in Eq. 33 is the polycrystalline semiconductor material in the portion of gate electrode 112 or 162 in that gate portion. The pertinent semiconductor material for the second ($N_B$) and third (also $N_B$) terms in Eq. 33 is the monocrystalline semiconductor material in the surface depletion portion of that gate portion. Examination of Eq. 33 indicates that threshold voltage $V_{T0}$ for a gate portion can be adjusted by adjusting its gate dielectric thickness $t_{GD}$, net dopant concentration $N_B$ in the surface depletion portion of that gate portion, the conductivity types of the polycrystalline semiconductor material in the portion of gate electrode 112 or 162 in that gate portion, and net dopant concentration $N_{POLY}$ of the polycrystalline semiconductor material in the portion of electrode 112 or 162 in that gate portion.

While each portion of inversion layer 130 or 180 may be described as appearing/disappearing when gate-to-body voltage $V_{GB}$ passes through corresponding threshold value $V_{T0}$ at zero plate-to-body voltage $V_R$, each inversion portion actually normally appears/disappears over a short $V_{GB}$ range that includes corresponding threshold value $V_{T0}$ and may, for example, be roughly centered on the corresponding $V_{T0}$ value. In particular, each inversion portion grows/shrinks laterally and vertically as voltage $V_{GB}$ passes through a short $V_{GB}$ range that includes the corresponding $V_{T0}$ value. Each inversion portion just becomes substantially fully present at a $V_{GB}$ value whose magnitude is slightly greater than the magnitude of the corresponding $V_{T0}$ value. Each inversion portion just disappears at a $V_{GB}$ value whose magnitude is slightly less than magnitude of the corresponding $V_{T0}$ value. Any statement that an inversion portion appears/disappears at a threshold value of voltage $V_{GB}$ is thus to be interpreted as meaning that the inversion portion largely appears/disappears at that threshold value, i.e., the inversion portion appears/disappears over a short $V_{GB}$ range which includes the threshold value.

Figure 24:
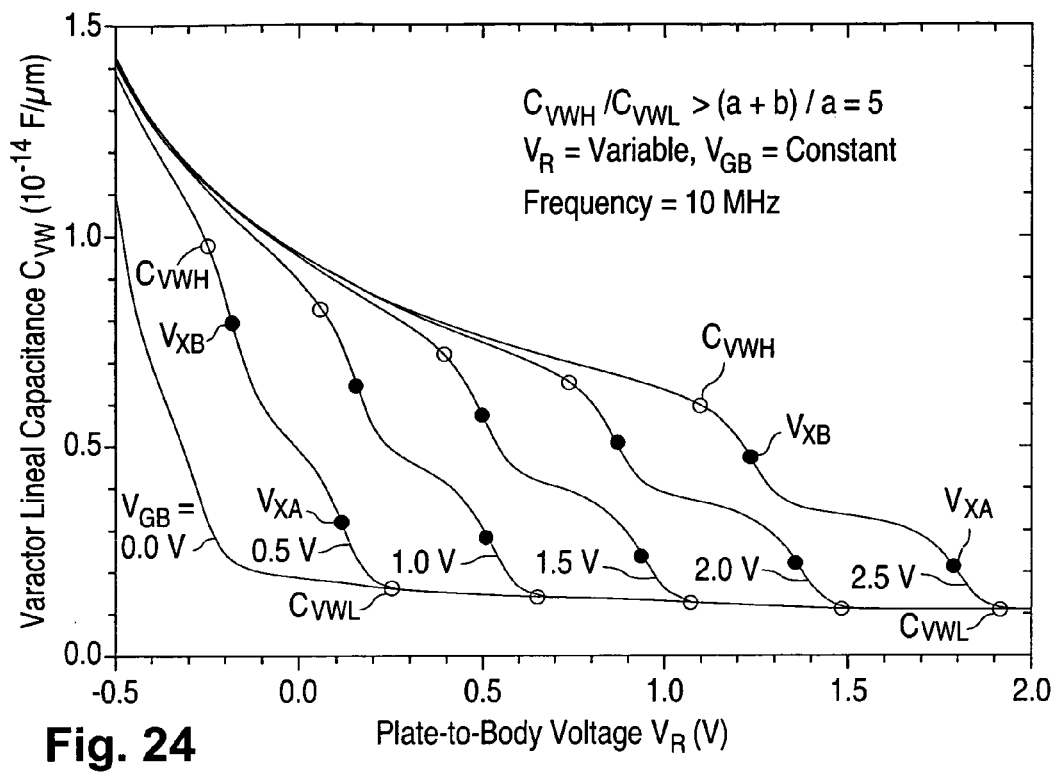
FIG. 24 is a graph of varactor width-wise lineal capacitance as a function of plate-to-body voltage for the computer-simulated varactor of FIG. 22 at various constant values of gate-to-body voltage.
Figure 28:
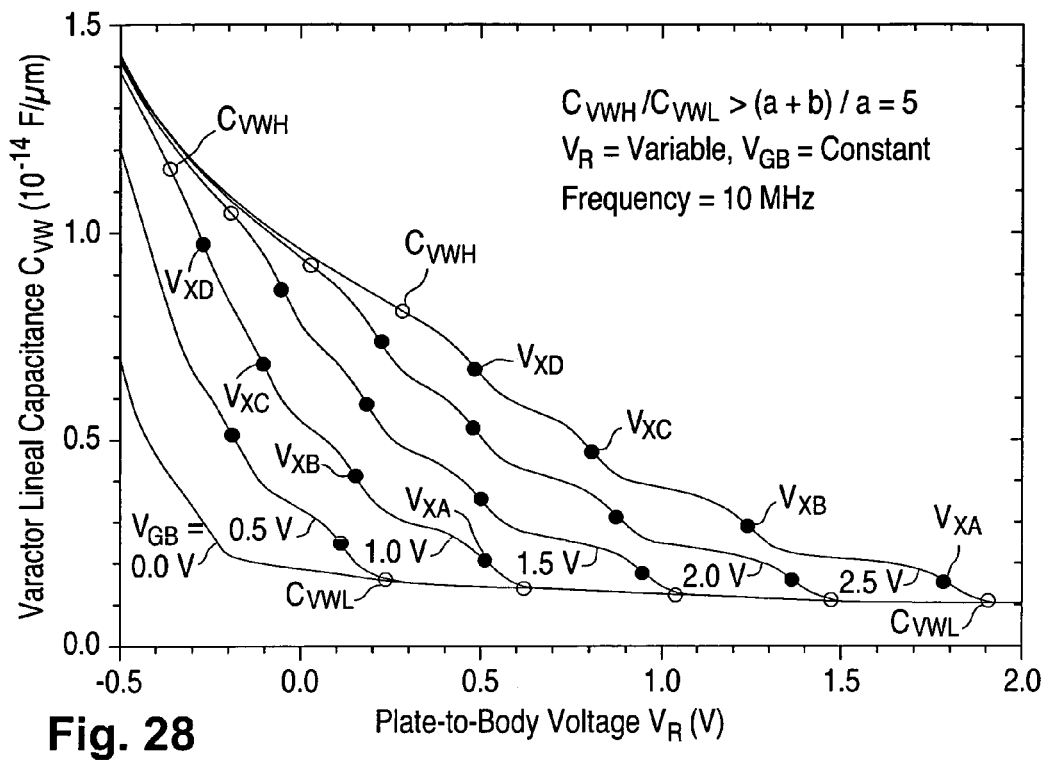
FIG. 28 is a graph of varactor width-wise lineal capacitance as a function of plate-to-body voltage for the computer-simulated varactor of FIG. 26 at various constant values of gate-to-body voltage.
Figure 31:
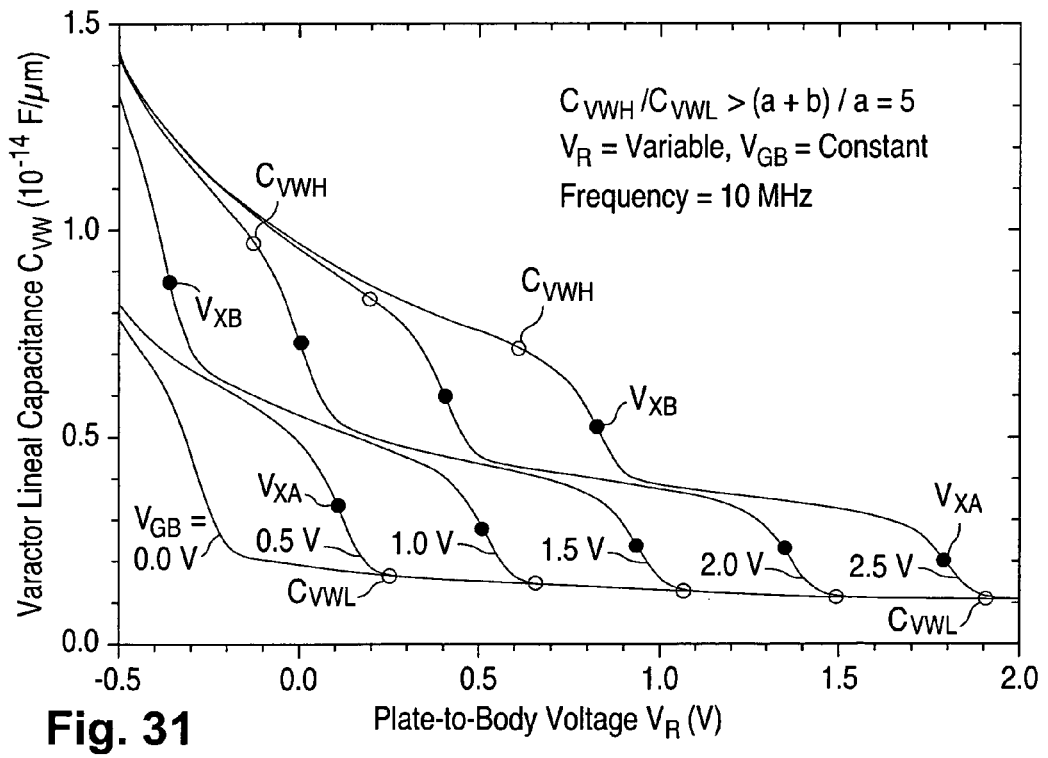
FIG. 31 is a graph of varactor width-wise lineal capacitance as a function of plate-to-body voltage for the computer-simulated varactor of FIG. 29 at various constant values of gate-to-body voltage.

Similar comments apply to transition values $V_X$ of plate-to-body voltage $V_R$. Any statement that a portion of inversion layer 130 or 180 disappears (or appears) when voltage $V_R$ is at one of the corresponding $V_X$ values at a given value of gate-to-body voltage $V_{GB}$ is to be interpreted as meaning that the inversion portion largely disappears (or appears) at that $V_X$ value, i.e., the inversion portion disappears (or appears) over a short $V_R$ range which includes that $V_X$ value. This phenomena is illustrated in FIGS. 24, 28, and 31 (discussed further below) which show how the varactor (lineal) capacitance in implementations of the present varactor undergoes a sharp change in value as voltage $V_R$ passes through a short range that includes each transition value $V_X$ at constant gate-to-body voltage $V_{GB}$.

Varactor Implementations

FIGS. 12–21 illustrate implementations, or variations, of the n-channel varactor of FIG. 8 in which portions of gate region 131 are provided with different zero-point gate-to-body threshold voltages $V_{T0}$ in accordance with the invention by (a) variously dividing gate dielectric layer 110 into multiple portions of different thicknesses, (b) providing portions of surface depletion region 126 with different values of average net dopant concentration $N_B$, or/and (c) constituting gate electrode 112 as upper metallic layer 112U and lower layer 112L consisting of doped polycrystalline semiconductor material divided laterally into portions of both (n-type and p-type) conductivity types. Alternatively or additionally, polycrystalline semiconductor material of one conductivity type in lower gate electrode layer can be laterally divided into multiple portions having different values of average net dopant concentration $N_{POLY}$.

Figure 12:
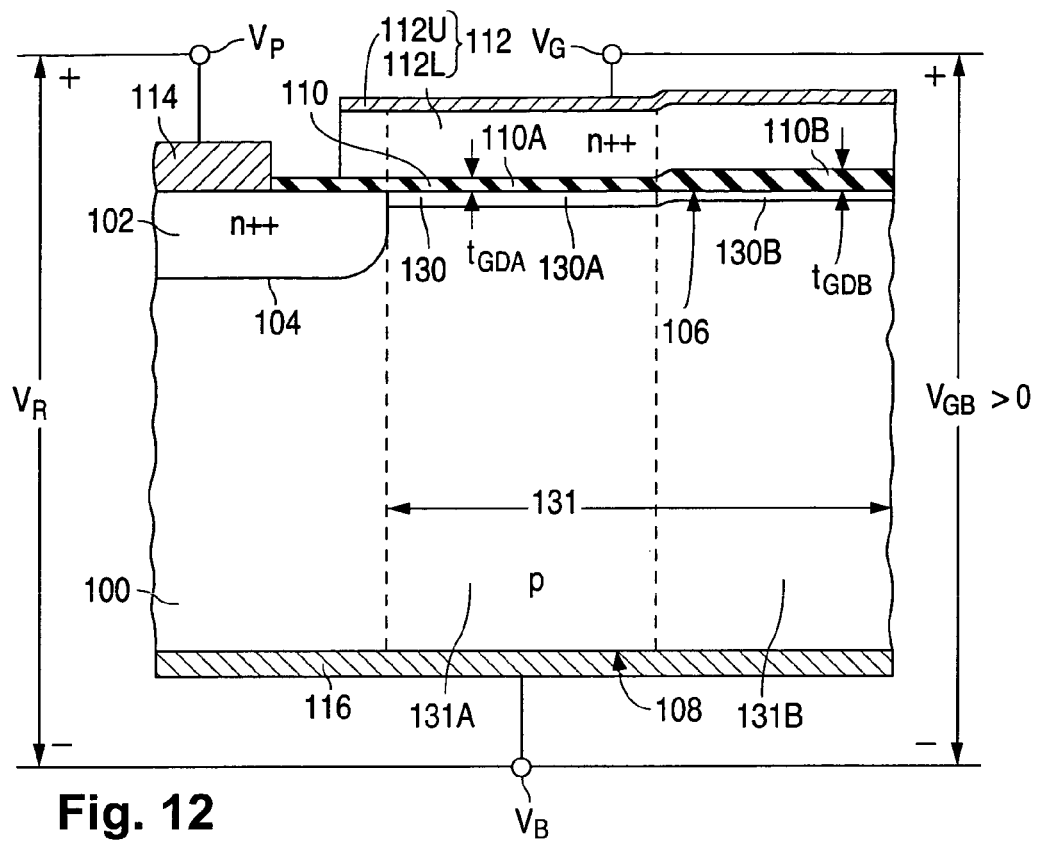

FIG. 12 depicts an implementation in which gate dielectric layer 110 is divided into two portions 110A and 110B of different respective thicknesses $t_{GDA}$ and $t_{GDB}$. Gate dielectric portions 110A and 110B respectively constitute parts of gate portions 131A and 131B and are respectively situated above at least the locations for portions 130A and 130B of inversion layer 130. Gate portion 131C is not present in the varactor of FIG. 12.

Thickness $t_{GDB}$ of gate dielectric portion 110B is greater than thickness $t_{GDA}$ of gate dielectric portion 110A. Per Eq. 33, zero-point gate-to-body threshold voltage $V_{T0}$ increases as thickness $t_{GD}$ increases in the n-channel case where the semiconductor material of surface depletion region 126 is p-type. Since gate portion 131B is of greater threshold voltage $V_{T0}$ than gate portion 131A, portions 131A and 131B of gate region 131 progressively increase in threshold voltage $V_{T0}$ as gate dielectric portions 110A and 110B of respective gate portions 131A and 131B progressively increase in thickness. Hence, portions 130A and 130B of inversion layer 130 appear/disappear at progressively increasing values of threshold voltage $V_{T0}$ as gate dielectric portions 110A and 110B respectively associated with inversion portions 130A and 130B progressively increase in thickness.

The preceding threshold-voltage/thickness relationship extends, as indicated below in connection with the n-channel varactors of FIGS. 16 and 26, to implementations of the present n-channel varactor in which gate region 131 is divided into three or more portions, each having a gate dielectric portion of different thickness than the other gate dielectric portions. Subject to the voltage polarities being reversed, this relationship also applies to implementations of the present p-channel varactor in which gate region 181 is divided into two or more portions, each having a gate dielectric portion of different thickness than the other gate dielectric portions. Accordingly, the portions of gate region 131 or 181 progressively increase in the magnitude of threshold voltage $V_{T0}$ as the gate dielectric portions of the gate portions progressively increase in thickness, and vice versa. Likewise, the portions of inversion layer 130 or 180 appear/disappear at progressively increasing $V_{T0}$ magnitude as the gate dielectric portions respectively associated with the inversion portions progressively increase in thickness, and vice versa.

Gate dielectric portion 110A extends over part of plate region 102 in the varactor of FIG. 12 since gate electrode 112 extends over part of region 102. Inasmuch as gate dielectric portion 110B is thicker than gate dielectric portion 110A, dielectric portion 110B is continuous with a gate dielectric portion thinner than portion 110B. This relationship involving dielectric portions 110A and 110B can be also extended to the situation, n-channel or p-channel, in which gate dielectric layer 110 or 160 is divided into more than two portions of different thicknesses. For the general situation in which the gate dielectric portions have the threshold-voltage/thickness relationship given in the preceding paragraph, each gate dielectric portion extends to a location above plate region 102 or 152 or/and is continuous another gate dielectric portion thinner than that gate dielectric portion.

As particularly occurs in the general example of FIG. 8, FIG. 12 presents the example in which gate region 131A separates gate region 131B from plate region 102. In that case, gate dielectric portion 110A extends between gate dielectric portion 110B and a location above region 102 such that dielectric portion 110B is spaced laterally apart from region 102. Dielectric portion 110B which is part of gate portion 131B having the greatest value of zero-point gate-to-body threshold voltage $V_{T0}$ is thus, among dielectric portions 131A and 131B, the most distant from region 102.

When the semiconductor material of body region 100 is monosilicon, gate dielectric layer 110 normally consists of silicon oxide formed by thermal growth. In creating dielectric layer 110 as different-thickness portions 110A and 110B, the starting point is typically a monosilicon wafer having p-type body region 100 in which various n-type regions may be present and, if so, in which various p-type regions doped differently than the bulk of region 100 may also be present. A cleaning operation is performed along a surface, referred to as the upper surface, of the wafer to expose bare silicon along the wafer's upper surface.

A thermal oxidation is performed to grow a layer of silicon oxide along the wafer's upper surface. Using a suitable mask formed over the silicon oxide layer, silicon oxide is largely removed along the location intended for gate dielectric portion 110A which is intended to be thinner than gate dielectric portion 110B.

Another thermal oxidation is performed to grow further silicon oxide along the wafer's upper surface, including the location for gate dielectric portion 110A. The silicon oxide at the location for dielectric portion 110A forms portion 110A. During the second thermal oxidation, additional thermal oxide grows at the location for gate dielectric portion 110B. Although the thermal oxide that forms at the location for dielectric portion 110B in the second thermal oxidation is invariably of lesser thickness than dielectric portion 110A, the silicon oxide formed at the location for portion 110B during both thermal oxidations is thicker then portion 110A. The silicon oxide formed during both thermal oxidations at the location for dielectric portion 110B then constitutes portion 110B.

Figure 16:
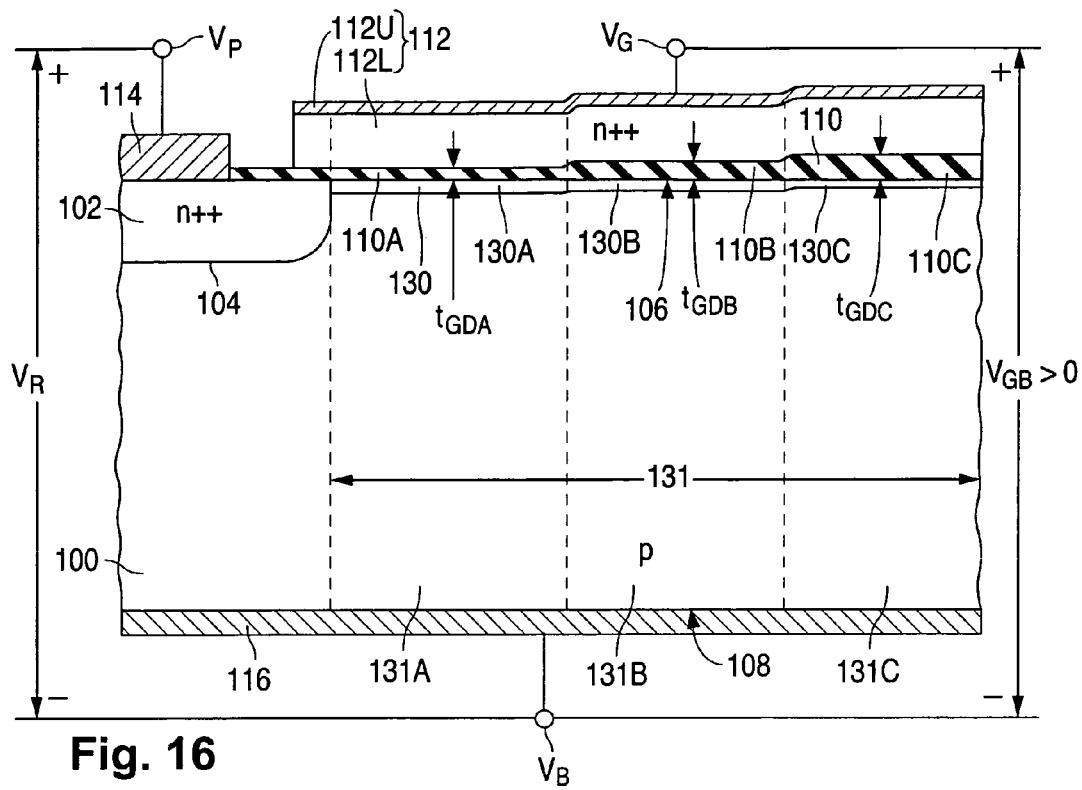

The foregoing procedure can be readily extended to forming gate dielectric layer 110 as portions of three or more different thicknesses for cases, such as the examples of FIGS. 16 and 26, in which gate region 131 consists of three or more portions, each having a gate dielectric portion of different thickness than the other gate dielectric portions. For instance, consider the situation in which dielectric layer 110 includes third dielectric portion 110C thicker than the second dielectric portion 110B which is thicker than first dielectric portion 110A. After cleaning the upper surface of the wafer, a first thermal oxidation is performed to grow a layer of silicon oxide along the wafer's upper surface. Using a suitable mask provided over the silicon oxide layer, silicon oxide is largely removed along the locations for dielectric portions 110A and 110B.

A second thermal oxidation is performed to grow further silicon oxide along the wafer's upper surface, including the locations for gate dielectric portions 110A and 110B. During the second thermal oxidation, additional silicon oxide is formed at the location for gate dielectric portion 110C so that the total silicon oxide thickness at the location for dielectric portion 110C is greater than the silicon oxide thickness at the locations for dielectric portions 110A and 110B. Using another suitable mask, silicon oxide is largely removed at the location for dielectric portion 110A.

A third thermal oxidation is performed to grow additional silicon oxide along the wafer's upper surface, including the location for gate dielectric portion 110A. The silicon oxide at the location for dielectric portion 110A forms portion 110A. During the third thermal oxidation, additional silicon oxide is formed at the locations for gate dielectric portions 110B and 110C. Since the silicon oxide at the location for dielectric portion 110C was of greater thickness than the silicon oxide at the location for dielectric portion 110B prior to the third thermal oxidation, the silicon oxide at the location for portion 110C is thicker than the silicon oxide at the location for portion 110B subsequent to the third thermal oxidation. The silicon oxide grown during the second and third thermal oxidations at the location for dielectric portion 110B is thicker than dielectric portion 110C and forms portion 110B. The silicon oxide grown during all three thermal oxidations at the location for dielectric portion 110C forms portion 110C.

Figure 13:
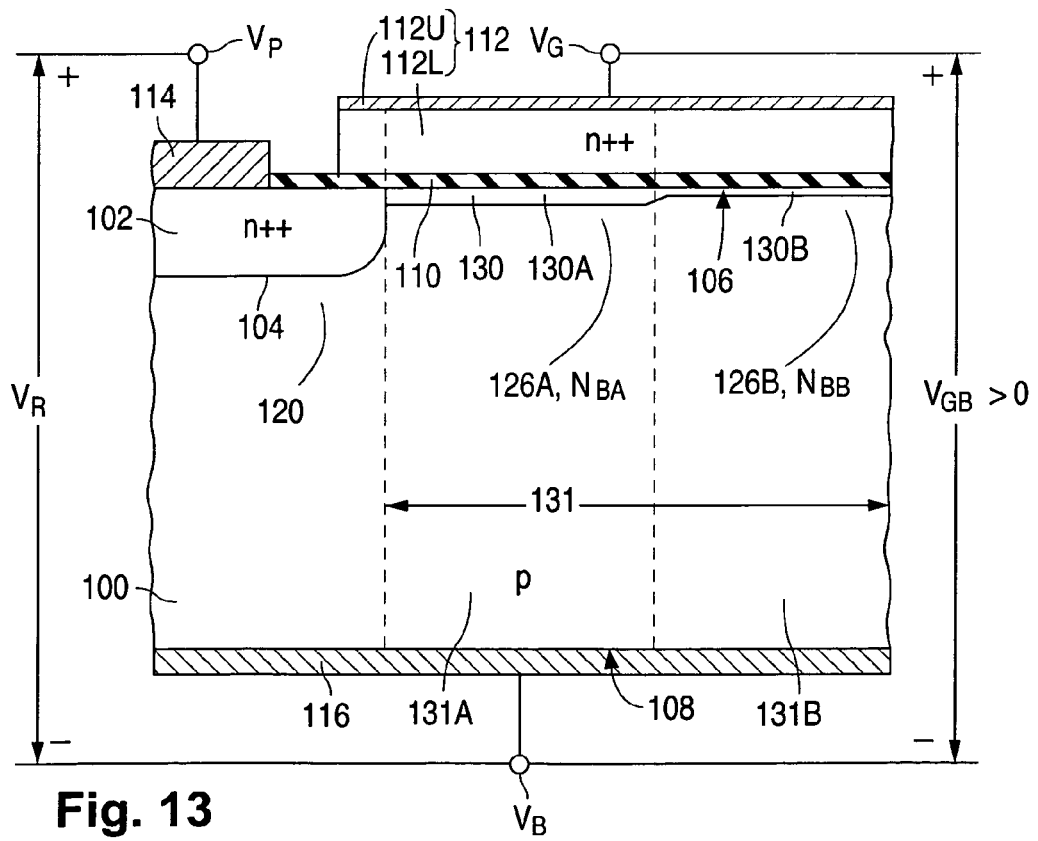

FIG. 13 illustrates an implementation in which portions 126A and 126B of surface depletion region 126, and thus portions 130A and 130B of inversion layer 130, are provided with different respective values $N_{BA}$ and $N_{BB}$ of average net dopant concentration $N_B$. Inasmuch as the thicknesses of surface depletion portions 126A and 126B vary with voltages $V_R$ and $V_{GB}$, the locations for portions 126A and 126B are only generally indicated in FIG. 13. Body-side junction depletion portion 120, also generally indicated in FIG. 13, is typically of roughly the same average net dopant concentration $N_{BA}$ as surface depletion portion 126A. Gate portion 131C is not present in the varactor of FIG. 13.

Dopant concentration $N_{BB}$ of surface depletion portion 126B is greater than dopant concentration NBA of surface depletion portion 126A in the varactor of FIG. 13. Per Eq. 33, zero-point gate-to-body threshold voltage $V_{T0}$ increases as dopant concentration $N_B$ increases in the n-channel case where the semiconductor material of surface depletion region 126 is p-type. Inasmuch as gate region 131B is of greater threshold voltage $V_{T0}$ than gate portion 131A, gate portions 131A and 131B progressively increase in threshold voltage $V_{T0}$ as depletion portions 126A and 126B of respective gate portions 131A and 131B progressively increase in dopant concentration $N_B$. Consequently, portions 130A and 130B of inversion layer 130 appear/disappear at progressively increasing values of threshold voltage $V_{T0}$ as depletion portions 126A and 126B respectively associated with inversion portions 130A and 130B progressively increase in dopant concentration $N_B$.

The preceding threshold-voltage/dopant-concentration relationship extends, as indicated below in connection with the n-channel varactor of FIG. 17, to implementations of the present n-channel varactor in which gate region 131 is divided into three or more portions, each having a surface depletion portion of different average dopant concentration $N_B$ than the other surface depletion portions. Subject to the voltage polarities being reversed, this relationship also applies to implementations of the present p-channel varactor in which gate region 181 is divided into two or more portions, each having a surface inversion portion of different dopant concentration $N_B$ than the other surface depletion portions. Accordingly, the portions of gate region 131 or 181 progressively increase in the magnitude of threshold voltage $V_{T0}$ as the portions of surface depletion region 126 or 176 progressively increase in dopant concentration $N_B$, and vice versa. Likewise, the portions of inversion layer 130 or 180 appear/disappear at progressively increasing $V_{T0}$ magnitude as the surface depletion portions respectively associated with the inversion portions progressively increase in concentration $N_B$, and vice versa.

Surface depletion portion 126A meets plate region 102 in the varactor of FIG. 13. Since surface depletion portion 126B is of greater dopant concentration $N_B$ than depletion portion 126A, depletion portion 126B is continuous with a surface depletion portion more lightly doped than portion 126B. This relationship involving depletion portions 126A and can be extended to situations in which surface depletion region 126 or 176 is divided into more than two portions having different $N_B$ values. For the general situation in which the surface depletion portions have the threshold-voltage/dopant-concentration relationship described in the previous paragraph, each surface depletion portion meets plate region 102 or 152 or/and is continuous with another surface depletion portion more lightly doped than that surface depletion portion.

Gate portion 131A separates gate portion 131B from plate region 102 in the example of FIG. 13. Surface depletion portion 126A then extends between surface depletion portion 126B and plate region 102 such that depletion portion 126B is spaced laterally apart from region 102. Depletion portion 126B, which is part of gate region 131B having the greatest zero-point gate-to-body threshold voltage $V_{T0}$ is thus, among depletion portions 126A and 126B, the most distant from region 102.

Surface depletion portions 126A and 126B are typically provided with different values of dopant concentration $N_B$ by selectively introducing appropriate semiconductor dopant through the upper semiconductor surface (106) and into gate portions 131A and 131B, including the locations for depletion portions 126A and 126B, during varactor fabrication. One or more masks are employed to prevent dopant from entering certain parts of body region 100. The dopant introduction is typically done by ion implantation in combination with suitable annealing to activate the implanted dopant and repair lattice damage. For instance, depletion portion 126B can be provided with greater dopant concentration $N_B$ than depletion portion 126A by ion implanting p-type dopant into the location for portion 126B using a mask to prevent the p-type dopant from entering the locations for depletion portion 126A and plate region 102. One or more further doping operations of this sort can be utilized to create gate region 131 in such a way that surface depletion region 126 consists of three or more portions of different $N_B$ values.

FIG. 14 depicts an implementation in which lower layer 112L of gate electrode 112 consists of doped polycrystalline semiconductor material, typically polysilicon, divided laterally into two portions 112LA and 112LB of opposite conductivity types. Gate electrode portion 112LA is very heavily doped n-type. Gate electrode portion 112LB is very heavily doped p-type. Electrode portions 112LA and 112LB respectively constitute parts of gate portions 131A and 131B and are respectively situated above at least the locations for portions 130A and 130B of inversion layer 130. Electrode portion 112LA extends over part of plate region 102. Gate region 131C is not present in the varactor of FIG. 14.

Gate electrode portions 112LA and 112LB meet to form a p-n junction 190. Upper layer 112U of gate electrode 112 contacts both of electrode portions 112LA and 112LB. Consequently, upper gate electrode layer 112U electrically shorts p-n junction 190 so that electrode portions 112LA and 112LB are at substantially the same electrical potential regardless of how gate voltage $V_G$ is applied to gate electrode 112.

Referring to Eq. 33, the second term in the equation is the same for both gate portions 131A and 131B in the varactor of FIG. 14. The same applies to the third term in Eq. 33. Let $V_{23}$ represent the sum of the second and third terms in Eq. 33. Using Eq. 33, gate portions 131A and 131B have respective zero-point gate-to-body threshold voltages $V_{T0n}$ and $V_{T0p}$ given as:

$$V_{T0n} = V_{23} - \left(\frac{kT}{q}\right)\ln\left(\frac{N_{POLYn}}{n_i}\right) \quad (34)$$

$$V_{T0p} = V_{23} + \left(\frac{kT}{q}\right)\ln\left(\frac{N_{POLYp}}{n_i}\right) \quad (35)$$

where $N_{POLYn}$ is the average net n-type dopant concentration in n++ gate electrode portion 112LA, and $N_{POLYp}$ is the average net p-type dopant concentration in p++ gate electrode portion 112LB.

Per Eqs. 34 and 35, zero-point gate-to-body threshold voltage $V_{T0P}$ of gate electrode portion 112LB is greater than zero-point gate-to-body threshold voltage $V_{T0n}$ of gate electrode portion 112LA. Arranging electrode portions 112LA and 112LB in the above-described manner thus enables gate portion 131B to be of higher threshold voltage $V_{T0}$ than gate portion 131A. The difference between threshold voltages $V_{T0p}$ and $V_{T0n}$ is typically in the vicinity of 0.75–0.95 V, typically 0.8–0.9 V. This voltage difference is sufficiently great that transition voltages $V_{XA}$ and $V_{XB}$ for portions 130A and 130B of inversion layer 130 are different enough to enable the varactor capacitance to change relatively gradually with plate-to-body voltage $V_R$ at constant gate-to-body voltage $V_{GB}$.

The principles embodied by the n-channel varactor of FIG. 14 apply to a p-channel varactor except that the voltage polarities and conductivity types are reversed. Hence, gate electrode 162 in the p-channel varactor of FIG. 10 may consist of upper metallic layer 162U and lower layer 162L formed with doped polycrystalline semiconductor material, typically polysilicon. In a p-channel varactor that employs the foregoing principles, lower gate electrode layer 162L is divided laterally into two portions 162LA and 162LB of opposite conductivity types. Gate electrode portion 162LA is very heavily doped p-type. Gate electrode portion 162LB is very heavily doped n-type. Electrode portions 162LA and 162LB respectively constitute parts of portions of 181A and 181B of gate region 181 and are respectively situated above at least locations for portions 180A and 180B of inversion layer 180. Electrode portion 162LA extends over part of plate region 152.

In looking at both the n-channel and p-channel cases, gate electrode portion 112LA or 162LA which extends partially over plate region 102 or 152 is of opposite conductivity type to body region 100 or 150. Gate electrode portion 112LB or 162LB is of the same conductivity type as region 100 or 150.

FIG. 14 presents the example in which gate portion 130A separates gate portion 130B from plate region 102. In that case, gate electrode portion 112LA extends between gate electrode portion 112LB and a location above plate region 102 such that electrode portion 112LB is spaced laterally apart from region 102. Alternatively, electrode portion 112LB can extend laterally over part of plate region 102.

Gate electrode portions 112LA and 112LB are typically created to be of opposite conductivity types by introducing suitable n-type semiconductor dopant into the portion of lower gate electrode layer 112L intended for electrode portion 112A using a mask to prevent the n-type dopant from significantly entering the portion of electrode layer 112L intended for electrode portion 112LB. Suitable p-type semiconductor dopant is likewise introduced into the portion of electrode layer 112L intended for electrode portion 112LB using another mask to prevent the p-type dopant from significantly entering the portion of layer 112L intended for electrode portion 112LA. The dopant-introduction steps are typically performed by ion implantation. In that case, suitable annealing is performed to activate the implanted dopants and repair lattice damage. Either of the dopant-introduction steps can generally be done first.

Rather than being of opposite conductivity types, gate electrode portions 112LA and 112LB can be of the same conductivity type, either p-type or n-type, but at different values of gate electrode dopant concentration $N_{POLY}$ in a variation of the varactor of FIG. 14. If electrode portions 112LA and 112LB are both n-type and thus of opposite conductivity type to body region 100, electrode portion 112LA is doped more heavily n-type than is electrode portion 112LB. Such a variation of the varactor of FIG. 14 is depicted in FIG 14.1 where net polysilicon dopant concentration $N_{POLYA}$ of n++ electrode portion 112LA exceeds net polysilicon dopant concentration $N_{POLYB}$ of n++ electrode portion 112LB. In accordance with Eq. 33, gate portion 131B meets the requirement of having a higher value of zero-point gate-to-body threshold voltage $V_{T0}$ than gate portion 131A.

The reverse dopant-concentration relationship arises if electrode portions 112LA and 112LB are both p-type and thus of the same conductivity type as body region 100. Per Eq. 33, electrode portion 112LA is doped more lightly p-type than is electrode portion 112LB. FIG. 14.2 illustrates such a further variation of the varactor of FIG. 14 for which polysilicon dopant concentration $N_{POLYA}$ of p++ electrode portion 112LA is less than polysilicon dopant concentration $N_{POLYB}$ of p++ electrode portion 112LB. Since p-n junction 190 is absent in the variations of FIGS. 14.1 and 14.2, upper metallic gate electrode layer 112U can be deleted in such variations.

Lower gate electrode layer 112L in the preceding variation of FIG. 14 may include one or more additional portions of the same conductivity type as gate electrode portions 112LA and 112LB but of different dopant concentration $N_{POLY}$. The principles applicable to this n-channel varactor also apply to a corresponding p-channel varactor except that the voltage polarities and conductivity types are reversed. If gate electrode layer 112L or 162L is divided into multiple portions of opposite conductivity type to body region 100 or 150 and of different $N_{POLY}$ values, each gate electrode portion extends over part of plate region 100 or 152 or/and is continuous with another such gate electrode portion more heavily doped than that gate electrode portion. If electrode layer 112L or 162L is divided into multiple portions of the same conductivity type as body region 100 or 150 and of different $N_{POLY}$ values, each gate electrode portion extends over part of plate region 102 or 152 or/and is continuous with another such gate electrode portion more lightly doped than that gate electrode portion.

Consider the situation for the preceding variations of the n-channel varactor of FIG. 8 in which gate portion 131A separates gate portion 131B from plate region 102. With portions 112LA and 112LB of gate electrode layer 112L both being of n-type conductivity and thus of opposite conductivity type to body region 100, electrode portion 112LA which is more heavily doped than electrode portion 112LB extends between electrode portion 112LB and a location above plate region 102 such that electrode portion 112LB is spaced laterally apart from region 102. The same occurs when electrode portions 112LA and 112LB are both of p-type conductivity and thus of the same conductivity type as body region 100 except that electrode portion 112LA is now more lightly doped than electrode portion 112LB.

The preceding techniques for causing portions of gate region 131 or 181 to be of different zero-point gate-to-body threshold voltages $V_{T0}$ can be combined in various ways.

Figure 15:
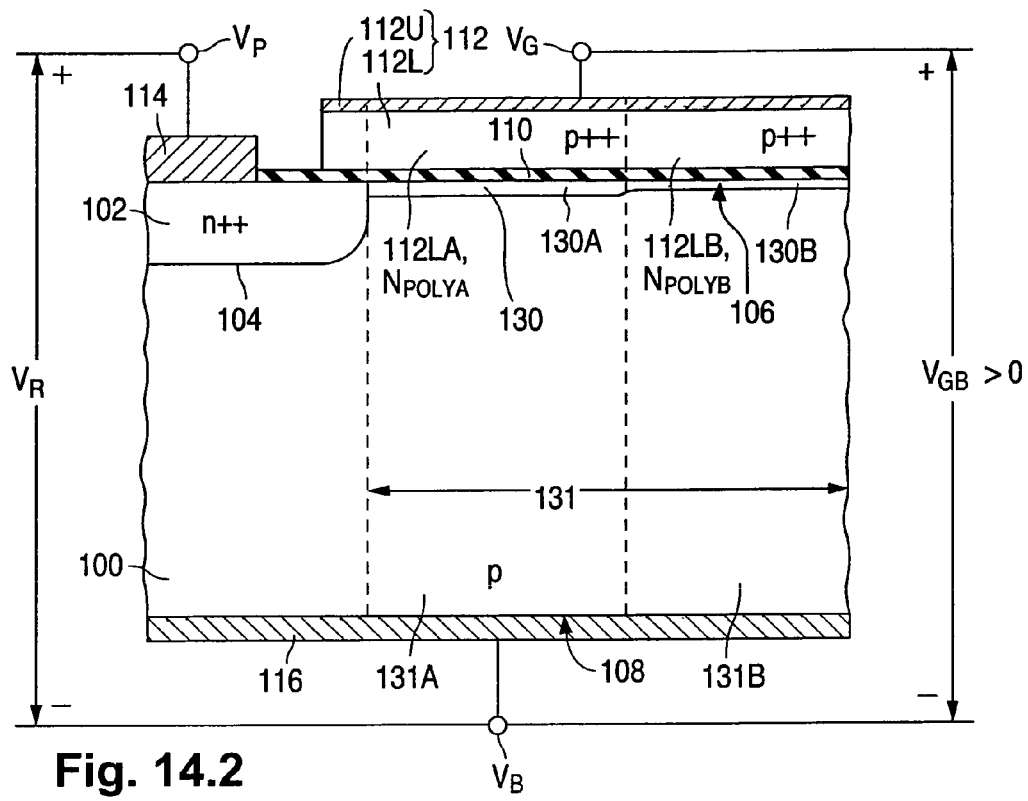
Figure 15:
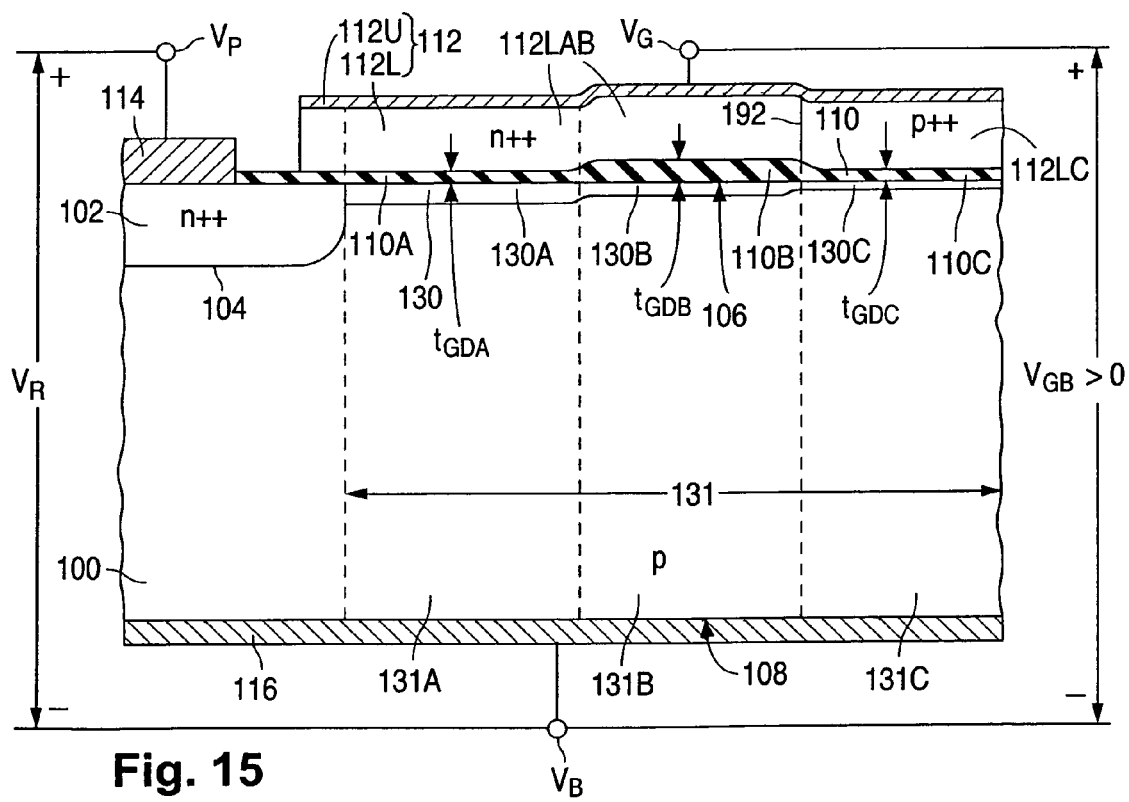

FIG. 15 illustrates an implementation in which division of gate dielectric layer 110 into multiple different-thickness portions is combined with implementing lower gate electrode layer 112L as portions of opposite conductivity type.

In the implementation of FIG. 15, lower gate electrode layer 112L consists of doped polycrystalline semiconductor material, again typically polysilicon, divided laterally into two oppositely doped portions 112LAB and 112LC that meet to form a p-n junction 192. Gate electrode portion 112LAB, which extends over part of plate region 102, is very heavily doped n-type and thus is of opposite conductivity type to body region 100. Gate electrode portion 112LC is very heavily doped p-type and is of the same conductivity type as region 100. Upper metallic gate electrode layer 112U contacts both electrode portions 112LAB and 112LC, thereby electrically shorting p-n junction 192.

Gate dielectric layer 110 is divided laterally into three portions 110A, 110B, and 100C having respective thicknesses $t_{GDA}$, $t_{GDB}$, and $t_{GDC}$ in the implementation of FIG. 15. Thickness $t_{GDB}$ of gate dielectric portion 110B is greater than thickness $t_{GDA}$ of gate dielectric portion 110A. Thickness $t_{GDC}$ of gate dielectric portion 110C can have various relationships to thicknesses $t_{GDA}$ and $t_{GDB}$. Dielectric portions 110A–110C respectively constitute parts of gate portions 131A–131C and are respectively situated above at least the locations for portions 130A–130C of inversion layer 130. Dielectric portion 110A extends over part of plate region 102.

Gate electrode portion 112LAB is situated on gate dielectric portions 110A and 110B. Consequently, one part of electrode portion 112LAB is in gate portion 131A while another part of electrode portion 112LAB is in gate portion 131B. Since thickness $t_{GDB}$ is greater than $t_{GDA}$, gate portion 131B is of higher zero-point gate-to-body threshold voltage $V_{T0}$ than gate portion 131A in accordance with Eq. 33. Gate electrode portion 112LC, which is situated on gate dielectric portion 110C, is part of gate portion 131C. By appropriately choosing the value of thickness $t_{GDC}$ relative to the values of thicknesses $t_{GDA}$ and $t_{GDB}$, gate portion 131C is of higher threshold voltage $V_{T0}$ than gate portion 131B.

Figure 5:
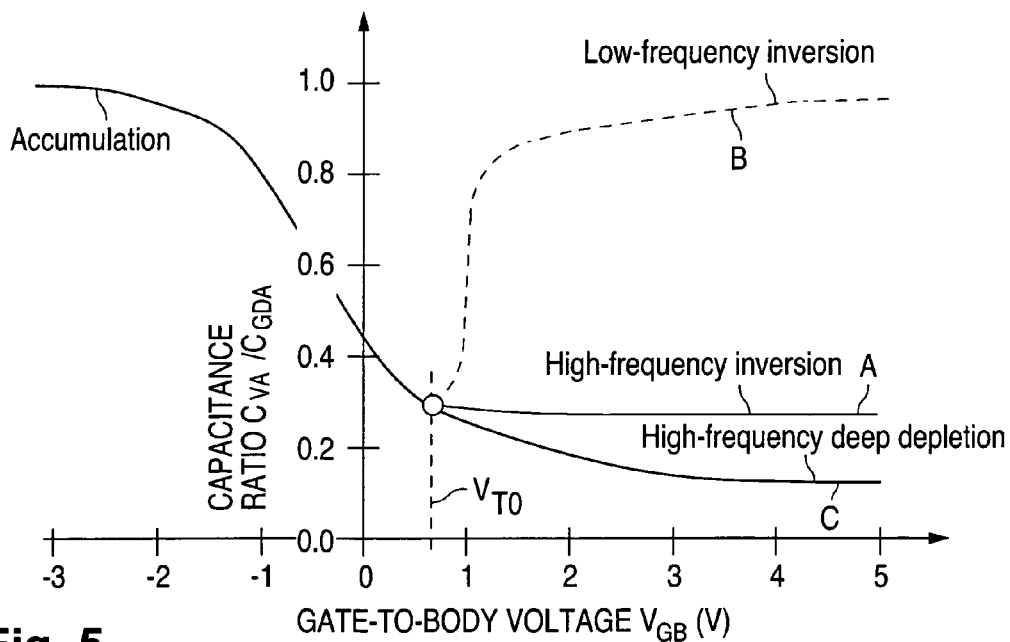
FIG. 5 is a graph of the ratio of varactor areal capacitance to gate-dielectric areal capacitance as a function of gate-to-body bias voltage for the varactors of FIGS. 4 and 6.
Figure 6:
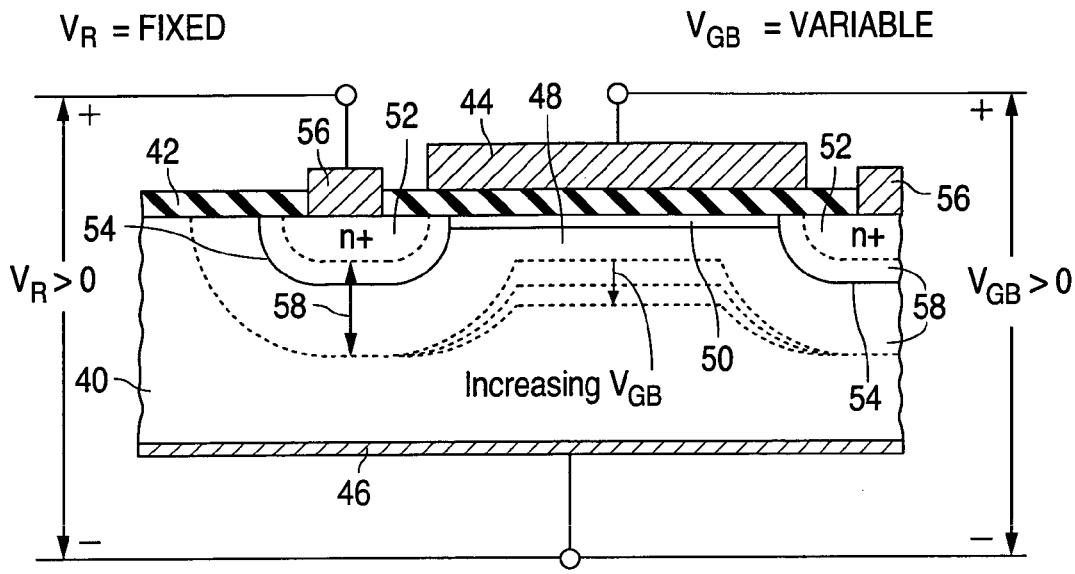
Figure 7:
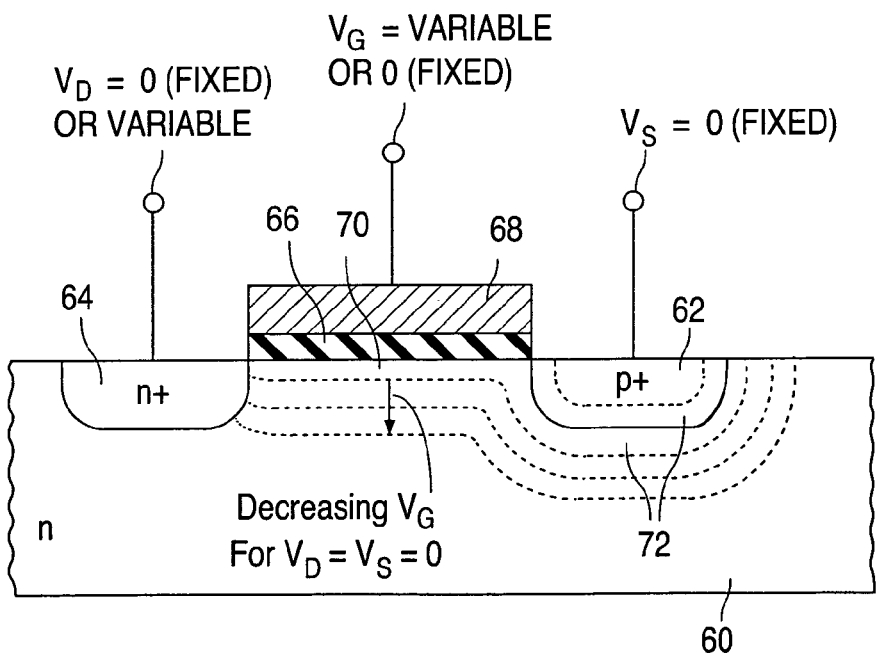

If gate dielectric portions 110B and 110C were of the same thickness, zero-point gate-to-body threshold voltage $V_{T0}$ of gate portion 131C would typically be 0.75–0.95 V greater than threshold voltage $V_{T0}$ of gate portion 131B in accordance with Eqs. 34 and 35. Thickness $t_{GDC}$ of dielectric portion 110C is less than thickness $t_{GDB}$ of dielectric portion 110B in the particular example of FIG. 5. Accordingly, threshold voltage $V_{T0}$ of gate portion 131C exceeds threshold voltage $V_{T0}$ of gate portion 131B in this example by an amount somewhat smaller than what would occur if dielectric portions 110C and 110B were equally thick.

As in FIG. 8, FIG. 15 presents the example in which gate portion 131A separates gate portion 131B from plate region 102 and in which gate portion 131B separates gate portion 131C from gate portion 131A. Hence, dielectric portion 110A extends between dielectric portion 10B and a location above plate region 102 such that dielectric portion 110B is spaced laterally apart from region 102. Also, dielectric portion 110B extends between dielectric portion 110C and dielectric portion 110A such that dielectric portion 110B is spaced further laterally apart from plate region 102 than is dielectric portion 110A.

FIG. 15 illustrates the situation in which dielectric portion 110C is of substantially the same thickness as dielectric portion 110A. Accordingly, gate dielectric layer 110 in the varactor of FIG. 15 can be formed according to the process described above for the varactor of FIG. 12 with dielectric portion 110C being formed according to the same steps as dielectric portion 10A. If dielectric portion 10C is of different thickness than dielectric portions 110A and 110B, dielectric layer 110 in the varactor of FIG. 15 can be formed according to the process described above in connection with FIG. 12 for creating dielectric layer 110 to have portions of three or more different thicknesses. Gate electrode portions 112LAB and 112LC are created according to the procedure described above for respectively creating gate portions 112LA and 112LB in the varactor of FIG. 14.

Zero-point gate-to-body threshold voltages $V_{T0A}$, $V_{T0B}$, and $V_{T0C}$ of respective gate portions 131A–131C in the varactor of FIG. 15 were calculated for the conditions that thicknesses $t_{GDA}$ and $t_{GDC}$ are both 4 nm, and thickness $t_{GDB}$ is 8 nm (and thus twice thickness $t_{GDA}$). The gate dielectric material was silicon oxide. Body region 100 consisted of monosilicon at an $N_B$ value of $7.6 \times 10^{17}$ atoms/cm$^3$. N++ gate electrode portion 112LAB consisted of polysilicon at a $N_{POLYn}$ value of $5 \times 10^{19}$ atoms/cm$^3$. P++ gate electrode portion 112LC similarly consisted of polysilicon at an $N_{POLYp}$ value of $5 \times 10^{19}$ atoms/cm$^3$. Threshold voltages $V_{T0A}$–$V_{T0C}$ respectively were 0.45, 1.01, and 1.59 V and thus progressively increased in increments of slightly greater than 0.5 V.

FIG. 16 depicts an implementation in which gate dielectric layer 110 is divided into three portions 110A, 110B, and 110C of different respective progressively increasing thicknesses $t_{GDA}$, $t_{GDB}$, and $t_{GDC}$. Gate dielectric portions 110A–110C respectively constitute parts of gate portions 131A–131C. The varactor of FIG. 16 is an example of the above-mentioned extension of the varactor of FIG. 12 for dividing dielectric layer 110 into three or more different-thickness portions, each being part of a different one of the gate portions.

FIG. 16 presents the example in which gate portion 131A separates gate portion 131B from plate region 102 and in which gate portion 131B separates gate portion 131C from gate portion 131A. As in FIG. 15, dielectric portion 110A extends between dielectric portion 110B and a location above plate region 102 such that dielectric portion 110 is spaced laterally apart from region 102 while dielectric portion 110B extends between dielectric portion 110C and dielectric portion 110A so that dielectric portion 110B is spaced further laterally apart from region 102 than is dielectric portion 110A. Gate dielectric portions 110A–110C thereby become progressively thicker as gate portions 131A–131C that respectively contain dielectric portions 110A–110C progressively become more distant from plate region 102 and progressively increase in zero-point gate-to-body threshold voltage $V_{T0}$.

Figure 17:
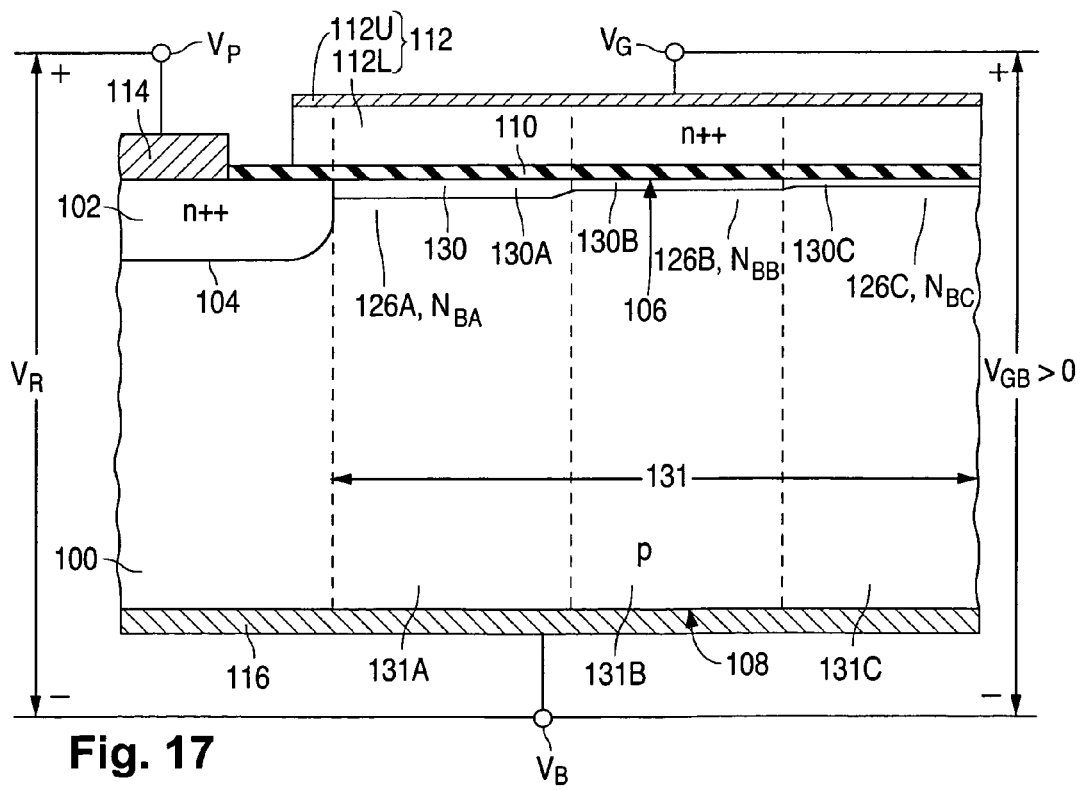

FIG. 17 illustrates an implementation in which portions 126A–126C of surface depletion region 126, and thus portions 130A–130C of inversion layer 130, are respectively provided with different progressively increasing values $N_{BA}$, $N_{BB}$, and $N_{BC}$ of average net dopant concentration $N_B$. The varactor of FIG. 17 is an example of the above-mentioned extension of the varactor of FIG. 13 for providing three or more portions of surface depletion region 126 with different $N_B$ values.

As in FIG. 16, FIG. 17 presents the example in which gate portion 131A separates gate portion 131B from plate region 102 and in which gate portion 131B separates gate portion 131C from gate portion 131A. Accordingly, surface depletion region portion 126A extends between surface depletion portion 126B and plate region 102 such that depletion portion 126B is spaced apart from region 102 while surface depletion portion 126B extends between surface depletion portion 126C and surface dielectric portion 126A such that depletion portion 126C is spaced further apart from plate region 102 than is dielectric portion 126B. Hence, depletion portions 126A–126C progressively increase in net dopant concentration $N_B$ as gate portions 131A–131C that respectively contain depletion portions 126A–126C become progressively more distant from plate region 102 and progressively increase in zero-point gate-to-body threshold voltage $V_{T0}$.

Figure 18:
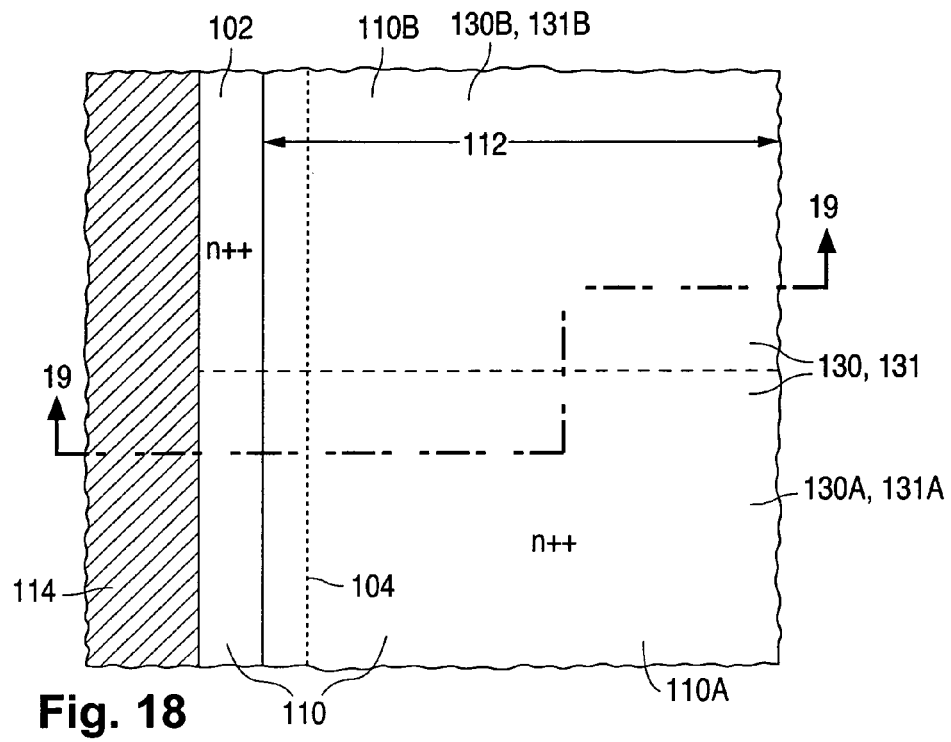
FIG. 18 is a cross-sectional plan view of an n-channel silicon-gate gate-enhanced junction varactor configured according to the invention.
Figure 19:
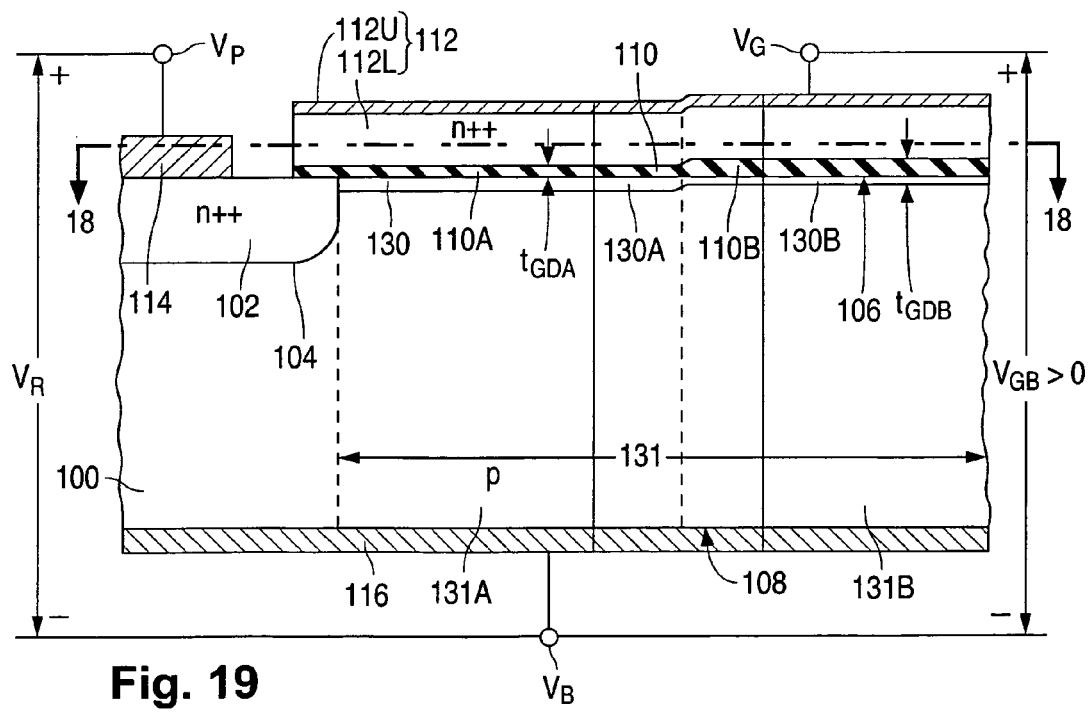
FIG. 19 is a cross-sectional side view of the gate-enhanced junction varactor of FIG. 18. The cross section of FIG. 18 is taken through plane 18—18 in FIG. 19. The cross section of FIG. 19 is taken through jagged "plane" 19—19 in FIG. 18.

FIGS. 18 and 19 depict an implementation in which gate dielectric layer 110 is divided into two portions 110A and 110B, each of which extends over part of plate region 102. Gate dielectric portions 110A and 110B are of different respective thicknesses $t_{GDA}$ and $t_{GDB}$ where thickness $t_{GDB}$ exceeds thickness $t_{GDA}$ as in the implementation of FIG. 12. Likewise, dielectric portions 110A and 110B respectively constitute parts of gate portions 131A and 131B and are respectively situated above at least the locations for inversion portions 130A and 130B. Since each dielectric portion 110A or 110B extends over part of plate region 102, both of gate portions 131A and 131B meet region 102. Each inversion portion 130A or 130B, when present, thereby likewise meets plate region 102. Gate portion 131C is not present in the varactor of FIGS. 18 and 19.

The varactor of FIGS. 18 and 19 has the same zero-point gate-to-body threshold-voltage/gate-dielectric thickness relationship as the varactor of FIG. 12 even though both of gate dielectric portions 110A and 110B extend partially over plate region 102 in the varactor of FIGS. 18 and 19. As indicated above in connection with FIG. 12, this relationship extends to implementations of the present n-channel varactor in which gate region 131 is divided into three or more portions, each having a gate dielectric portion of different thickness than the other gate dielectric portions. The three or more portions of gate region 131 in this extension may meet plate region 102 so that each of at least three of the gate dielectric portions extends partially over region 102.

Subject to the voltage polarities being reversed, the preceding threshold-voltage/gate-dielectric-thickness relationship applies to implementations of the present p-channel varactor in which gate region 181 is divided into two or more portions, each having a gate dielectric portion of different thickness than the other gate dielectric portions, where two or more of the gate portions meet plate region 152 so that each of at least two of the gate dielectric portions extends partially over region 152. Hence, the portions of gate region 131 or 181 progressively increase in the magnitude of zero-point gate-to-body threshold voltage $V_{T0}$ as the gate dielectric portions progressively increase in thickness regardless of how many gate dielectric portions extend partially over plate region 102 or 152. Likewise, the portions of inversion layer 130 or 180 appear/disappear at progressively increasing $V_{T0}$ magnitude as the gate dielectric portions respectively associated with the inversion portions progressively increase in thickness regardless of how many gate dielectric portions extend partially over plate region 102 or 152.

FIGS. 20 and 21 illustrate an implementation which essentially combines features of the varactor of FIGS. 18 and 19 with features of the varactor of FIG. 12. In the varactor of FIGS. 20 and 21, gate dielectric layer 110 is divided into three portions 110A, 110B, and 110C having different progressively increasing thicknesses $t_{GDA}$, $t_{GDB}$, and $t_{GDC}$. Gate dielectric portions 110A–110C respectively constitute parts of gate portions 131A–131C in the varactor of FIGS. 20 and 21 and are respectively situated above at least locations for portions 130A–130C of inversion layer 130.

In the implementation of FIGS. 20 and 21, gate portions 131A and 131B both meet plate region 102. Each of gate dielectric portions 110A and 110B thus extends over part of plate region 102. Each of gate portions 131A and 131B extends between gate portion 131C and plate region 102 such that gate portion 131C is spaced apart from region 102. Consequently, each of dielectric portions 110A and 110B extends between dielectric portion 110C and a location above plate region 102 such that dielectric portion 110C is spaced laterally apart from region 102.

FIGS. 20 and 21 present the example in which gate portion 131C is coupled to plate region 102 through both of gate portions 131A and 131B, each of which is of lower zero-point gate-to-body threshold voltage $V_{T0}$ than gate portion 131C. However, gate portion 131C need only be coupled to plate region 102 through one of gate portions 131A and 131B. Also, gate portions 131A–131C can be arranged so that gate portions 131A and 131C meet plate region 102 while gate portion 131B is separated from region 102 by at least gate portion 131A. Gate dielectric portion 110B is then coupled to plate region 102 through gate dielectric portion 110A which, as needed, is thinner than dielectric portion 110B.

It is often desirable that electronic devices such as the present varactors be fabricated in the course of manufacturing other electronic components, especially field-effect transistors (again, "FETs"), according to a pre-existent semiconductor fabrication process without modifying the process sequence. That is, the varactors of the present invention can be fabricated by appropriately preparing masks used during the pre-existent fabrication process without adding any new process step(s) to the process or otherwise modifying the process. This objective can be achieved for the present varactor with many pre-existent fabrication processes, thereby facilitating use of the present invention.

For instance, if a semiconductor fabrication process includes the capability for providing insulated-gate FETs with gate dielectric layers of two different thicknesses, this capability can be employed to create gate dielectric layer 110 or 160 as portions of two different thicknesses for manufacturing a varactor such as that of FIG. 12. Semiconductor fabrication processes that furnish multiple gate dielectric thicknesses are, in fact, becoming common in manufacturing system-on-a-chip ("SOC") designs. See Takeuchi et al, "A New Multiple Transistor Design Methodology for High Speed Low Power SOCs," *IEDM Technical Digest*, December 2001, pages 22.6.1–22.6.7. By using a fabrication process such as that described in Takeuchi et al, an implementation of the present varactor having gate dielectric layer 110 or 160 divided into multiple portions of differing thicknesses can be manufactured without modifying the process sequence and thus without adding any new process step(s).

In a semiconductor fabrication process, that includes a capability for providing insulated-FETs with threshold-adjust ion implantations, the threshold-adjust capability can be utilized to provide the portions of surface depletion region 126 or 176 with different values of net dopant concentration $N_B$ in manufacturing a varactor such as that of FIG. 13 or 17. If a process for manufacturing complementary insulated-gate FETs includes a capability for manufacturing gate electrodes of both n-type conductivity and p-type conductivity, this capability can be employed to provide gate electrode 112 (112L) or 162 (162L) with portions of opposite conductivity type in fabricating a varactor such as that of FIG. 14.

A semiconductor fabrication process that includes two or more of the preceding capabilities can be utilized in manufacturing varactor implementations that employ two or more of the techniques described above for achieving different values of zero-point gate-to-body threshold voltage $V_{T0}$. For example, in a semiconductor fabrication process that includes a capability for providing complementary insulated-gate FETs with gate electrodes of both n-type and p-type conductivities and for providing gate dielectric layers of two different thicknesses, these two capabilities can be employed to provide gate electrode 112 (112L) or 162 (162L) with portions of opposite conductivity types and to provide gate dielectric layer 110 or 160 with portions of two thicknesses in fabricating a varactor such as that of FIG. 15. A threshold-adjust capability in a semiconductor fabrication process that includes either or both of the last two capabilities can be utilized in producing a varactor in which some of the portions of surface depletion region 126 or 176 are of different net dopant concentrations $N_B$ while gate electrode 112 or 162 contains portions of opposite conductivity type or/and gate dielectric layer 110 or 160 is variously divided into portions of different thicknesses.

Computer Simulation

The gate-enhanced junction varactor of the present invention was computer simulated in two dimensions to validate the operational principles and analytical theory. The simulation was conducted on various stripe-type (rectangular) silicon-gate implementations of the n-channel varactor of FIG. 8 using the Medici two-dimensional simulation program. See *Medici Two-Dimensional Device Simulation Program User's Manual*, version 1998.4, Avant! Corp., 1999.

Figure 22:
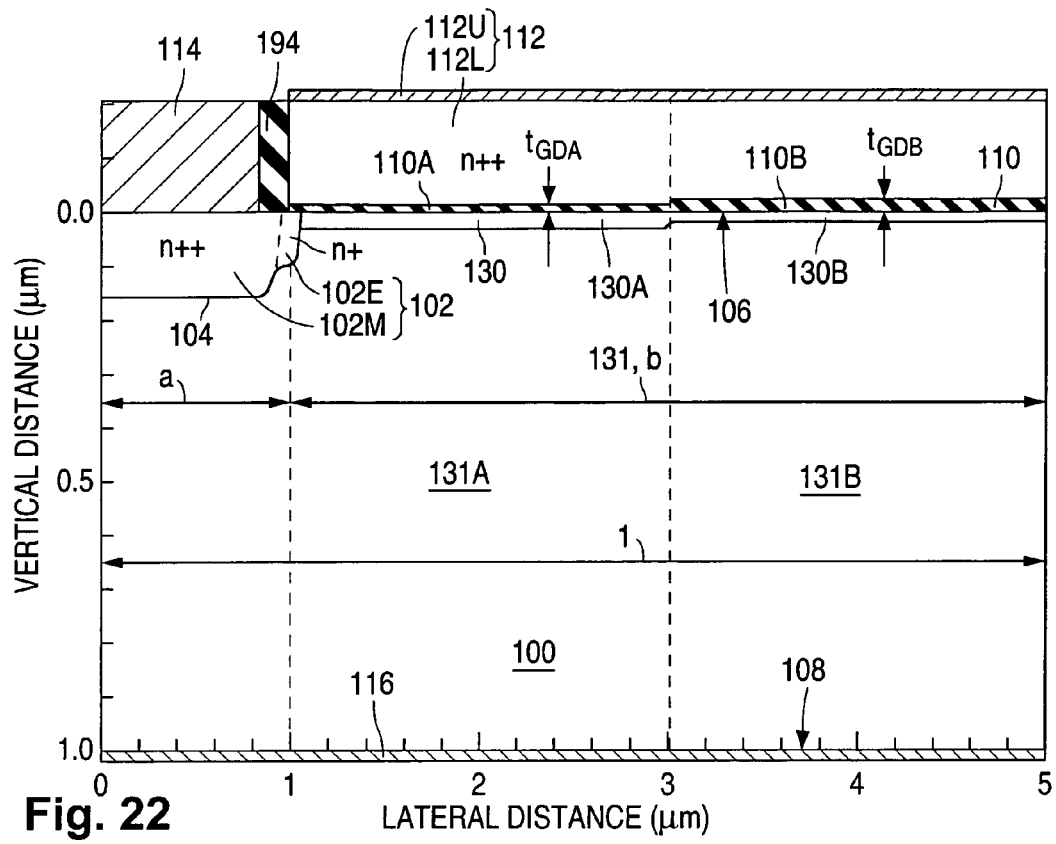
FIG. 22 is a cross-sectional side view of a computer-simulated n-channel silicon-gate gate-enhanced junction varactor configured according to the invention to have the gate dielectric layer divided into two portions of different thicknesses.
Figure 29:
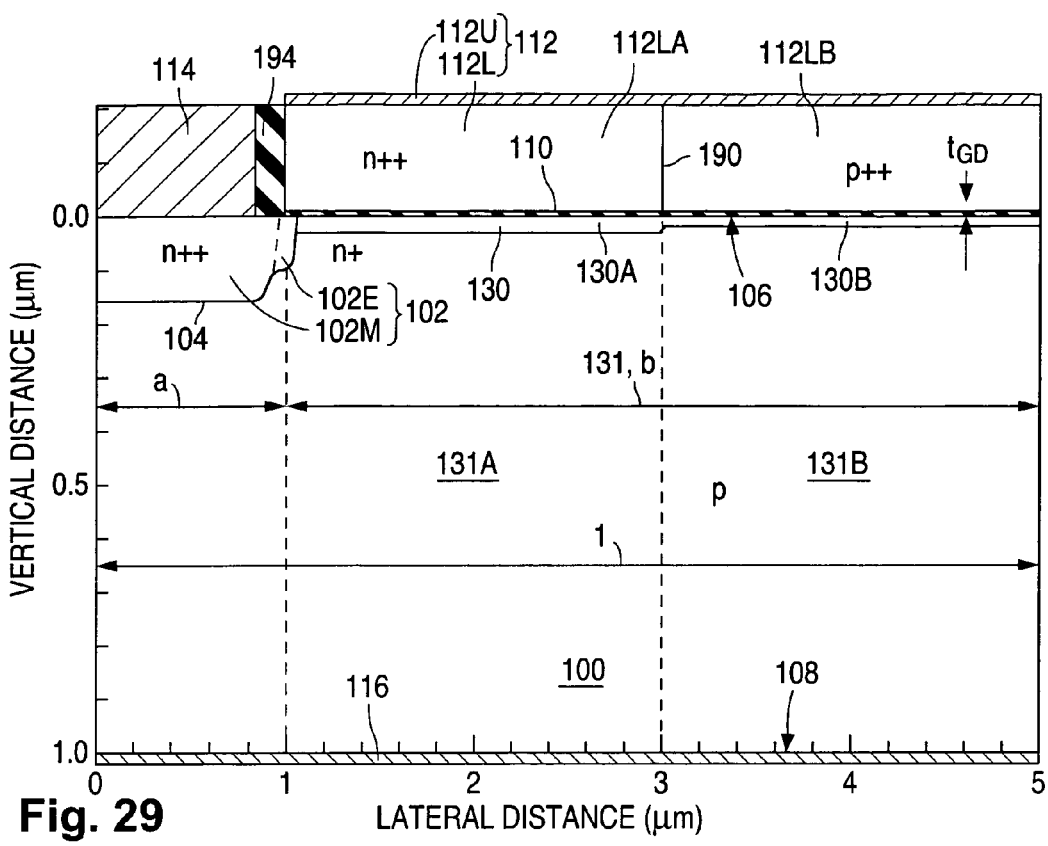
FIG. 29 is a cross-sectional side view of a computer-simulated n-channel silicon-gate gate-enhanced junction varactor configured according to the invention to have a doped polycrystalline silicon gate electrode layer divided into two portions of opposite conductivity types.

FIGS. 22, 26, and 29 present examples of three different computer-simulated implementations of the n-channel gate-enhanced junction varactor of FIG. 8. In all these computer simulations, gate electrode 110 was silicon oxide while body region 100 and plate region 102 were monosilicon. N-type region 102 consisted of a very heavily doped main plate portion 102M and a more lightly doped lateral extension 102E. Although more lightly doped than main plate portion 102M, plate extension 102E was still heavily doped. Gate electrode 112 was formed with lower heavily doped polysilicon layer 112L and upper metallic layer 112U. Each of the computer simulations also included a silicon nitride gate sidewall dielectric spacer 194 situated between electrodes 112 and 114. Body electrode 116 was provided along lower semiconductor surface 108.

The computer simulations of the three implementations of the present varactor had the following numerical parameters:
 Total length of plate region 102=1.0 μm,
 Channel length=4.0 μm,
 Lateral thickness of each spacer 194=0.15 μm,
 Junction depth of main plate portion 102M=0.15 μm,
 Junction depth of plate extension 102E=0.1 μm,
 Uniform acceptor dopant concentration $N_B$ of body region 100, including surface depletion region 126,=$4 \times 10^{17}$ atoms/cm$^3$,
 Upper surface dopant concentration of main plate portion 102M=$1.0 \times 10^{20}$ atoms/cm$^3$,
 Upper surface dopant concentration of plate extension 102E=$1.0 \times 10^{19}$ atoms/cm$^3$, and
 Dopant concentration $N_{POLY}$ in polysilicon gate electrode layer 112L=$5.0 \times 10^{-19}$ atoms/cm$^3$ regardless of conductivity type.

Thickness $t_{GD}$ of gate dielectric layer 110 depended on the implementation and, in the implementations of FIGS. 22 and 26, varied from place to place.

The two dimensions employed for the simulations of the present varactor are the horizontal and vertical directions in FIG. 22, 26, or 29. All the varactor components, including plate region 102 and inversion layer 130, had the same width as measured perpendicular to the plane of FIG. 22, 26, or 29. A convenient parameter for examining the varactor of FIG. 22, 26, or 29 is the varactor capacitance per unit varactor width, referred to here as the varactor width-wise lineal capacitance $C_{VW}$. Varactor lineal capacitance $C_{VW}$ and varactor areal capacitance $C_{VA}$ are related as:

$$C_{VW} = lC_{VA} \tag{36}$$

where l is the total varactor length measured horizontally in FIG. 22, 26, or 29. As plate-to-body voltage $V_R$ passes through all of transition values $V_X$, lineal capacitance $C_{VW}$ switches between a high value $C_{VWH}$ and a low value $C_{VWL}$. In terms of values $C_{VWH}$ and $C_{VWL}$, the $C_{VAH}/C_{VAL}$ transition capacitance ratio of Eq. 20 is represented as:

$$\frac{C_{VWH}}{C_{VWL}} = \left(\frac{t_{dJXH}}{t_{dJXL}}\right)\left(1 + \frac{A_{Imax}}{A_P}\right) \tag{37}$$

In the simulated varactor of FIG. 22, 26, or 29, plate region 102 had a length a of approximately 1 μm, while inversion layer 130 had a length b of approximately 4 μm when it was fully present. Length b is also approximately represented by the length of gate electrode 112. Lengths a and b are measured horizontally in FIG. 22, 26, or 29. Inasmuch as region 102 and layer 130 are of the same width, area ratio $A_{Imax}/A_P$ for each simulated varactor is given as:

$$\frac{A_{Imax}}{A_P} = \frac{b}{a} \tag{38}$$

Combining Eqs. 37 and 38 gives:

$$\frac{C_{VWH}}{C_{VWL}} = \left(\frac{t_{dJXH}}{t_{dJXL}}\right)\left(1 + \frac{b}{a}\right) \tag{39}$$

Thickness ratio $t_{dJXH}/t_{dJXL}$ is greater than 1. Since length ratio b/a was 4, the simulated varactor of FIG. 22, 26, or 29 was specifically directed toward a $C_{VWH}/C_{VWL}$ ratio of somewhat greater than 5 in passing through all of transition voltages $V_X$.

With gate-to-body voltage $V_{GB}$ being held constant, each of the portions of inversion layer 130 actually appears/disappears over a small $V_R$ range which includes the $V_X$ transition value for that inversion portion rather than appearing/disappearing precisely at that transition value $V_X$ of voltage $V_R$. In light of this, the values of high capacitance $C_{VWH}$ and low capacitance $C_{VWL}$ are normally somewhat imprecise.

Lineal capacitance $C_{VW}$ was determined as a function of plate-to-body bias voltage $V_R$ for the simulated varactor of FIG. 22, 26, or 29 by replacing DC bias voltage $V_R$ with a frequency-dependent plate-to-body voltage $v_R$ consisting of bias voltage $V_R$ and a small-signal AC variation $v_r$ at frequencies, primarily 10 MHz, in the high-frequency regime while gate-to-body voltage $V_{GB}$ was held at fixed initial value $V_{Gbi}$. Body voltage $V_B$ was held at zero so that the $v_r$ small-signal frequency was applied specifically to plate region 102. Initial value $V_{Gbi}$ was sufficiently great to cause inversion layer 130 to be fully present at bias voltage $V_R$ equal to zero.

The frequency of the $v_r$ small signal was also varied across a range extending from 1 Hz to 1 GHz. No significant difference in the $C_{VW}$ dependence on the frequency of the $v_r$ small signal occurred across the 1 Hz-to-1 GHz high-frequency range. In this regard, the capacitive behavior of the present gate-enhanced junction varactor is determined by the variation of the electrical charges in junction depletion region 118 and surface depletion region 126 and therefore by a majority charge-carrier effect. Consequently, constancy of the capacitive behavior across the high-frequency regime is theoretically expected.

More particularly, only the connection/disconnection of inversion layer 130 to undepleted material 124 of plate region 102 involves minority charge carriers, namely the electrons that form layer 130. The intervention of these minority charge carriers has no effect on the varactor operation except for the initial time interval, typically on the order of several microseconds to several milliseconds (depending on the minority carrier lifetime), in which layer 130 is first fully established by thermal generation with plate-to-body bias voltage $V_R$ at zero. Otherwise, charge flows into and out of layer 130 almost instantaneously by drift and diffusion. Since there is no significant minority carrier effect on the capacitance of the present varactor, the variation of the varactor capacitance as a function of voltage $V_R$ is expected to be substantially constant across the high-frequency regime.

The two-dimension simulation model of the present gate-enhanced junction varactor represents the device physics in a more complete way than the one-dimensional modeling approximations employed in generating Eqs. 12–22. For instance, the sub-threshold conditions are well represented in the two-dimensional model but are not included in the one-dimensional approximations. Due to these differences, the two-dimensional computer-simulated model of the present varactor employs a slightly different value of acceptor body dopant concentration $N_B$ than was used in the one-dimensional analytical approximations presented above for an embodiment of the varactor of FIG. 15, $4 \times 10^{17}$ atoms/cm$^3$ for the two-dimensional model compared to $7.6 \times 10^{17}$ atoms/cm$^3$ for the one-dimensional approximations.

Turning specifically to FIG. 22, it depicts a computer simulated embodiment of the varactor of FIG. 12 in which gate dielectric layer 110 consisted of different-thickness portions 110A and 110B. Thickness $t_{GDA}$ of dielectric portion 110A was 4 nm in the varactor of FIG. 22. Thickness $t_{GDB}$ of dielectric portion 110B was greater than thickness $t_{GDA}$ and here was 8 nm, i.e., $2t_{GDA}$. Dielectric portions 110A and 110B each had a length b/2 of 2 μm.

Figure 23:
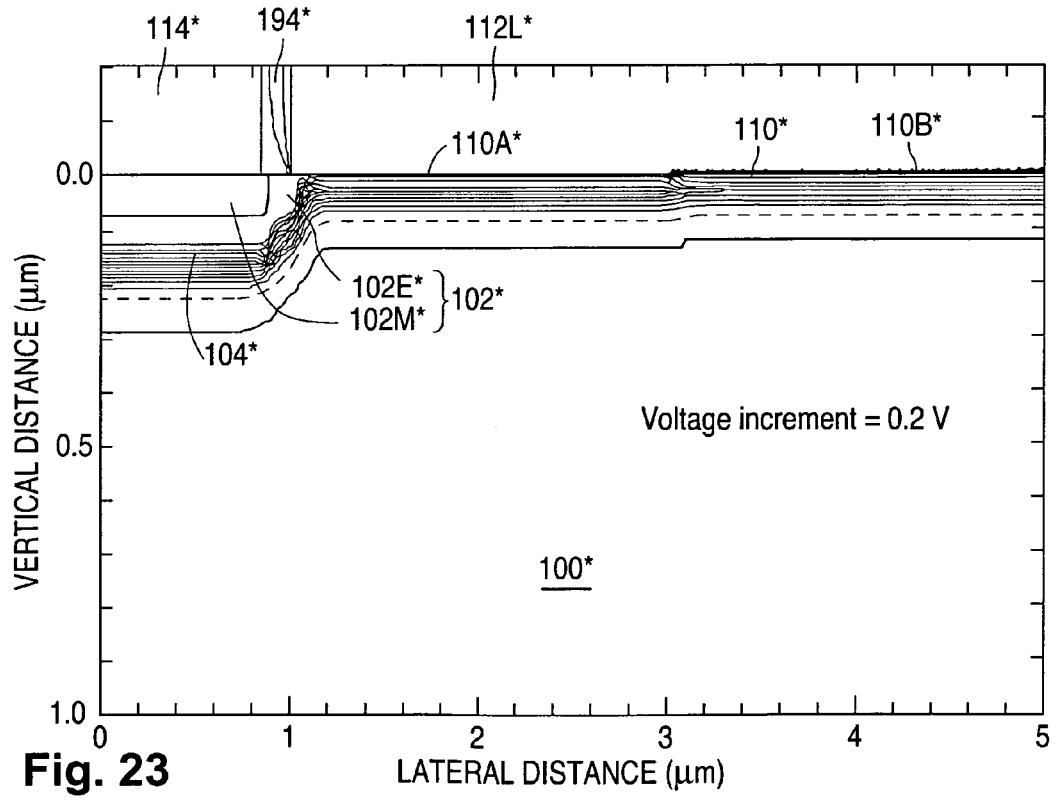
FIG. 23 is a graph of electrical equipotential lines for the varactor of FIG. 22.

FIG. 23 illustrates electrical equipotential lines in increments of 0.2 V for the varactor of FIG. 22. Items 100*, 102*, 102M*, 102E*, 104*, 110*, 110A*, 110B*, 112L*, 114*, and 194* in FIG. 23 respectively indicate the locations of regions/features 100, 102, 102M, 102E, 104, 110, 10A, 110B, 112, 114, and 194 in the varactor of FIG. 22.

FIG. 24 illustrates how varactor lineal capacitance $C_{VW}$ varied with plate-to-body bias voltage $V_R$ for the simulated varactor of FIG. 22 at fixed values ($V_{GBi}$) of gate-to-body bias voltage $V_{GB}$ ranging from 0.0 V in 0.5-V increments to 2.5 V in the high-frequency regime at a $v_r$ small-signal frequency of 10 MHz. As FIG. 24 shows, capacitance $C_{VW}$ for each of the five right-most curves having $V_{GB}$ values from 0.5 V to 2.5 V initially decreased in a roughly hyperbolic manner with increasing voltage $V_R$ starting from voltage $V_R$ slightly less than zero. Each of these five curves then went through a first inflection after which capacitance $C_{VW}$ decreased relatively sharply with increasing voltage $V_R$ over a relatively short $V_R$ transition interval in which capacitance $C_{VW}$ went through a second (reverse) inflection.

Lineal capacitance $C_{VW}$ for each of the five right-most curves in FIG. 24 subsequently started to level out but then went through a third inflection. Capacitance $C_{VW}$ again decreased relatively sharply with increasing plate-to-body voltage $V_R$ over another short $V_X$ transition interval in which capacitance $C_{VW}$ went through a fourth (reverse) inflection. After going through the fourth inflection, capacitance $C_{VW}$ for each of these curves leveled out with increasing voltage $V_R$ and decreased in a roughly hyperbolic manner with increasing voltage $V_R$.

Inasmuch as the computer-simulated varactor of FIG. 22 is an embodiment of the varactor implementation of FIG. 12, the varactor of FIG. 22 is characterized by two $V_X$ transition values, referred to here as voltages $V_{XA}$ and $V_{XB}$, at which portions 130A and 130B of inversion layer 130 respectively appear/disappear. Transition voltage $V_{XB}$ is less than transition voltage $V_{XA}$. A point at, or close to, the location where each of the five right-most curves through the second inflection is marked "$V_{XB}$" for the lower-voltage transition value. A point at, or close to, the location where each of these curves goes through the fourth inflection is marked "$V_{XA}$" for the higher-voltage transition value.

Each of the five curves presented in FIG. 24 for constant $V_{GB}$ values ranging from 0.5 V to 2.5 V is marked with a circle labeled $C_{VWH}$ at a location shortly after the first inflection point where capacitance $C_{VW}$ first starts to decrease sharply with increasing plate-to-body voltage $V_R$. The location at which capacitance $C_{VW}$ later nearly levels out with increasing voltage $V_R$ after going through the next three inflection points on each of these five curves is similarly marked with a small circle labeled $C_{VWL}$. The $C_{VWH}$ and $C_{VWL}$ locations on each of these five curves are somewhat arbitrary and could be chosen to be closer together. Nonetheless, the ratio of high varactor transition capacitance $C_{VWH}$ to low varactor transition capacitance $C_{VWL}$ for the two so-marked locations on each curve is somewhat greater than 5. Since Eq. 39 yields a $C_{VWH}/C_{VWL}$ ratio of somewhat greater than 5 for the one-dimensional approximations at a b/a length ratio of 4, the curves presented in FIG. 24 for the two-dimensional simulation of FIG. 22 qualitatively confirm the performance enhancements expected from the one-dimensional approximations.

The relatively sharp drops that occurred in capacitance $C_{VW}$ as plate-to-body voltage $V_R$ passed through transition values $V_{XB}$ and $V_{XA}$ for each of the five right-most curves in FIG. 24 are partially compensated for by the intervening $V_R$ range in which voltage $V_R$ started to level out. The net effect is that capacitance $C_{VW}$ decreased relatively gradually with increasing voltage $V_R$ across the $C_{VW}$ range from high value $C_{VWH}$ to low value $C_{VWL}$, and vice versa. As illustrated below in FIG. 28 for the implementation of FIG. 26, the $C_{VW}$ variation with voltage $V_R$ across the $C_{VWL}$-to-$C_{VWH}$ range is normally even more gradual when gate dielectric layer 110 is suitably divided into more than two portions of differing thicknesses $t_{GD}$.

Figure 25:
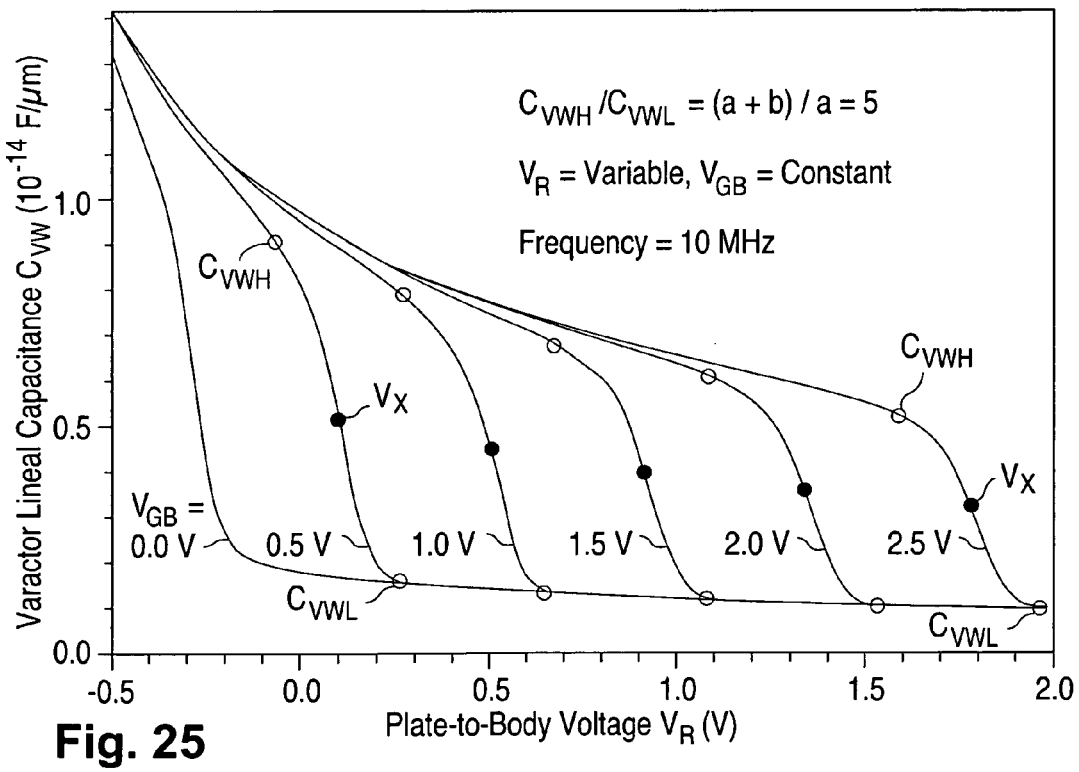
FIG. 25 is a graph of varactor width-wise lineal capacitance as a function of plate-to-body voltage for a computer-simulated implementation of the varactor of U.S. application Ser. No. 09/903,059 at various constant values of gate-to-body voltage.

For comparison purposes, FIG. 25 depicts how lineal capacitance $C_{VW}$ varied with plate-to-body voltage $V_R$ in a computer-simulated n-channel varactor, referred to here as the baseline varactor, of my U.S. patent application Ser. No. 09/903,059, cited above, at the same conditions (gate-to-body voltage $V_{GB}$ is constant, frequency is 10 MHz) as the simulation results presented in FIG. 24. The baseline varactor was identical to the computer-simulated varactor of FIG. 22 except that gate dielectric thickness $t_{GD}$ was constant at 4 nm in the baseline varactor. Accordingly, the baseline varactor had only one transition value $V_X$ of voltage $V_R$ at constant gate-to-body voltage $V_{GB}$.

Capacitance values $C_{VWH}$ and $C_{VWL}$ in FIG. 25 have the same meanings for the baseline varactor as given above for the varactors of the present invention subject, of course, to the baseline varactor having only one transition voltage $V_X$ at any given value of gate-to-body voltage $V_{GB}$. For the baseline varactor, thickness ratio $t_{dJXH}/t_{dJXL}$ in Eq. 39 is 1. Consequently, the $C_{VWH}/C_{VWL}$ ratio for the baseline varactor is simply (a+b)/a.

Capacitance $C_{VW}$ for the baseline varactor dropped sharply from high value $C_{VWH}$ to low value $C_{VWL}$ as plate-to-body voltage $V_R$ was raised so as to pass through transition voltage $V_X$ for each of the five right-most curves in FIG. 25 at constant values of gate-to-body voltage $V_{GB}$ ranging from 0.5 V in increments of 0.5 V to 2.5 V. A comparison of FIGS. 24 and 25 shows that the $C_{VW}$ drop from high value $C_{VWH}$ to low value $C_{VWL}$ with increasing voltage $V_R$ at $V_{GB}$ values ranging from 0.5 V to 2.5 V occurred considerably more gradually in the varactor of FIG. 22 than in the baseline varactor. At constant voltage $V_{GB}$, capacitance $C_{VW}$ thereby varied more gradually across the entire $V_R$ range in the varactor of FIG. 22 than in the baseline varactor. The division of gate region 131 into portions 131A and 131B of two different zero-point gate-to-body threshold voltage $V_{T0}$, and thus two different transition voltages $V_X$, produced this more gradual $C_{VW}$ variation in the varactor of FIG. 22.

FIG. 26 illustrates a computer-simulated implementation of the varactor of FIG. 12 in which gate dielectric layer 110 consisted of four different-thickness portions 110A, 110B, 110C, and 110D. Thicknesses $t_{GDA}$, $t_{GDB}$, $t_{GDC}$ and $t_{GDD}$ of respective dielectric portions 110A–110D progressively increased in 4-nm increments starting with thickness $t_{GDA}$ which was 4 nm. Thicknesses $t_{GDB}$, $t_{GDC}$, and $t_{GDD}$ respectively were 8, 12, and 16 nm. Dielectric portions 110A–110B in the varactor of FIG. 26 each had a length b/4 of 1 µm.

Inasmuch as gate dielectric layer 110 consisted of four portions 110A–110D of progressively increasing thickness in the varactor of FIG. 26, gate region 131 consisted of four portions 131A, 131B, 131C, and 131D that respectively included dielectric portions 110A–110D. Gate portions 131A–131D progressively increased in zero-point gate-to-body threshold voltage $V_{T0}$ in going from gate portion 131A to gate portion 131D. At a fixed value of gate-to-body voltage $V_{GB}$, gate portions 131A–131D had progressively decreasing transition values $V_{XA}$, $V_{XB}$, $V_{XC}$, and $V_{XD}$ of plate-to-body voltage $V_R$ at which respective portions 130A, 130B, 130C, and 130D of inversion layer 130 appear/disappear.

Figure 27:
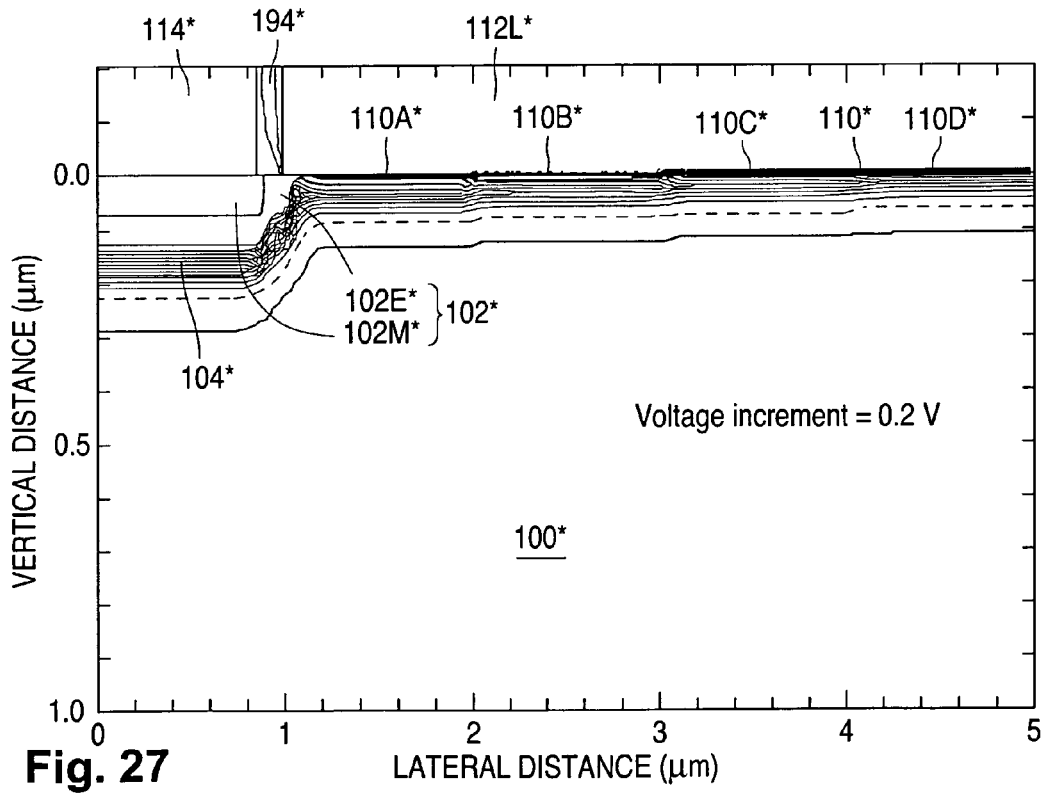
FIG. 27 is a graph of electrical equipotential lines for the varactor of FIG. 26.

FIG. 27 illustrates electrical equipotential lines in increments of 0.2 V for the varactor of FIG. 26. Items 110C* and 110D* in FIG. 27 respectively indicate the locations of gate dielectric portions 110C and 110D in the varactor of FIG. 26. The remaining asterisk-containing reference symbols in FIG. 27 have the same meanings as in FIG. 23.

FIG. 28 depicts how lineal capacitance $C_{VW}$ varied with plate-to-body voltage $V_R$ for the computer-simulated varactor of FIG. 26 at the same conditions (again, gate-to-body voltage $V_{GB}$ is constant, frequency is 10 MHz) as the simulation results presented in FIG. 24. As indicated by the four right-most curves in FIG. 28, capacitance $C_{VW}$ for the varactor of FIG. 26 decreased with increasing voltage $V_R$ in a manner generally similar to how capacitance $C_{VW}$ decreased with increasing voltage $V_R$ for the varactor of FIG. 22 except that each of the four right-most curves in FIG. 28 went through twice as many inflections as the corresponding $C_{VW}(V_R)$ curve in FIG. 24 for the varactor of FIG. 22. This occurred because the varactor of FIG. 26 had twice as many transition voltages $V_X$ as the varactor of FIG. 22 at any given value of gate-to-body voltage $V_{GB}$.

Capacitance $C_{VW}$ for each of the four right-most curves in FIG. 28 dropped more sharply with increasing plate-to-body voltage $V_R$ as voltage $V_R$ passed through each of transition values $V_{XD}$, $V_{XC}$, $V_{XB}$, and $V_{XA}$ than at a location midway between each consecutive pair of transition values $V_{XA}$–$V_{XD}$. However, the $C_{VW}$ drop in passing through each of transition values $V_{XA}$–$V_{XD}$ for each of these four curses was considerably more gradual than the $C_{VW}$ drop that occurred in passing through transition values $V_{XA}$ and $V_{XB}$ for each of the four curves in FIG. 24. Hence, capacitance $C_{VW}$ varied more gradually with voltage $V_R$ in the four-transition-voltage varactor of FIG. 26 than in the two-transition-voltage varactor of FIG. 22. Increasing the number of gate portions in gate region 131 typically leads to a more gradual $C_{VW}$ variation with voltage $V_R$ at constant gate-to-body voltage $V_{GB}$.

The benefit of increasing the number of gate portions can be further seen by comparing FIG. 28 to FIG. 25 for the baseline varactor in which the gate region was not divided into multiple portions. As this comparison indicates, the $C_{VW}$ variation with increasing plate-to-body voltage $V_R$ was quite gradual for the varactor of FIG. 26.

FIG. 29 illustrates a computer-simulated embodiment of a varactor of FIG. 14 in which lower layer 112L of gate electrode 112 consisted of oppositely doped portions 112LA and 112LB. Dopant concentrations $N_{POLYn}$ and $N_{POLYp}$ of gate electrode portions 112LA and 112LB were, as indicated above, both equal to $5 \times 10^{19}$ atoms/cm$^3$. Thickness $t_{GD}$ of gate dielectric layer 110 was 4 nm in the varactor of FIG. 29.

Figure 30:
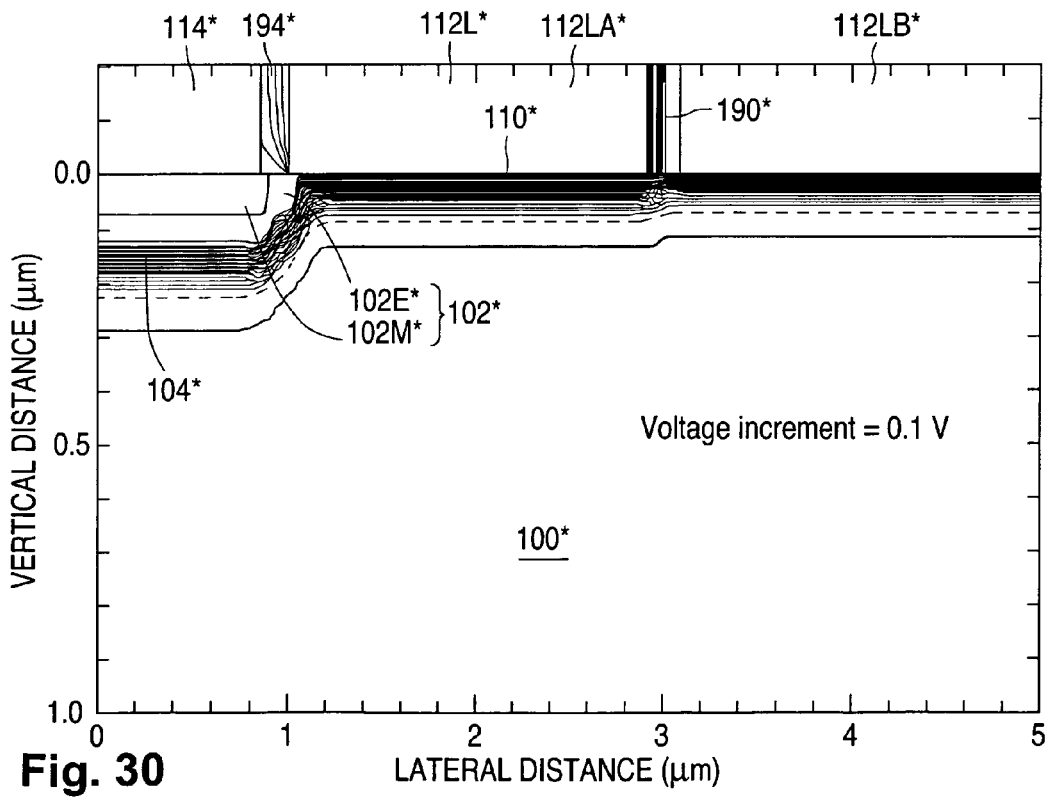
FIG. 30 is a graph of electrical equipotential lines for the varactor of FIG. 29.

FIG. 30 depicts electrical equipotential lines in increments of 0.1 V for the varactor of FIG. 29. Items 112LA* and 112LB* in FIG. 30 respectively indicate the locations of gate electrode portions 112LA and 112LB in the varactor of FIG. 29.

FIG. 31 illustrates how lineal capacitance $C_{VW}$ varied with plate-to-body voltage $V_R$ for the computer-simulated varactor of FIG. 29 at the same conditions as the simulation results presented in FIG. 24. Since the varactors of FIGS. 22 and 29 each had two transition voltages $V_{XA}$ and $V_{XB}$ at a given value of gate-to-body voltage $V_{GB}$, the $C_{VW}$ variation with voltage $V_R$ as presented in FIG. 31 for the varactor of FIG. 29 was generally similar to that presented in FIG. 24 for the varactor of FIG. 22. The difference between transition voltages $V_{XB}$ and $V_{XA}$ at any given value of voltage $V_{GB}$ is greater for the varactor of FIG. 29 then for the varactor of FIG. 22. As a result, a comparison of FIGS. 31 and 24 shows that capacitance $C_{VW}$ decreased less gradually with increasing voltage $V_R$ for the varactor of FIG. 29 than for the varactor of FIG. 22. Nonetheless, a comparison of FIGS. 31 and 25 shows that the $C_{VW}$ variation with voltage $V_R$ for the varactor of FIG. 29 was relatively gradual compared to that of the baseline varactor.

Two extreme (and opposite) levels of gate electrode doping were simulated in the varactor of FIG. 29. Although the $C_{VW}$ variation with voltage $V_R$ was less gradual for the varactor of FIG. 29 than for the varactor of FIG. 22, one or more additional gate electrode doping levels can be employed to suit the needs of a particular application.

Electronic Circuitry Containing Gate-Enhanced Junction Varactor

Figure 32:
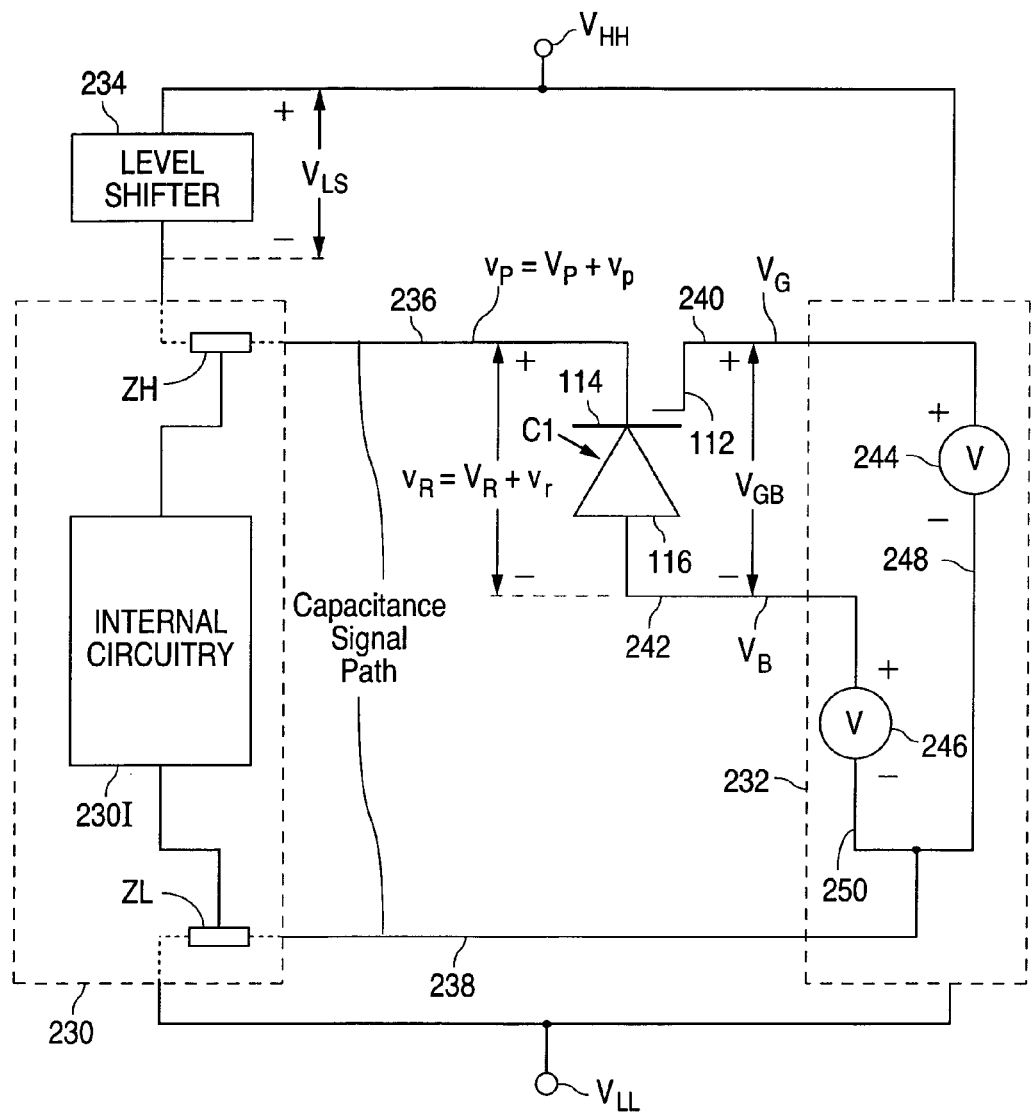
FIG. 32 is a circuit diagram of general electronic circuitry which employs a gate-enhanced junction varactor configured in accordance with the invention.

The present gate-enhanced junction varactor can be employed in various ways in electronic circuitry, especially in integrated circuits. FIG. 32 illustrates general electronic circuitry configured in accordance with the invention for utilizing an n-channel version of present varactor with gate-to-body bias voltage $V_{GB}$ being maintained approximately constant during varactor operation. The electronic circuitry in FIG. 32 is connected between a source of a high supply voltage $V_{HH}$ and a source of low supply voltage $V_{LL}$, typically ground. The components of the electronic circuitry consist of a general electronic circuit 230, an n-channel gate-enhanced junction varactor C1 configured according to the invention, a varactor control system 232, and an optional level shifter 234.

The electronic circuitry, primarily circuit 230, in FIG. 32 has a capacitance signal path for receiving varactor C1 in order to enable the circuitry to perform an electronic function dependent on variable capacitance $C_V$ of varactor C1. Plate electrode 114 and body electrode 116 of varactor C1 are situated in the capacitance signal path. One end of the capacitance signal path consists of a high-bias capacitance signal path line 236 that terminates at circuit 230. The other end of the capacitance signal path is formed with a low-bias capacitance signal path line 238 that likewise terminates at circuit 230. High-bias path line 236 is at a higher DC electrical potential than low-bias path line 238 during circuitry operation.

With varactor C1 being an n-channel junction varactor, high-bias path line 236 is connected to plate electrode 114. Electronic circuit 230 provides high-bias line 236 with a composite plate voltage $v_p$ consisting of DC plate voltage $V_P$ and an AC plate voltage $v_p$. Varactor C1 thus receives DC plate voltage $V_P$ from circuit 230 by way of line 236.

Electronic circuit 230 is formed with internal circuitry 230I, a high-bias impedance component ZH, and a low-bias impedance component ZL. Internal circuitry 230I can interact with impedance components ZH and ZL in various ways. For purposes of generality, FIG. 32 simply depicts circuitry 230I as being connected by a pair of electrical lines respectively to components ZH and ZL. Circuitry 230I may be connected by more than one electrical line to component ZH or ZL. Accordingly, the lines shown as connecting circuitry 230I to components ZH and ZL in FIG. 32 are intended to represent interactions rather than specific electrical connections. Although the line connecting circuitry 230I to component ZH is illustrated as touching an intermediate point on component ZH in FIG. 32, this line can be connected to an end of component ZH. The same applies to the line connecting circuitry 230I to component ZL.

Impedance components ZH and ZL can be configured in various ways. For example, each component ZH or ZL may consist of one or more passive electrical elements such as resistors, inductors, and capacitors. Additionally or alternatively, each component ZH or ZL may include one or more active elements such as FETs and bipolar transistors. Either of components may, in some cases, be of substantially zero impedance (0 ohm). Hence, component ZH or ZL can be simply an electrical line.

High-bias impedance component ZH is part of a high-bias electrically conductive DC path which extends through circuit 230 and through which high-bias capacitance signal path line 236 is electrically coupled to the $V_{HH}$ high voltage supply. Low-bias impedance component is similarly part of a low-bias electrically conductive DC path which extends through circuit 230 and through which low-bias capacitance signal path line 238 is electrically coupled to the $V_{LL}$ low voltage supply.

Varactor control system 232 furnishes varactor C1 with gate voltage $V_G$ and body voltage $V_B$ at values which normally vary during circuitry operation but whose difference $V_{GB}$ is maintained largely constant at initial value $V_{GBi}$. In particular, gate electrode 112 of varactor C1 receives gate voltage $V_G$ on a high-bias control line 240 connected to control system 232. Body electrode 116 similarly receives voltage $V_B$ on a low-bias control line 242 connected to system 232. Since varactor C1 is of n-channel type, voltage $V_G$ on high-bias control line 240 is normally greater than voltage $V_B$ on low-bias control line 242.

Control system 232 contains a high-bias DC voltage source 244 and a low-bias DC voltage source 246. High-bias voltage source 244 is coupled between high-bias control line 240 and low-bias path line 238 by way of an electrical line 248. Low-bias voltage source 246 is similarly coupled between low-bias control line 242 and path line 238 by way of an electrical line 250. Voltage sources 244 and 246 thus respectively furnish DC gate voltage $V_G$ and DC body voltage $V_B$.

Low-bias voltage source 246 is in the capacitance signal path since body electrode 116 is in the capacitance signal path. Accordingly, the capacitance signal path consists of high-bias path line 236, plate electrode 114, body electrode 116, low-bias control line 242, low-bias voltage source 246, electrical line 250, and low-bias path line 238. Gate electrode 112 is outside the capacitance signal path. Also, control system 232 is normally connected between the $V_{HH}$ and $V_{LL}$ voltage supplies.

Gate-to-body voltage $V_{GB}$ is, as indicated above, provided at largely constant value $V_{GBi}$ to varactor C1 during operation of the electronic circuitry in FIG. 32. Since voltage sources 244 and 246 respectively provide gate voltage $V_G$ and body voltage $V_B$ whose difference is gate-to-body voltage $V_{GB}$, a tracking condition is imposed on voltage sources 244 and 246. That is, when one of voltages $V_G$ and $V_B$ changes by some amount, voltage sources 244 and 246 track each other so that the other of voltages $V_G$ and $V_B$ changes by substantially the same amount.

Subject to the tracking condition being maintained between voltages $V_G$ and $V_B$, the circuitry of FIG. 32 can be configured to enable high-bias voltage source 244 to provide gate voltage $V_G$ at a value as high as high supply voltage $V_{HH}$. The circuitry of FIG. 32 can also be configured to enable low-bias voltage source 246 to provide body voltage $V_B$ at a value as low supply voltage $V_{LL}$. The latter situation arises when low-bias impedance component ZL is of such a nature, e.g., an electrical line or an inductor, that substantially no DC voltage drop occurs across component ZL. With gate-to-body voltage $V_{GB}$ being fixed at initial value $V_{GBi}$, the high value of body voltage $V_B$ is $V_{GBi}$ lower than the high value of gate voltage $V_G$ while the low value of gate voltage $V_G$ is $V_{GBi}$ higher than the low value of body voltage $V_B$.

Level shifter 234, which is present in some implementations of the circuitry of FIG. 32 but not in others, is connected between electronic circuit 230 and the $V_{HH}$ high voltage supply. Shifter 234 is specifically connected to the ZH high-bias DC path in circuit 230 so as to be electrically coupled to high-bias path line 236.

Current from the $V_{HH}$ high voltage supply flows through level shifter 234 to circuit 230. As this current flows through shifter 234, a DC voltage drop $V_{LS}$ occurs across shifter 234. The magnitude of voltage drop $V_{LS}$ may be controlled substantially solely by shifter 234 or by shifter 234 in combination with one or more circuitry elements in circuit 230. In any event, the presence of shifter 234 effectively causes circuit 230 to receive, by way of the ZH high-bias DC path, a lower high supply voltage than high supply voltage $V_{HH}$ provided to control system 232.

When level shifter 234 is absent, electronic circuit 230 is directly connected to the $V_{HH}$ high voltage supply. Accordingly, circuit 230 and control system 232 receive the same high supply voltage, i.e., voltage $V_{HH}$.

DC voltages $V_P$, $V_G$, and $V_B$ are referenced to low supply voltage $V_{LL}$ in the circuitry of FIG. 32. Except as otherwise indicated, all values of voltages $V_P$, $V_G$, and $V_B$ mean values relative to voltage $V_{LL}$.

The circuitry of FIG. 32 operates generally in the following manner. Plate voltage $V_P$, the DC portion of composite plate voltage $v_p$ supplied from electronic circuit 230 to plate electrode 114 of varactor C1, is maintained largely constant (relative to low supply voltage $V_{LL}$) and exceeds DC body voltage $V_B$. With low-bias control line 242 providing voltage $V_B$ to body electrode 116 of capacitor C1, composite plate-to-body voltage $V_R$ consisting of DC plate-to-body bias voltage $V_R$ and AC plate-to-body voltage $v_r$ is thus applied between electrodes 114 and 116 of capacitor C1. DC bias voltage $V_R$ is again the difference between DC voltages $V_P$ and $V_B$ according to Eq. 10.

Low-bias voltage source 246 adjusts body voltage $V_B$ upward or downward (relative to low supply voltage $V_{LL}$) depending on the needed value of varactor capacitance $C_V$. Since DC plate voltage $V_P$ is largely constant, DC plate-to-body voltage $V_R$ moves upward or downward in a corresponding way to adjust the $C_V$ value. High-bias voltage source 244 tracks low-bias voltage source 246 so as to maintain DC gate-to-body voltage $V_{GB}$ largely constant. Varactor C1 operates internally in the manner described above in connection with the varactor of FIG. 8. Accordingly, the circuitry of FIG. 32 performs an electron function that varies with the value of capacitance $C_V$.

Consider an implementation of the circuitry of FIG. 32 in which level shifter 234 is absent and in which the low value of body voltage $V_B$ is low supply voltage $V_{LL}$ while the high value of gate voltage $V_G$ is high supply voltage $V_{HH}$. The high value of body voltage $V_B$ is $V_{HH}-V_{GBi}$ since gate voltage $V_G$ exceeds body voltage $V_B$ by $V_{GBi}$, the fixed positive value of gate-to-body voltage $V_{GB}$. Assume that circuit 230 has no significant effect on DC plate voltage $V_P$. That is, assume that high-bias impedance component ZH is of such a nature that substantially no DC voltage drop occurs across component ZH. In the absence of shifter 234, the fixed value of DC plate voltage $V_P$ is then substantially $V_{HH}$. Since plate-to-body voltage $V_R$ is the difference between plate voltage $V_P$ and body voltage $V_B$, plate-to-body voltage $V_R$ varies across a minimum-to-maximum range extending from $V_{GBi}$ to $V_{HH}-V_{LL}$ when shifter 234 is absent. Even though minimum value $V_{Rmin}$ equals $V_{GBi}$ and is thus greater than zero, maximum value $V_{Rmax}$ equals $V_{HH}-V_{LL}$ and therefore occupies the entire supply voltage range. The length of the $V_{Rmin}$-to-$V_{Rmax}$ range is $V_{HH}-V_{LL}-V_{GBi}$.

The effect of level shifter 234 is to shift the $V_{Rmin}$-to-$V_{Rmax}$ range downward by an amount equal to shifter voltage drop $V_{LS}$ so that, by suitably choosing shifter drop $V_{LS}$ and fixed value $V_{GBi}$ of gate-to-body voltage $V_{GB}$, minimum value $V_{Rmin}$ of plate-to-body voltage $V_R$ can be made close to zero or slightly negative. The length of the $V_{Rmin}$-to-$V_{Rmax}$ range remains the same.

More particularly, again consider the situation in which body voltage $V_B$ varies between $V_{LL}$ and $V_{HH}-V_{Gbi}$. Again assume that electronic circuit 230 does not significantly affect DC plate voltage $V_P$. In the presence of shifter 234, the fixed value of plate voltage $V_P$ is then substantially $V_{HH}$–$V_{LS}$. Hence, plate-to-body voltage $V_R$ varies across a minimum-to-maximum range extending from $V_{GBi}$–$V_{LS}$ to $V_{HH}$–$V_{LL}$–$V_{LS}$ when shifter 234 is present. The length of the $V_{Rmin}$-to-$V_{Rmax}$ range is $V_{HH}$–$V_{LL}$–$V_{GBi}$, the same as arises when shifter 234 is absent.

By employing level shifter 234, maximum plate-to-body voltage $V_{Rmax}$ equals $V_{HH}$–$V_{LL}$–$V_{LS}$ and is thereby reduced by an amount $V_{LS}$ compared to the situation in which shifter 234 is absent. Although the $V_{Rmax}$ value is less than the full supply voltage range when shifter 234 is present, minimum plate-to-body voltage $V_{Rmin}$ equals $V_{GBi}$–$V_{LS}$ when shifter 234 is utilized and is therefore likewise reduced by amount $V_{LS}$ compared to the situation in which shifter 234 is absent. Use of shifter 234 enables minimum value $V_{Rmin}$ to be made close to zero or slightly negative by choosing shifter drop $V_{LS}$ to be close to or slightly greater than $V_{GBi}$, the fixed value of gate-to-body voltage $V_{GB}$. In either case, this can lead to an increase in the maximum-to-minimum varactor capacitance ratio.

Electronic circuit 230 may impact DC plate voltage $V_P$ by causing it to be reduced by a DC amount $V_K$. That is, high-bias impedance component ZH may be of such a nature that a voltage drop $V_K$ occurs across component ZH. In the case where internal voltage drop $V_K$ is substantially constant, the effect of the $V_P$ reduction caused by circuit 230 is similar to that produced by level shifter 230. Specifically, plate-to-body voltage $V_R$ varies across a minimum-to-maximum range extending from $V_{GBi}$–$V_K$ to $V_{HH}$–$V_{LL}$–$V_K$ when shifter 234 is absent. The length of the $V_{Rmin}$-to-$V_{Rmax}$ range is again $V_{HH}$–$V_{LL}$–$V_{GBi}$. Consequently, the $V_{Rmin}$-to-$V_{Rmax}$ range is shifted downward by internal voltage drop $V_K$ without changing the range length. Utilization of shifter 234 causes the $V_{Rmin}$-to-$V_{Rmax}$ range to be shifted downward by an additional amount $V_{LS}$, again without changing the range length.

In some implementations of the circuitry of FIG. 32, DC plate voltage $V_P$ can vary during circuitry operation provided that voltage $V_P$ varies differently than body voltage $V_B$. The variation in voltage $V_P$ is achieved by appropriately varying internal voltage drop $V_K$. Body voltage $V_B$ can, in fact, sometimes be largely constant (relative to low supply voltage $V_{LL}$). In any event, DC plate-to-body voltage $V_R$ varies upward or downward to adjust the $C_V$ value as needed.

The general circuitry of FIG. 32 can be readily modified to use a p-channel version of the present gate-enhanced junction varactor in place of n-channel junction varactor C1. One way of implementing this modification is to reconfigure the circuitry so that it is interconnected in a complementary (mirror-image) manner to what is shown in FIG. 32. That is, high-bias capacitance signal path line 236 can be connected directly to voltage sources 244 and 246 in control system 232. Using the electrode reference symbols of FIG. 11, the low-bias capacitance signal path line 238 is connected to plate electrode 164 of the p-channel varactor. With the polarity direction of voltage sources 244 and 246 reversed, gate electrode 162 and body electrode 166 of the p-channel varactor are respectively connected to voltage sources 244 and 246. Due to the polarity direction reversal, voltage source 244 provides gate voltage $V_G$ at a lower value than body voltage $V_B$ provided by voltage source 246. When present, level shifter 234 is connected between circuit 230 and the $V_{LL}$ supply.

Figure 33:
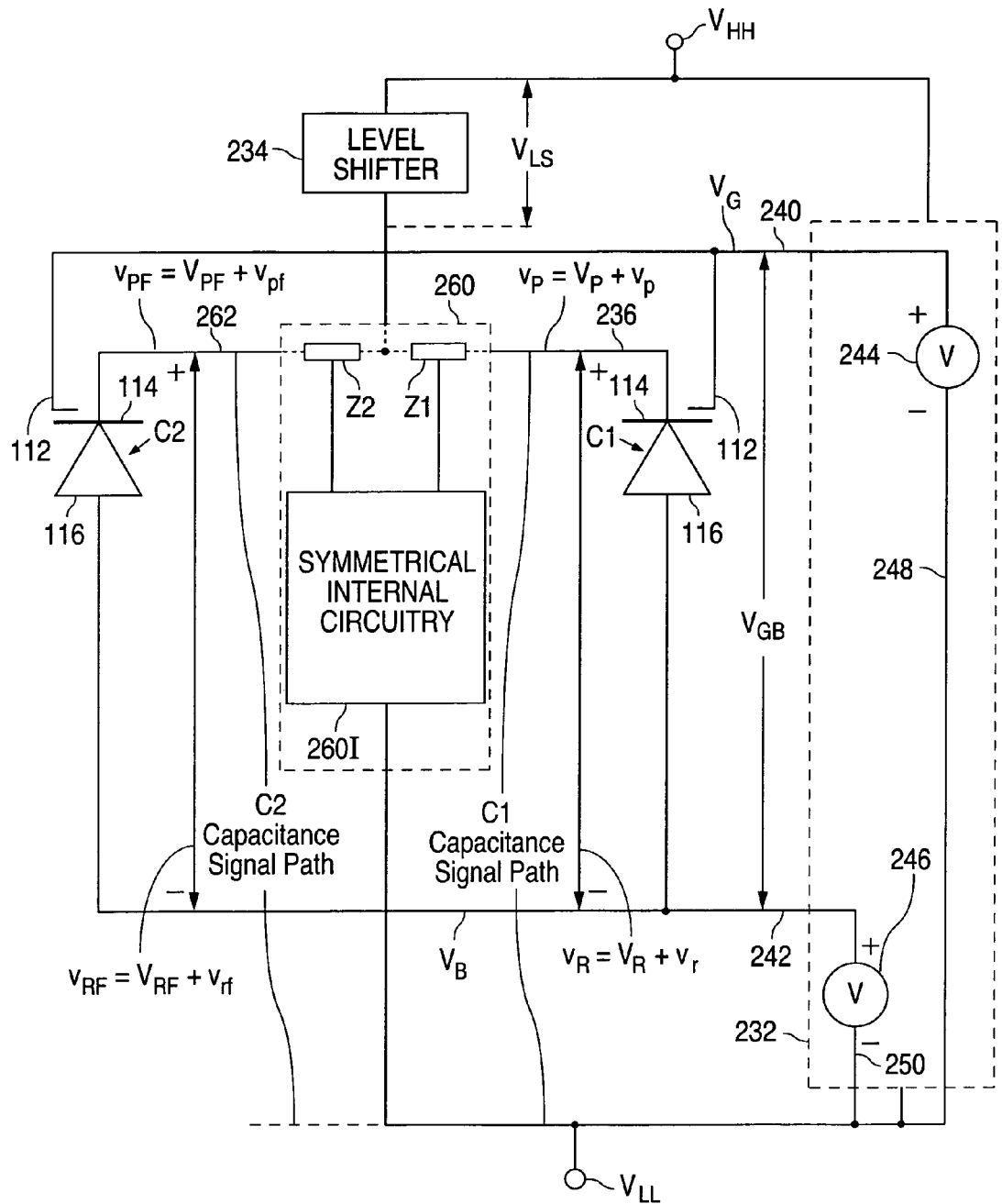
FIG. 33 is a circuit diagram of general electronic circuitry which employs a pair of gate-enhanced junction varactors positioned symmetrically around a symmetrical circuit in accordance with the invention.

An extension, or application, in accordance with the invention of the general electronic circuitry of FIG. 32 to the use of a pair of n-channel versions of the present varactor with symmetrical circuitry is presented in FIG. 33. As in the circuitry of FIG. 32, gate-to-body voltage $V_{GB}$ is maintained approximately constant during varactor operation in the general electronic circuitry of FIG. 33. The components of the electronic circuitry of FIG. 33 consist of a general symmetrical electronic circuit 260, a pair of largely identical n-channel gate-enhanced junction varactors C1 and C2 configured according to the invention, varactor control system 232, and optional level shifter 234.

The electronic circuitry, primarily symmetrical circuit 260, in FIG. 33 has a pair of capacitance signal paths for respectively receiving varactors C1 and C2 in order to enable the circuitry to perform an electronic function dependent on variable capacitances $C_V$ of varactors C1 and C2. Plate electrodes 114 and body electrodes 116 of capacitors C1 and C2 are situated in the capacitance signal paths. Analogous to the electronic circuitry of FIG. 32, one end of the C1 capacitance signal path in the circuitry of FIG. 33 consists of high-bias capacitance signal path line 236 that terminates at circuit 260. One end of the C2 capacitance signal path in the circuitry of FIG. 33 similarly consists of a further high-bias capacitance signal path line 262 that likewise terminates at circuit 260.

As in the circuitry of FIG. 32, high-bias path line 236 is connected to plate electrode 114 of varactor C1 in the circuitry of FIG. 33. Electronic circuit 260 thereby provides path line 236 with composite plate voltage $v_p$ consisting of DC plate voltage $V_P$ and AC plate voltage $v_p$. With varactor C2 being an n-channel junction varactor, further high-bias path line 262 is connected to plate electrode 114 of varactor C2. Circuit 260 provides further path line 262 with a further composite plate voltage $v_{pF}$ consisting of a further DC plate voltage $V_{PF}$ and a further AC plate voltage $v_{pf}$. Varactors C1 and C2 thus respectively receive DC plate voltages $V_P$ and $V_{PF}$ from circuit 260 by way of respective lines 236 and 262.

Symmetrical circuit 260 is formed with symmetrical internal circuitry 260I and a pair of largely identical high-bias impedance components Z1 and Z2. Analogous to high-bias impedance component ZH in the circuitry of FIG. 32, high-bias impedance component Z1 is part of a high-bias electrically conductive DC path which extends through circuit 260 and through which high-bias path line 236 is electrically coupled to the $V_{HH}$ high voltage supply. High-bias impedance component Z2 is similarly part of a further high-bias electrically conductive DC path which extends through circuit 260 and through which further high-bias path line 262 is electrically coupled to the $V_{HH}$ supply.

Internal symmetrical circuitry 260I of circuit 260 consists of electronic circuitry configured symmetrically with respect to high-bias impedance components Z1 and Z2. Internal circuitry 260I can interact with components Z1 and Z2 in various ways. For the purpose of generality, FIG. 33 simply illustrates circuitry 260I as being connected by a pair of electrical lines respectively to components Z1 and Z2. The comments made above about the constituency of high-bias impedance component ZH and about the ZH connection point of the electrical line shown as extending from internal circuitry 230I to component ZH in the circuitry of FIG. 32 apply here to components Z1 and Z2 and the electrical lines illustrated as connecting circuitry 260I to components Z1 and Z2 in the circuitry of FIG. 33. Examples of the symmetrical nature of circuitry 260I with respect to components Z1 and Z2 are presented below in connection with the VCO implementations of FIGS. 34a and 34b.

Internal circuitry 260I is also connected to the $V_{LL}$ low voltage supply. To the extent that circuitry 260I is connected by multiple paths to the $V_{LL}$ supply, these connections are made in a symmetrical manner relative to high-bias impedance components Z1 and Z2. Although not indicated in FIG. 33, circuitry 260I may be coupled to the $V_{HH}$ high voltage supply by multiple symmetrical paths separate from those that go through components Z1 and Z2. As a result, circuit 260 is internally symmetrical and is symmetrically arranged with respect to varactors C1 and C2.

Varactor control system 232 in the circuitry of FIG. 33 is configured with respect to, and controls, varactor C1 in the same manner as in the circuitry of FIG. 32. Control system 232 in the circuitry of FIG. 33 is also configured with respect to, and controls, varactor C2 the same as varactor C1. Hence, system 232 furnishes each of varactors C1 and C2 with gate voltage $V_G$ and body voltage $V_B$ at values which normally vary during circuitry operation but whose difference $V_{GB}$ is held largely constant at initial value $V_{Gbi}$. In particular, high-bias DC voltage source 244 provides gate voltage $V_G$ on high-bias control line 240 to gate electrode 112 of each of varactors C1 and C2. Low-bias voltage source 246 provides body voltage $V_B$ on low-bias control line 242 to body electrode 116 of each of varactors C1 and C2.

Neither low-bias capacitance signal path line 238 nor one or more low-bias impedance components analogous to low-bias impedance ZL in the circuitry of FIG. 32 appears in the circuitry of FIG. 33. Rather than being connected through electrical lines 248 and 250 to low-bias path line 238, voltage sources 244 and 246 in control system 232 are connected by electrical lines 248 and 250 directly to the $V_{LL}$ low voltage supply in the circuitry of FIG. 33.

The second (other) ends of the C1 and C2 capacitance signal paths terminate at the $V_{LL}$ low voltage supply in the circuitry of FIG. 33. With low-bias control line 242 connected to body electrodes 116 of both of varactors C1 and C2, the C1 capacitance signal path here consists of high-bias path line 236, C1 plate electrode 114, C1 body electrode 116, low-bias control line 242, low-bias voltage source 246, and electrical line 250. The C2 capacitance signal path signal path similarly consists of further high-bias path line 262, C2 plate electrode 114, C2 body electrode 116, line 242, voltage source 246, and line 250. Gate electrodes 112 of varactors C1 and C2 are outside the capacitance signal paths.

Alternatively, varactors C1 and C2 may be considered to be in a single capacitance signal path that bypasses low-bias voltage source 246. In that case, the single capacitance signal path in the circuitry of FIG. 33 consists of high-bias path line 236, C1 plate electrode 114, C1 body electrode 116, low-bias control line 242, C2 body electrode 116, C2 plate electrode 114, and further high-bias path line 262. Gate electrodes 112 are outside the single capacitance signal path. Due to (a) the symmetrical arrangement of varactors C1 and C2 relative to symmetrical circuit 260 and (b) the common symmetrical way in which control system 232 controls varactors C1 and C2, the values of capacitances $C_V$ of varactors C1 and C2 are substantially the same at any time during circuitry operation. Since varactors C1 and C2 are in series with each other, the varactor capacitance in the single capacitance signal path is $C_V/2$, i.e., the series combination of two capacitances $C_V$.

Level shifter 234 is present in some implementations of the circuitry of FIG. 33 but not in others. Analogous to the positioning of shifter 234 in the circuitry of FIG. 32, shifter 234 here is connected between electronic circuit 260 and the $V_{HH}$ high voltage supply. In particular, shifter 234 is connected to each of the Z1 and Z2 high-bias DC paths so as to be electrically coupled to each of high-bias path lines 236 and 262. When shifter 232 is present, circuit 260 effectively receives, by way of the Z1 and Z1 high-bias DC paths, a high supply voltage which is shifter DC voltage drop $V_{LS}$ lower than high supply voltage $V_{HH}$ provided to control system 232. In the absence of shifter 232, circuit 260 receives the same high supply voltage, i.e., $V_{HH}$, as system 232.

Subject to the above-mentioned configurational differences, the circuitry of FIG. 33 operates similarly to, but in a symmetrical manner compared to, the circuitry of FIG. 32. Plate voltages $V_P$ and $V_{PF}$, the DC portions of respective composite plate voltages $v_p$ and $v_{pf}$ provided from circuit 260 to plate electrodes 114 of varactors C1 and C2 are maintained largely constant. Each DC plate voltage $V_P$ or $V_{PF}$ exceeds body voltage $V_B$. Due to the circuitry symmetry, plate voltages $V_P$ and $V_{PF}$ are largely equal.

Composite plate-to-body voltage $V_R$ consisting of DC plate-to-body bias voltage $V_R$ and AC plate-to-body voltage $v_r$ is applied between electrodes 114 and 116 of varactor C1 in the circuitry of FIG. 33 just as in the circuitry of FIG. 32. With low-bias control line 242 also providing body voltage $V_B$ to body electrode 116 of varactor C2, a further composite plate-to-body bias voltage $v_{RF}$ consisting of a further DC plate-to-body bias voltage $V_{RF}$ and a further AC plate-to-body voltage $v_{rf}$ is applied between electrodes 114 and 116 of varactor C2. Further DC plate-to-body voltage $V_{RF}$ is the difference between further DC plate voltage $V_{PF}$ and DC body voltage $V_B$ in the manner presented above in Eq. 10 for plate-to-body voltage $V_R$. Since DC plate voltages $V_P$ and $V_{PF}$ are largely equal, DC plate-to-body voltages $V_R$ and $V_{RF}$ are largely equal.

Control system 232 in the circuitry of FIG. 33 operates the same as in the circuitry of FIG. 32. Accordingly, low-bias voltage source 246 adjusts body voltage $V_B$ upward or downward dependent on the desired value of varactor capacitance $C_V$ in each of the C1 and C2 capacitance signal paths or, alternatively, dependent on the desired value of capacitance $C_V/2$ in the single capacitance signal path. With DC plate voltages $V_P$ and $V_{PF}$ being held constant at largely the same value, largely equal DC plate-to-body voltages $V_R$ and $V_{RF}$ respectively move upward or downward in a corresponding way to respectively adjust capacitances $C_V$ of varactors C1 and C2. High-bias voltage source 244 tracks low-bias voltage source 246 to maintain gate-to-body voltage largely constant at value $V_{GBi}$. The circuitry of FIG. 33 thereby performs an electronic function that varies with the common value of capacitances $C_V$.

Level shifter 234 affects the location of the $V_{Rmin}$-to-$V_{Rmax}$ range in the circuitry of FIG. 33 in the same way as in the circuitry of FIG. 32. Since DC plate-to-body voltages $V_R$ and $V_{RF}$ are largely equal, voltage $V_{Rmin}$ is the minimum value of voltage $V_R$ or $V_{RF}$ for the circuitry of FIG. 33. Voltage $V_{Rmax}$ is similarly the maximum value of voltage $V_R$ or $V_{RF}$ for the circuitry of FIG. 33.

Electronic circuit 260 can impact DC plate voltages $V_P$ and $V_{PF}$ by causing each of them to be reduced by a DC amount $V_K$. The resultant effect on the location of the $V_{Rmin}$-to-$V_{Rmax}$ range is the same as when electronic circuit 230 causes plate voltage $V_P$ to be reduced by DC amount $V_K$ in the circuitry of FIG. 32. Similar to what occurs in the circuitry of FIG. 32, voltages $V_P$ and $V_{PF}$ can sometimes vary in the circuitry of FIG. 33 while still remaining largely equal to each other.

The general circuitry of FIG. 33 can be readily modified to employ two of the present p-channel gate-enhanced junction varactors in place of n-channel junction varactors C1 and C2. Analogous to what was said above about similarly modifying the circuitry of FIG. 32, one way of implementing this modification is to reconfigure the circuitry of FIG. 33 so as to be interconnected in a manner complementary to what is shown in FIG. 33. High-bias path line 236 is then replaced with low-bias capacitance signal path line 238. Further, high-bias path line 262 is likewise replaced with an analogous further low-bias capacitance signal path line. High-bias impedance components Z1 and Z2 are respectively replaced with a pair of low-bias impedance components connected respectively through low-bias path line 238 and the further low-bias path line respectively to the plate electrodes (164) of the two replacement p-channel junction varactors.

Figure 34A:
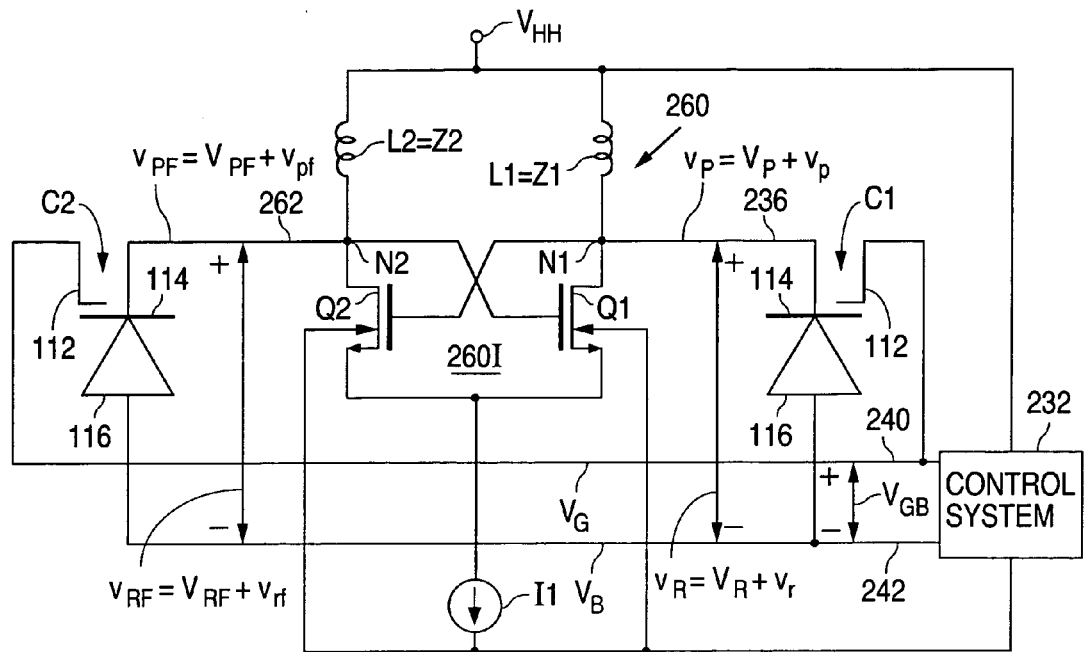
FIGS. 34a and 34b are circuit diagrams of two VCO implementations of the general electronic circuitry of FIG. 33.

FIG. 34a depicts a VCO implementation of the electronic circuitry of FIG. 33 for which level shifter 234 is absent. In FIG. 34a, electronic circuit 260 is implemented with a pair of largely identical cross-coupled n-channel enhancement-mode insulated-gate FETs Q1 and Q2, a pair of largely identical fixed-value inductors L1 and L2, and a current source I1. The drain of each FET Q1 or Q2 is connected to the gate electrode of the other FET Q2 or Q1. The lower end of inductor L1 is connected by way of a node N1 to the Q1 drain. The lower end of inductor L2 is similarly connected by way of a node N2 to the Q2 drain. The upper ends of inductors L1 and L2 are connected to the $V_{HH}$ supply. Current source I1 is connected between the $V_{LL}$ supply and the interconnected sources of FETs Q1 and Q2.

Internal circuitry 260I of symmetrical circuit 260 consists of FETs Q1 and Q2 and current source I1 in the implementation of FIG. 34a. High-bias impedance components Z1 and Z2 are respectively implemented with inductors L1 and L2.

FETs Q1 and Q2 are typically formed from the same semiconductor body as varactors C1 and C2. The body regions of FETs Q1 and Q2 receive low supply voltage $V_{LL}$. In contrast, body regions 100 of varactors C1 and C2 receive body voltage $V_B$ which normally differs from $V_{LL}$. Accordingly, body regions 100 of varactors C1 and C2 need to be electrically isolated from the body regions of FETs Q1 and Q2.

The VCO of FIG. 34a operates in the following manner. When the VCO is turned on by raising high supply voltage $V_{HH}$ to a suitably high value relative to low supply voltage $V_{LL}$, the VCO begins to oscillate. That is, the drain currents of FETs Q1 and Q2 alternately switch between high and low values. The VCO typically needs only a small disturbance to start oscillating. DC plate-to-body voltages $V_R$ and $V_{RF}$ are controlled as described above for the general circuitry of FIG. 33.

Let $L_O$ represent the inductance of either of inductors L1 and L2. The VCO of FIG. 34a provides an oscillator signal (not separately shown) from the drain of FET Q1 or Q2 at a variable frequency $f_O$ given by Eq. 1 repeated below:

$$f_O = \frac{1}{2\pi\sqrt{L_O C_O}} \quad (40)$$

where $C_O$ is now capacitance $C_V$ of either of varactors C1 and C2.

The VCO of FIG. 34a implements the circuitry of FIG. 33 for the situation in which DC plate voltages $V_P$ and $V_{PF}$ largely equal high supply voltage $V_{HH}$. This arises because impedance components Z1 and Z2 are implemented with inductors L1 and L2 across each of which there is largely no DC voltage drop. Minimum value $V_{Rmin}$ of plate-to-body voltages $V_R$ and $V_{RF}$ is then $V_{GBi}$, typically 0.5 V. Maximum value $V_{Rmax}$ of voltages $V_R$ and $V_{RF}$ is $V_{HH}-V_{LL}$. Accordingly, the maximum-to-minimum varactor capacitance ratio for the VCO of FIG. 34a is determined by end-range $V_R$ values extending from $V_{GBi}$ to $V_{HH}-V_{LL}$.

Figure 34B:
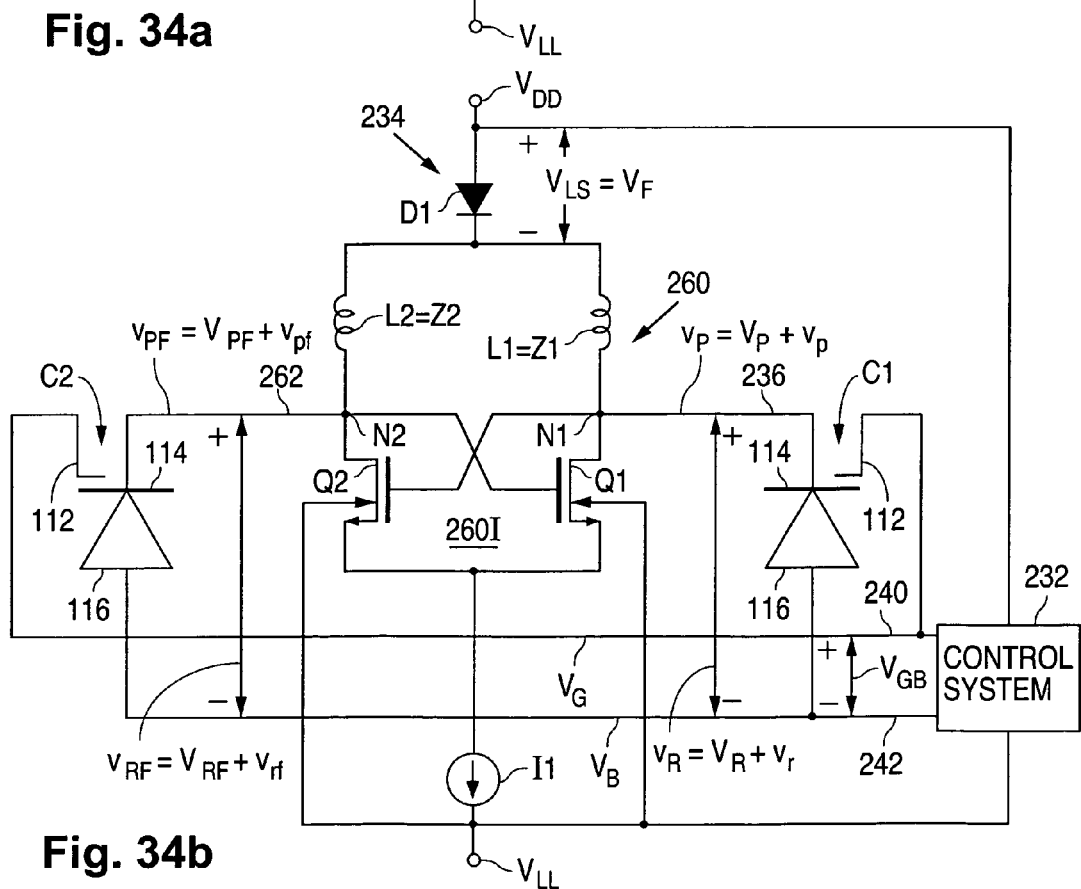

FIG. 34b presents another VCO implementation of the circuitry of FIG. 33. The VCO of FIG. 34b is configured to provide a greater frequency range than that achievable with the VCO of FIG. 34a. Except as described below, the VCO of FIG. 34b contains varactors C1 and C2, FETs Q1 and Q2, inductors L1 and L2, current source I1, and varactor control system 232 configured and operable the same as in the VCO of FIG. 34a. Internal circuitry 260I of circuit 260 again consists of FETs Q1 and Q2 and current source I1. Likewise, impedance components Z1 and Z2 are again respectively formed with inductors L1 and L2.

In addition, the VCO of FIG. 34b contains level shifter 234 implemented as a p-n diode D1. Level-shift voltage drop $V_{LS}$ is thus a diode forward voltage drop $V_F$ of 0.5–0.9 V, typically 0.7 V. Diode D1 and current source I1 cooperate to set the specific value of diode voltage drop $V_F$. Increasing the size of current source I1 so as to increase the sourced current flowing through source I1 cause diode voltage $V_F$ to increase, and vice versa.

The VCO of FIG. 34b implements the circuitry of FIG. 33 for the situation in which DC plate voltage $V_P$ substantially equals $V_{HH}-V_{LS}$. Hence, voltage $V_P$ substantially equals $V_{HH}-V_F$ here. As a result, minimum plate-to-body voltage $V_{Rmin}$ is $V_{GBi}-V_F$ while maximum plate-to-body voltage $V_{Rmax}$ is $V_{HH}-V_{LL}-V_F$. Fixed value $V_{GBi}$ of gate-to-body voltage $V_{GB}$ is again typically 0.5 V. Since diode drop voltage $V_F$ is typically 0.7 V, minimum plate-to-body voltage $V_{Rmin}$ in the VCO of FIG. 34b is quite close to zero, typically –0.2 V.

Compared to the $V_{Rmin}$-to-$V_{Rmax}$ range for the VCO of FIG. 34a, the $V_{Rmin}$-to-$V_{Rmax}$ range for the VCO of FIG. 34b is shifted downward by $V_F$, again typically 0.7 V. This shift causes the maximum-to-minimum varactor capacitance ratio to increase. In light of Eq. 40, the VCO of FIG. 34b has a greater frequency range than that of FIG. 34a.

The C1 and C2 capacitance signal paths in the general circuitry of FIG. 33 are, in the VCO of FIG. 34a or 34b, extended to be a pair of inductance-capacitance signal paths which respectively include inductors L1 and L2. From an AC perspective, varactor C1 and inductor L1 are situated in parallel with each other in the L1C1 inductance-capacitance signal path. Varactor C2 and inductor L2 are likewise situated in parallel with each other in the L2C2 inductance-capacitance signal path. Plate electrodes 114 and body electrodes 116 of varactors C1 and C2 are in the inductance-capacitance signal paths. Gate electrodes 112 of varactors C1 and C2 are outside the inductance-capacitance signal paths. Varactor C1 and inductor L1 form an oscillatory inductive-capacitive combination. Varactor C2 and inductor L2 likewise form an oscillatory inductive-capacitive combination.

Electronic circuits, such as those of FIGS. 32, 33, 34a, and 34b which employ the present varactor(s) can be operated in a unitary tuning-range mode or in a split tuning-range mode. In the unitary tuning-range mode, plate-to-body voltage $V_R$ or $V_{RF}$ can vary across the entire $V_{Rmin}$-to-$V_{Rmax}$ range and can thus pass through transition values $V_X$ in the immediate vicinities of where varactor capacitance $C_V$ changes relatively abruptly. Control system 232 needs to control body voltage $V_B$ quite precisely in the unitary tuning-range mode because small changes in voltage $V_R$ or $V_{RF}$ produce large capacitance changes when voltage $V_R$ or $V_{RF}$ is close to each value $V_X$.

In the split tuning-range mode, values of plate-to-body voltage $V_R$ or $V_{RF}$ in the immediate vicinities of transition values $V_X$ are avoided. Voltage $V_R$ or $V_{RF}$ traverses three or more ranges separated from one another. That is, each pair of consecutive voltage ranges are separated by an intermediate $V_R$ interval in which varactor capacitance $C_V$ changes relatively abruptly as voltage $V_R$ passes through one of transition values $V_X$. When voltage $V_R$ or $V_{RF}$ switches from a lower one of the ranges to a higher one of the ranges, capacitance $C_V$ jumps from a higher value to a lower value, and vice versa. Control system 232 is provided with suitable switching circuitry for switching between the separate $V_R$ ranges.

Figure 35:
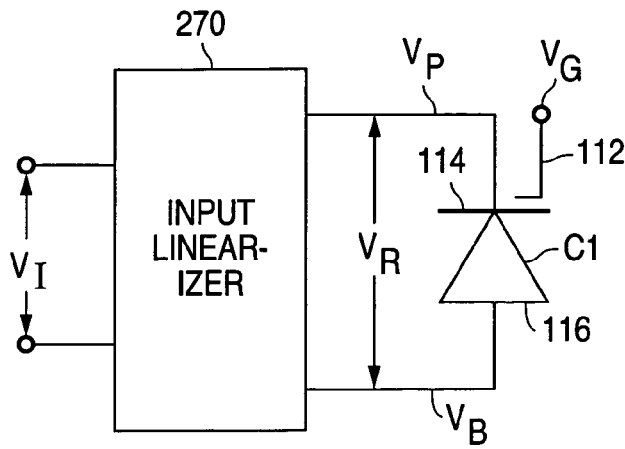
FIG. 35 is a circuit diagram of circuitry utilized, according to the invention, to effectively provide an n-channel gate-enhanced junction varactor of the invention with a substantially linear capacitance/voltage characteristic.

Varactor capacitance $C_V$, although varying gradually with plate-to-body voltage $V_R$ across the $V_{Rmin}$-to-$V_{Rmax}$ range at constant gate-to-body voltage $V_{GB}$, varies significantly non-linearly with voltage $V_R$ across the $V_{Rmin}$-to-$V_{Rmax}$ range when voltage $V_{GB}$ is constant. It is sometimes desirable that capacitance $C_V$ vary in a largely linear manner with an input parameter, typically an input voltage, across a substantial part of that parameter's range at constant gate-to-body voltage $V_{GB}$. FIG. 35 illustrates circuitry which accomplishes this linearization objective.

The circuit of FIG. 35 contains an input linearizer 270 and n-channel varactor C1 of the present invention. Input linearizer provides plate-to-body voltage $V_R$ in response to an input voltage $V_I$. Voltage $V_R$ is, as described above and also shown in FIG. 35, provided between plate electrode 114 and body electrode 116 of varactor C1.

Figure 36:
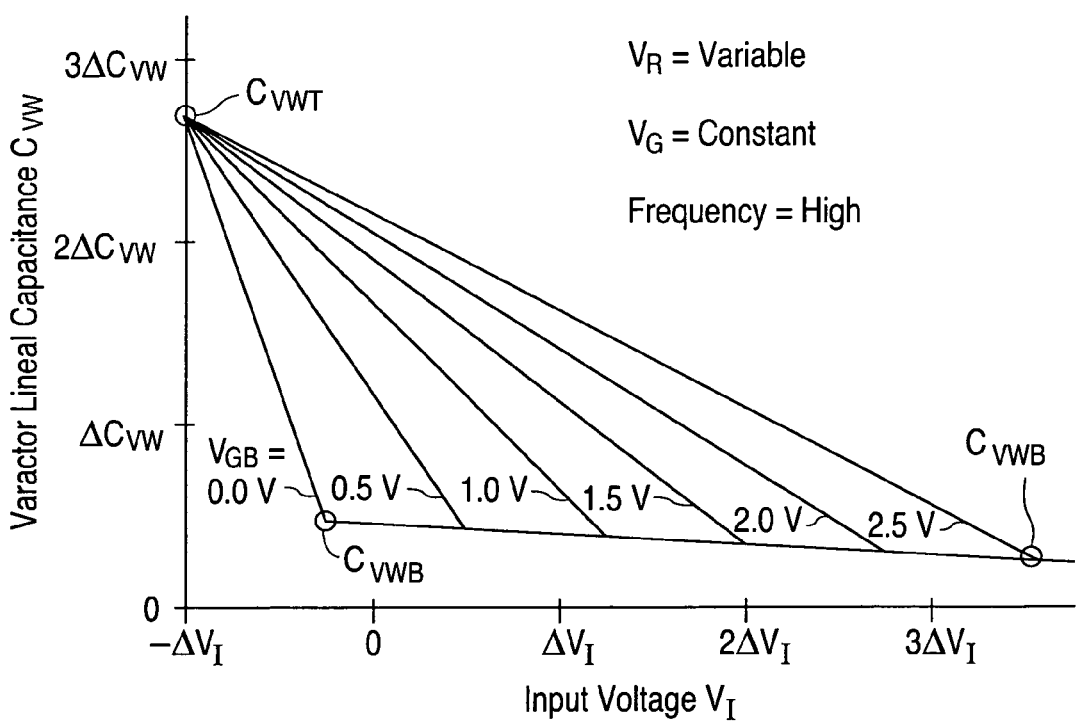
FIG. 36 is a graph of varactor width-wise lineal capacitance as a function of input voltage for the circuitry of FIG. 35.

Input linearizer 270 generates plate-to-body voltage $V_R$ in such a way that, at constant gate-to-body voltage $V_{GB}$, capacitance $C_V$ varies in a largely linear manner with input $V_I$ across a substantial part of its voltage range. This is illustrated in the graph of FIG. 36 with respect to lineal capacitance $C_{VW}$. As FIG. 36 shows, capacitance $C_{VW}$ decreases in a largely linear manner with increasing input voltage $V_I$ at constant gate-to-body voltage $V_{GB}$ as voltage $V_I$ is raised from a value at which capacitance $C_{VW}$ is at high value $C_{VWT}$ to a value at which capacitance $C_{VW}$ is at a low value $C_{VWB}$. Parameters $\Delta V_I$ and $\Delta C_{VW}$ along the horizontal and vertical axes in FIG. 26 are respective increments in the $V_I$ and $C_{VW}$ ranges. Capacitance $C_{VWB}$ can, for example, be low capacitance value $C_{VWL}$. Capacitance $C_{VWT}$ can be high capacitance value $C_{VWH}$ but is typically greater than value $C_{VWH}$.

Input linearizer 270 can be implemented in various ways. For instance, linearizer 270 can be digital circuitry having a look-up table that converts input voltage $V_I$ into the value of plate-to-body voltage $V_R$ needed to achieve the desired linearization.

Varactor Development and Manufacture

In developing an implementation of the present gate-enhanced junction varactor, e.g., an implementation intended for use in an integrated circuit, either an n-channel version or a p-channel version of the varactor is first selected. The selection can be made by an individual such as a circuit designer or by a machine such as a computer. The selection is typically made with the objective of obtaining at least a specified ratio of maximum-to-minimum varactor capacitance.

Assume that an n-channel version of the present varactor is selected. To facilitate the following development/manufacturing description, let the components and characteristics of the n-channel junction varactor be identified by the reference symbols previously defined. The selection of the present n-channel junction varactor is made with the understanding that plate region 102 occupies lateral plate area $A_P$ along upper semiconductor surface 106, that the varactor has a minimum capacitance $C_{Vmin}$ dependent on plate area $A_P$, that inversion layer 130 occupies lateral inversion area $A_{Imax}$ along upper surface 106 when layer 130 is fully present, and that the varactor has a maximum capacitance $C_{Vmax}$ dependent on maximum inversion area $A_{Imax}$ in combination with plate area $A_P$.

More particularly, the varactor selection is normally made with the understanding that minimum varactor capacitance $C_{Vmin}$ is approximately proportional to plate area $A_P$ while maximum varactor capacitance $C_{Vmax}$ is approximately proportional to an accumulative combination of maximum inversion area $A_{Imax}$ and plate area $A_P$. These relationships can be generally seen by multiplying areal capacitance values $C_{VAmax}$ and $C_{VAmin}$ of Eqs. 14 and 21 by total capacitive area $A_P + A_{Imax}$ to respectively produce:

$$C_{Vmax} = K_{SC}\varepsilon_0 \left( \frac{A_P}{t_{dJmin}} + \frac{A_{Imax}}{t_{dsmin}} \right) \tag{41}$$

$$C_{Vmin} = \frac{K_{SC}\varepsilon_0 A_P}{t_{dJmax}} \tag{42}$$

Inversion area $A_{Imax}$ and plate area $A_P$ are then adjusted, e.g., using Eqs. 41 and 42 or refined versions of Eqs. 41 and 42, to control maximum capacitance $C_{Vmax}$ and minimum capacitance $C_{Vmin}$.

The ratio of inversion area $A_{Imax}$ to plate area $A_P$ is adjusted to achieve at least a specified ratio of maximum capacitance $C_{Vmax}$ to minimum capacitance $C_{Vmin}$. Using Eqs. 41 and 42, the $C_{Vmax}/C_{Vmin}$ ratio is the same as the $C_{VAmax}/C_{VAmin}$ areal ratio of Eq. 22 and thus is approximately:

$$\frac{C_{Vmax}}{C_{Vmin}} = \left( \frac{t_{dJmax}}{t_{dJmin}} \right) + \left( \frac{A_{Imax}}{A_P} \right)\left( \frac{t_{dJmax}}{t_{dsmin}} \right) \tag{43}$$

Eq. 43 can be employed to provide a first-order estimate of the $A_{Imax}/A_P$ area ratio needed to achieve at least a specified value of the $C_{Vmax}/C_{Vmin}$ capacitance ratio. The estimate can then be refined, as needed, using empirical data based on examination of previously fabricated and/or computer simulated gate-enhanced junction varactors of the invention.

In the course of adjusting areas $A_{Imax}$ and $A_P$, including setting the $A_{Imax}/A_P$ ratio, appropriate lateral dimensions for the n-channel varactor are determined. The varactor is then laid out according to those lateral dimensions using a suitable set of semiconductor design rules appropriate to a semiconductor manufacturing process to be used later in fabricating the varactor.

Figure 37:
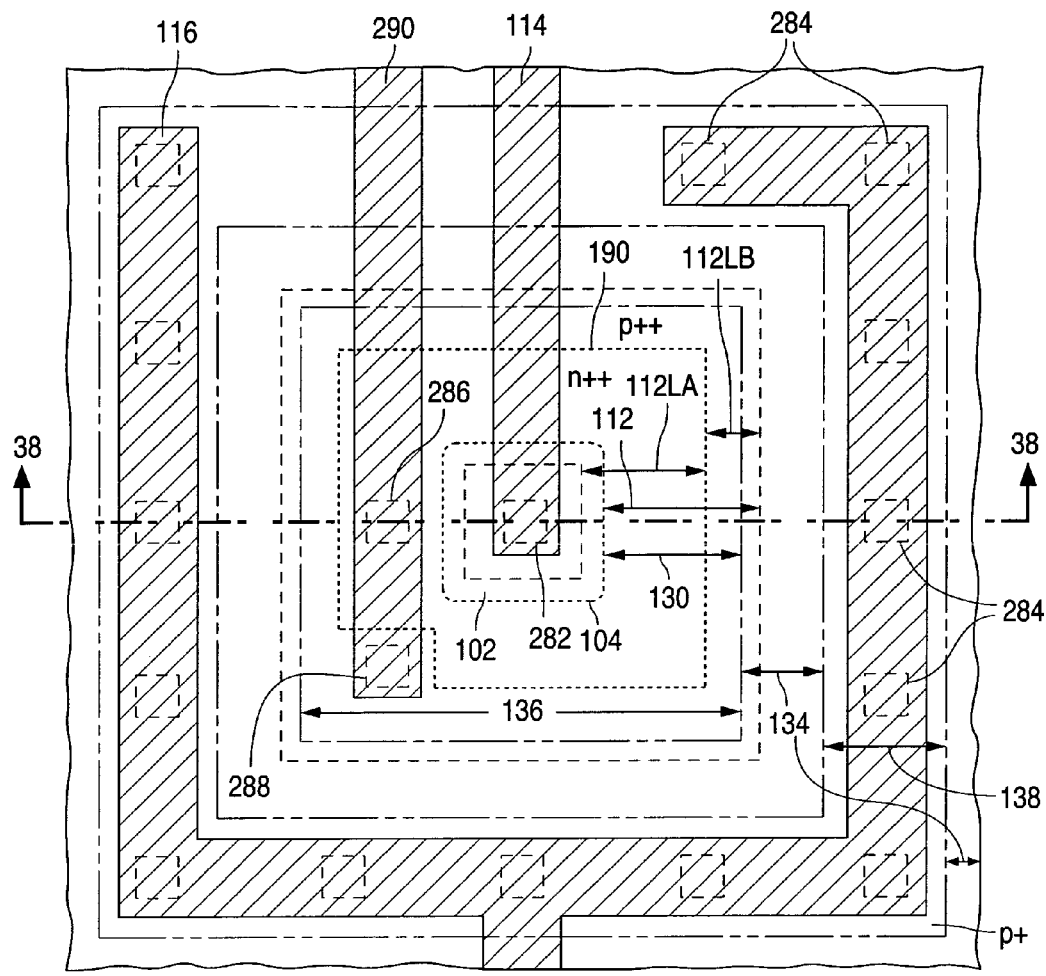
FIG. 37 is a layout (plan) view of a silicon-gate implementation of the gate-enhanced junction varactor of FIGS. 8a–8d according to the invention.
Figure 38:
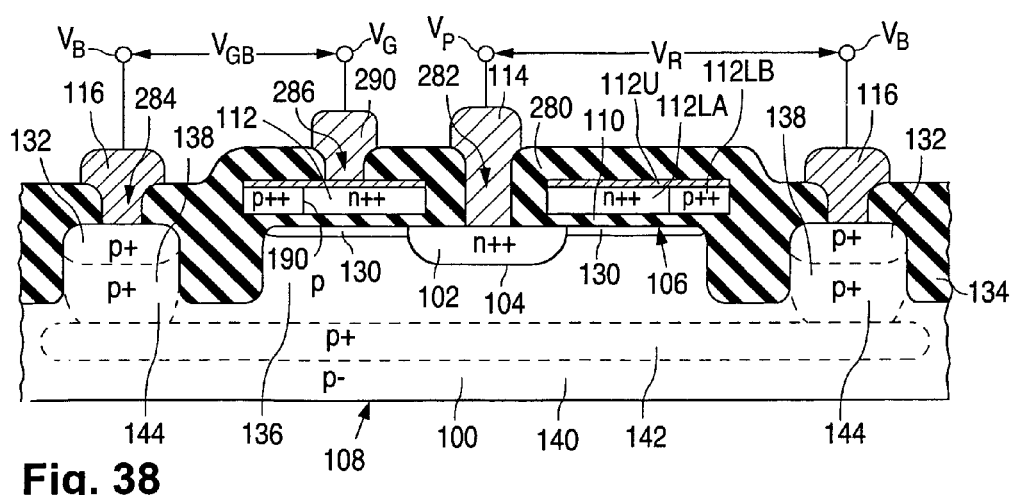
FIG. 38 is a cross-sectional side view of the gate-enhanced junction varactor of FIG. 37. The cross section of FIG. 38 is taken through plane 38—38 in FIG. 37.

FIG. 37 illustrates a layout, in accordance with the invention, of an implementation of the n-channel junction varactor of FIG. 8, specifically an embodiment of the implementation of FIG. 14. FIG. 38 depicts a cross section of the n-channel varactor of FIG. 37 taken along a vertical plane extending through plate region 102. The varactor of FIGS. 37 and 38 contains components 132, 134, 136, 138, 140, 142, and 144 as generally described above in connection with the n-channel junction varactor implementation of FIG. 9b. Lower gate electrode layer 112L here consists of n++ polysilicon portion 112LA and p++ polysilicon portion 112LB.

When fully present in the varactor of FIGS. 37 and 38, inversion layer 130 is shaped generally like a square annulus as viewed perpendicular to upper semiconductor surface 106 (or lower semiconductor surface 108). Layer 130 fully laterally surrounds plate region 102. Within semiconductor island 136, body region 100 thus fully laterally surrounds, and extends below all of, plate region 102. Field insulating region 134 laterally adjoins body region 100 in island 136 but is spaced apart from plate region 102. Gate electrode 112 is of a square annular shape similar to that of full inversion layer 130.

In the layout of FIG. 37, the lateral dimensions of plate region 102 in the horizontal and vertical directions of the figure are typically chosen in accordance with the minimum feature size (minimum dimension) of the layout design rules. Accordingly, plate area $A_P$ is of the minimum value that can be achieved for area $A_P$ with that set of design rules. This facilitates achieving a high $A_{Imax}/A_P$ area ratio and thus a high $C_{Vmax}/C_{Vmin}$ varactor capacitance ratio.

A layer 280 of dielectric material overlies field insulating region 134 and semiconductor islands 136 and 138 above gate electrode 112 in the varactor of FIGS. 37 and 38. Plate electrode 114 contacts plate region 102 through a plate contact opening 282 extending through dielectric layer 280. Body electrode 116 contacts body contact portion 132 of body region 100 through a group, fourteen in the exemplary layout of FIG. 37, of body contact openings 284 extending through layer 280. Body contact openings 284 are distributed relatively uniformly across the lateral area occupied by body contact portion 132 to provide uniform electrical connection to body region 100.

A pair of gate contact openings 286 and 288 extend through layer 280. Gate contact opening 286 overlies n++ polysilicon gate electrode portion 112LA. Gate contact opening 288 overlies p++ polysilicon gate electrode portion 112LB. An electrical conductive gate line 290 contacts upper layer 112U of gate electrode 112 through gate contact openings 286 and 288. Upper gate electrode portion 112U typically consists of the same metallic material as plate electrode 114 and body electrode 116.

The present n-channel junction varactor, such as that of FIGS. 37 and 38, is fabricated according to a suitable manufacturing process, typically one having a capability for providing n-channel insulated-gate FETs and thus invariably also p-n diodes, in accordance with the selected layout. The fabrication operation can, for example, be performed according to the semiconductor manufacturing process described in Bulucea et al, U.S. patent application Ser. No. 09/540,442, filed 32 Mar. 2000, now U.S. Pat. No. 6,548,842 B1, the contents of which are incorporated by reference herein.

Briefly stated, fabrication of the present n-channel junction varactor typically entails doping a semiconductor body to achieve the various doped regions such as plate region 102 and body region 100, providing field insulating region 134, forming gate dielectric layer 110, and providing electrodes 112, 114, and 116. Operations analogous and, in some instances, complementary to the preceding operations are performed when the selected varactor is a p-channel version of the present gate-enhanced junction varactor.

Variations

While the invention has been described with respect to particular embodiments, this description is solely for the purpose of illustration and is not to be construed as limiting the scope of the invention claimed below. For example, referring back to Eq. 33 that prescribes zero-point gate-to-body threshold voltage $V_{T0}$ for a gate portion, the first ($N_{POLY}$) term in the equation is the contribution of the work function $\Phi_M$ of the semiconductor material in the portion of gate electrode 112 or 162 in that gate portion. Alternatively, the semiconductor material in gate electrode 112 or 168 can be replaced with metal portions of differing work functions. Each of the metal gate electrode portions is situated above at least the location for a different corresponding one of the portions of inversion layer 130 or 180.

The semiconductor material occupied by inversion layer 130 or 180 can be doped to change the value of zero-point gate-to-body threshold voltages $V_{T0}$ or general gate-to-body threshold voltages $V_T$ at which layer 130 or 180 progressively forms when plate-to-body voltage $V_R$ is zero or non-zero value $V_{Ri}$. When the present gate-enhanced junction varactor is an n-channel varactor as generally shown in FIG. 8, the semiconductor material occupied by layer 130 can be provided with additional p-type dopant to raise the value of threshold voltages $V_{T0}$ or $V_T$. The operating range for gate-to-body voltage $V_{GB}$ is then shifted upward by an amount corresponding to the increase in threshold voltages $V_{T0}$ or $V_T$.

When the present gate-enhanced junction varactor is a p-channel varactor as generally shown in FIG. 10, the semiconductor material occupied by inversion layer 130 can be provided with additional n-type dopant to lower the value of gate-to-body threshold voltages $V_{T0}$ or $V_T$ to obtain a similar operational change. Various modifications and applications may thus be made by those skilled in the art without departing from the true scope and spirit of the present invention as defined in the appended claims.

I claim:

1. A method comprising:
   selecting a varactor that comprises (a) a plate region and a body region of a semiconductor body, (b) a plate electrode and a body electrode respectively connected to the plate and body regions, (c) a gate dielectric layer situated over the semiconductor body and contacting the body region, and (d) a gate electrode situated over the gate dielectric layer at least where the gate dielectric layer contacts material of the body region, the plate and body regions being of opposite conductivity types, meeting each other to form a p-n junction, and extending to a primary surface of the semiconductor body, the plate region occupying a lateral plate area along the primary surface, the varactor having a minimum capacitance dependent on the plate area, an inversion layer that meets the plate region occurring in the body region and occupying a lateral inversion area along the primary surface, the inversion area reaching a maximum value when the inversion layer is fully present, the varactor having a maximum capacitance dependent on the maximum inversion area in combination with the plate area, the plate electrode being at a plate-to-body voltage relative to the body electrode, the gate electrode being at a gate-to-body voltage relative to the body electrode, the inversion layer comprising multiple variably appearing inversion portions respectively characterized by corresponding different zero-point threshold voltages of like sign, each inversion portion appearing/disappearing when the gate-to-body voltage passes through the corresponding zero-point threshold voltage with the plate-to-body voltage at zero, each inversion portion meeting the plate region or/and being continuous with the another inversion portion whose zero-point threshold voltage is of lower magnitude than the zero-point threshold voltage of that inversion portion; and adjusting the plate and maximum inversion areas to control the maximum and minimum capacitances of the varactor.

2. A method as in claim 1 wherein the minimum capacitance is approximately proportional to the plate area, and the maximum capacitance is approximately proportional to an accumulative combination of the plate and maximum inversion areas.

3. A method as in claim 1 wherein the adjusting act involves adjusting the ratio of the maximum inversion area to the plate area in order to achieve at least a specified value of the ratio of the maximum capacitance to the minimum capacitance.

4. A method as in claim 1 further including maintaining the gate-to-body voltage approximately constant as the plate-to-body voltage is varied.

5. A method as in claim 1 wherein the gate dielectric layer comprises multiple gate dielectric portions of different respective thicknesses, each gate dielectric portion situated above at least where a different corresponding one of the inversion portions occurs.

6. A method as in claim 1 wherein a surface depletion region of the body region extends along the gate dielectric layer below the gate electrode, the surface depletion region comprising multiple surface depletion portions of different respective average net dopant concentrations, each surface depletion portion situated below where a different corresponding one of the inversion portions occurs.

7. A method as in claim 1 wherein the gate electrode comprises multiple gate electrode portions of doped semiconductor material, each gate electrode portion situated above at least where a different corresponding one of the inversion portions occurs, each gate electrode portion being of a different conductivity type or/and a different average net dopant concentration than each other gate electrode portion.

8. A method as in claim 1 wherein:
the gate dielectric layer comprises a first gate dielectric portion and a second gate dielectric portion thicker than the first gate dielectric portion, each gate dielectric portion situated above at least where a different corresponding one of the inversion portions occurs; and
the gate electrode comprises (a) a first gate electrode portion of doped semiconductor material of opposite conductivity type to the body region and (b) a second gate electrode portion of doped semiconductor material of the same conductivity type as the body region, the first gate electrode portion overlying the first and second gate dielectric portions, the second gate electrode portion situated above at least where a further corresponding one of the inversion portions occurs.

9. A method as in claim 5 wherein the gate dielectric portions comprise a first gate dielectric portion and a second gate dielectric portion thicker than the first gate dielectric portion, the first gate dielectric portion extending between the second gate dielectric portion and a location above the plate region such that the second gate dielectric portion is spaced laterally apart from the plate region.

10. A method as in claim 6 wherein the gate dielectric portions include a third gate dielectric portion that extends to a location above the plate region.

11. A method as in claim 5 wherein each of at least two of the gate dielectric portions extend to a location above the plate region.

12. A method as in claim 6 wherein the surface depletion portions comprise a first surface depletion portion and a second surface depletion portion more heavily doped than the first surface depletion portion, the first surface depletion portion extending between the second surface depletion portion and the plate region such that the second surface depletion portion is spaced apart from the plate region.

13. A method as in claim 7 wherein the gate electrode portions comprise first and second gate electrode portions of the same conductivity type and different average net dopant concentrations.

14. A method as in claim 7 wherein the gate electrode portions comprise (a) a first gate electrode portion of opposite conductivity type to the body region and (b) a second gate electrode portion of the same conductivity type as the body region.

15. A method as in claim 14 wherein the first gate electrode portion extends between the second gate electrode portion and a location above the plate region such that the second gate electrode portion is spaced laterally apart from the plate region.

16. A method as in claim 14 wherein the gate electrode includes a metal-containing layer for electrically shorting the first and second gate electrode portions to each other.

17. A method as in claim 8 wherein:
the first gate dielectric portion extends between the second gate dielectric portion and a location above the plate region such that the second gate dielectric portion is spaced laterally apart from the plate region; and
the first gate electrode portion extends between the second gate electrode portion and a location above the plate region such that the second gate electrode portion is spaced laterally apart from the plate region.

18. A method as in claim 8 wherein the gate dielectric layer includes a third gate dielectric portion of approximately the same thickness as the first gate dielectric portion, the second gate electrode portion overlying the third gate dielectric portion.

19. A method as in claim 1 further including providing electronic circuitry having a capacitance signal path for receiving the varactor to enable the circuitry to perform an electronic function dependent on the varactor, the plate and body electrodes being situated in the capacitance signal path.

20. A method as in claim 19 wherein the gate electrode is situated outside the capacitance signal path.

21. A method as in claim 1 further including providing electronic circuitry comprising an inductor situated in an inductance-capacitance signal path with the plate and body electrodes to form an oscillatory inductive-capacitive combination.

22. A method as in claim 21 wherein the gate electrode is situated outside the inductance-capacitance signal path.

23. A method comprising:
selecting a varactor that comprises (a) a plate region and a body region of a semiconductor body, (b) a plate electrode and a body electrode respectively connected to the plate and body regions, (c) a gate dielectric layer situated over the semiconductor body and contacting the body region, and (d) a gate electrode situated over the gate dielectric layer at least where the gate dielectric layer contacts material of the body region, the plate and body regions being of opposite conductivity types, meeting each other to form a p-n junction, and extending to a primary surface of the semiconductor body, the plate region occupying a lateral plate area along the primary surface, the varactor having a minimum capacitance dependent on the plate area, a field insulating region extending into the semiconductor body along the primary surface to define a semiconductor island laterally surrounded by the field insulating region and substantially fully occupied by material of the plate and body regions, the semiconductor island occupying an island area along the primary surface, the varactor having a maximum capacitance dependent on the island area, the gate dielectric layer comprising multiple gate dielectric portions which are of different respective thicknesses and which at least partially overlie the body region, each gate dielectric portion extending to a location above the plate region or/and being continuous with a gate dielectric portion thinner than that gate dielectric portion; and adjusting the plate and island areas to control the minimum and maximum capacitances of the varactor.

24. A method as in claim 23 wherein the minimum capacitance is approximately proportional to the plate area, and the maximum capacitance is approximately proportional to the island area.

25. A method as in claim 23 further including maintaining the gate-to-body voltage approximately constant as the plate-to-body voltage is varied.

26. A method as in claim 23 wherein the gate dielectric portions comprise a first gate dielectric portion and a second gate dielectric portion thicker than the first gate dielectric portion, the first gate dielectric portion extending between the second gate dielectric portion and a location above the plate region such that the second gate dielectric portion is spaced laterally apart from the plate region.

27. A method as in claim 23 further including providing electronic circuitry having a capacitance signal path for receiving the varactor to enable the circuitry to perform an electronic function dependent on the varactor, the plate and body electrodes being situated in the capacitance signal path.

28. A method as in claim 27 wherein the gate electrode is situated outside the capacitance signal path.

29. A method comprising:

selecting a varactor that comprises (a) a plate region and a body region of a semiconductor body, (b) a plate electrode and a body electrode respectively connected to the plate and body regions, (c) a gate dielectric layer situated over the semiconductor body and contacting the body region, and (d) a gate electrode situated over the gate dielectric layer at least where the gate dielectric layer contacts material of the body region, the plate and body regions being of opposite conductivity types, meeting each other to form a p-n junction, and extending to a primary surface of the semiconductor body, the plate region occupying a lateral plate area along the primary surface, the varactor having a minimum capacitance dependent on the plate area, a field insulating region extending into the semiconductor body along the primary surface to define a semiconductor island laterally surrounded by the field insulating region and substantially fully occupied by material of the plate and body regions, the semiconductor island occupying an island area along the primary surface, the varactor having a maximum capacitance dependent on the island area, the surface depletion region comprising multiple surface depletion portions of different respective average net dopant concentrations, each surface depletion portion meeting the plate region or/and being continuous with a surface depletion portion more lightly doped than that surface depletion portion; and adjusting the plate and island areas to control the minimum and maximum capacitances of the varactor.

30. A method as in claim 29 wherein the minimum capacitance is approximately proportional to the plate area, and the maximum capacitance is approximately proportional to the island area.

31. A method as in claim 29 further including maintaining the gate-to-body voltage approximately constant as the plate-to-body voltage is varied.

32. A method as in claim 29 wherein the surface depletion portions comprise a first surface depletion portion and a second surface depletion portion more heavily doped than the first surface depletion portion, the first surface depletion portion extending between the second surface depletion portion and the plate region such that the second surface depletion portion is spaced apart from the plate region.

33. A method as in claim 29 further including providing electronic circuitry having a capacitance signal path for receiving the varactor to enable the circuitry to perform an electronic function dependent on the varactor, the plate and body electrodes being situated in the capacitance signal path.

34. A method as in claim 33 wherein the gate electrode is situated outside the capacitance signal path.

35. A method comprising:

selecting a varactor that comprises (a) a plate region and a body region of a semiconductor body, (b) a plate electrode and a body electrode respectively connected to the plate and body regions, (c) a gate dielectric layer situated over the semiconductor body and contacting the body region, and (d) a gate electrode situated over the gate dielectric layer at least where the gate dielectric layer contacts material of the body region, the plate and body regions being of opposite conductivity types, meeting each other to form a p-n junction, and extending to a primary surface of the semiconductor body, the plate region occupying a lateral plate area along the primary surface, the varactor having a minimum capacitance dependent on the plate area, a field insulating region extending into the semiconductor body along the primary surface to define a semiconductor island laterally surrounded by the field insulating region and substantially fully occupied by material of the plate and body regions, the semiconductor island occupying a lateral island area along the primary surface, the varactor having a maximum capacitance dependent on the island area, the gate electrode comprising multiple gate electrode portions which are of doped semiconductor material and which at least partially overlie the body region, each gate electrode portion being of different conductivity type or/and different average net dopant concentration than each other gate electrode portion; and adjusting the plate and island areas to control the minimum and maximum capacitances of the varactor.

36. A method as in claim 35 wherein the minimum capacitance is approximately proportional to the plate area, and the maximum capacitance is approximately proportional to the island area.

37. A method as in claim 35 further including maintaining the gate-to-body voltage approximately constant as the plate-to-body voltage is varied.

38. A method as in claim 35 wherein the gate electrode portions comprise first and second gate electrode portions of the same conductivity type and different average net dopant concentrations.

39. A method as in claim 35 wherein the gate electrode portions comprise (a) a first gate electrode portion of opposite conductivity type to the body region and (b) a second gate electrode portion of the same conductivity type as the body region.

40. A method as in claim 39 wherein the first gate electrode portion extends between the second gate electrode portion and a location above the plate region such that the second gate electrode portion is spaced laterally apart from the plate region.

41. A method as in claim 39 wherein the gate electrode includes a metal-containing layer for electrically shorting the first and second gate electrode portions to each other.

42. A method as in claim 35 wherein:
the gate dielectric layer comprises (a) a first gate dielectric portion, (b) a second gate dielectric portion thicker than the first gate dielectric portion, and (c) a third gate dielectric portion; and
the gate electrode portions comprise (a) a first gate electrode portion of opposite conductivity type to the body region and (b) a second gate electrode portion of the same conductivity type as the body region, the first gate electrode portion overlying the first and second gate dielectric portions, the second gate electrode portion overlying at least the third dielectric portion.

43. A method as in claim 42 wherein:
the first gate dielectric portion extends between the second gate dielectric portion and a location above the plate region such that the second gate dielectric portion is spaced laterally apart from the plate region; and
the first gate electrode portion extends between the second gate electrode portion and a location above the plate region such that the second gate electrode portion is spaced laterally apart from the plate region.

44. A method as in claim 42 wherein the gate electrode includes a metal-containing layer for electrically shorting the first and second gate electrode portions to each other.

45. A method as in claim 35 further including providing electronic circuitry having a capacitance signal path for receiving the varactor to enable the circuitry to perform an electronic function dependent on the varactor, the plate and body electrodes being situated in the capacitance signal path.

46. A method as in claim 45 wherein the gate electrode is situated outside the capacitance signal path.

47. A method comprising:
selecting a varactor that comprises (a) a plate region and a body region of a semiconductor body, (b) a plate electrode and a body electrode respectively connected to the plate and body regions, (c) a gate dielectric layer situated over the semiconductor body and contacting the body region, and (d) a gate electrode situated over the gate dielectric layer at least where the gate dielectric layer contacts material of the body region, the plate and body regions being of opposite conductivity types, meeting each other to form a p-n junction, and extending to a primary surface of the semiconductor body, the plate region occupying a lateral plate area along the primary surface, the varactor having a minimum capacitance dependent on the plate area, the body region occupying a lateral body area along the primary surface, the varactor having a maximum capacitance dependent on the body area in combination with the plate area, the gate electrode comprising multiple gate electrode portions which are of doped semiconductor material and which at least partially overlie the body region, each gate electrode portion being of different conductivity type or/and different average net dopant concentration than each other gate electrode portion; and
adjusting the plate and body areas to control the minimum and maximum capacitances of the varactor.

48. A method as in claim 47 wherein the minimum capacitance is approximately proportional to the plate area, and the maximum capacitance is approximately proportional to an accumulative combination of the plate and body areas.

49. A method as in claim 47 further including maintaining the gate-to-body voltage approximately constant as the plate-to-body voltage is varied.

50. A method as in claim 47 wherein the gate electrode portions comprise first and second gate electrode portions of the same conductivity type and different average net dopant concentrations.

51. A method as in claim 47 wherein the gate electrode portions comprise (a) a first gate electrode portion of opposite conductivity type to the body region and (b) a second gate electrode portion of the same conductivity type as the body region.

52. A method as in claim 51 wherein the first gate electrode portion extends between the second gate electrode portion and a location above the plate region such that the second gate electrode portion is spaced laterally apart from the plate region.

53. A method as in claim 51 wherein the gate electrode includes a metal-containing layer for electrically shorting the first and second gate electrode portions to each other.

54. A method as in claim 47 wherein:
the gate dielectric layer comprises (a) a first gate dielectric portion, (b) a second gate dielectric portion thicker than the first gate dielectric portion, and (c) a third gate dielectric portion; and
the gate electrode portions comprise (a) a first gate electrode portion of opposite conductivity type to the body region and (b) a second gate electrode portion of the same conductivity type as the body region, the first gate electrode portion overlying the first and second gate dielectric portions, the second gate electrode portion overlying at least the third dielectric portion.

55. A method as in claim 47 further including providing electronic circuitry having a capacitance signal path for receiving the varactor to enable the circuitry to perform an electronic function dependent on the varactor, the plate and body electrodes being situated in the capacitance signal path.

56. A method as in claim 55 wherein the gate electrode is situated outside the capacitance signal path.

57. A method comprising:
providing a varactor that comprises (a) a plate region and a body region of a semiconductor body, (b) a plate electrode and a body electrode respectively connected to the plate and body regions, (c) a gate dielectric layer situated over the semiconductor body and contacting the body region, and (d) a gate electrode situated over the gate dielectric layer at least where the gate dielectric layer contacts material of the body region, the plate and body regions being of opposite conductivity types and meeting each other to form a p-n junction;
applying (a) a plate-to-body voltage between the plate and body electrodes and (b) a gate-to-body voltage between the gate and body electrodes; and
varying the plate-to body voltage in a selected positive or negative direction while maintaining the gate-to-body voltage approximately constant at a selected non-zero value to cause multiple portions of an inversion layer to progressively appear in the body region below the gate electrode, the inversion portions respectively corresponding to different transition values of the plate-to-body voltage at the non-zero value of the gate-to-body voltage, each inversion portion appearing/disappearing approximately at the corresponding transition value of the plate-to-body voltage and being electrically connected to the plate region directly or/and through at least one other of the inversion portions.

58. A method as in claim 57 wherein the gate dielectric layer comprises multiple gate dielectric portions of different respective thicknesses, each gate dielectric portion situated above at least where a different corresponding one of the inversion portions appears/disappears.

59. A method as in claim 57 wherein a surface depletion region of the body region extends along the gate dielectric layer below the gate electrode, the surface depletion region comprising multiple surface depletion portions of different respective average net dopant concentrations, each surface depletion portion situated below where a different corresponding one of the inversion portions appears/disappears.

60. A method as in claim 57 wherein the gate electrode comprises multiple gate electrode portions of doped semiconductor material, each gate electrode portion situated above at least where a different corresponding one of the inversion portions appears/disappears, each gate electrode portion being of a different conductivity type or/and a different average net dopant concentration than each other gate electrode portion.

61. A method as in claim 60 wherein the gate electrode portions comprise first and second gate electrode portions of the same conductivity type and different average net dopant concentrations.

62. A method as in claim 60 wherein the gate electrode portions comprise (a) a first gate electrode portion of opposite conductivity type to the body region and (b) a second gate electrode portion of the same conductivity type as the body region.

63. A method as in claim 60 wherein the gate electrode includes a metal-containing layer for electrically shorting the first and second gate electrode portions to each other.

64. A method as in claim 57 wherein:
the gate dielectric layer comprises a first gate dielectric portion and a second gate dielectric portion thicker than the first gate dielectric portion, each gate dielectric portion situated above at least where a different corresponding one of the inversion portions appears/disappears; and
the gate electrode comprises (a) a first gate electrode portion of doped semiconductor material of opposite conductivity type to the body region and (b) a second gate electrode portion of doped semiconductor material of the same conductivity type as the body region, the first gate electrode portion overlying the first and second gate dielectric portions, the second gate electrode portion situated above at least where a further corresponding one of the inversion portions appears/disappears.

65. A method as in claim 57 further including providing electronic circuitry having a capacitance signal path for receiving the varactor to enable the circuitry to perform an electronic function dependent on the varactor, the plate and body electrodes being situated in the capacitance signal path.

66. A method as in claim 65 wherein the gate electrode is situated outside the capacitance signal path.

67. A method as in claim 57 further including providing electronic circuitry comprising an inductor situated in an inductance-capacitance signal path with the plate and body electrodes to form an oscillatory inductive-capacitive combination.

68. A method as in claim 67 wherein the gate electrode is situated outside the inductance-capacitance signal path.

* * * * *